(12) United States Patent
Tenra et al.

(10) Patent No.: US 7,833,605 B2
(45) Date of Patent: Nov. 16, 2010

(54) VACUUM HEAT INSULATOR

(75) Inventors: Tomohisa Tenra, Shiga (JP); Takao Fujimoto, Shiga (JP)

(73) Assignee: Panasonic Corporation, Osaka (JP)

( * ) Notice: Subject to any disclaimer, the term of this patent is extended or adjusted under 35 U.S.C. 154(b) by 210 days.

(21) Appl. No.: 10/537,298

(22) PCT Filed: Dec. 2, 2003

(86) PCT No.: PCT/JP03/15368

§ 371 (c)(1),
(2), (4) Date: Jun. 2, 2005

(87) PCT Pub. No.: WO2004/051134

PCT Pub. Date: Jun. 17, 2004

(65) Prior Publication Data

US 2006/0024469 A1 Feb. 2, 2006

(30) Foreign Application Priority Data

Dec. 5, 2002 (JP) ............................. 2002-354105
Oct. 16, 2003 (JP) ............................. 2003-356298

(51) Int. Cl.
*F16L 59/065* (2006.01)
(52) U.S. Cl. ......................................................... 428/69
(58) Field of Classification Search .................... 428/69
See application file for complete search history.

(56) References Cited

U.S. PATENT DOCUMENTS 4,579,756 A * 4/1986 Edgel ........................... 428/34
6,322,743 B1 11/2001 Stroobants
6,325,281 B1 * 12/2001 Grogan .................. 229/103.11

FOREIGN PATENT DOCUMENTS

| JP | 5-245964 | 9/1993 |
| JP | 7-42893 | 2/1995 |
| JP | 7-98090 | 4/1995 |
| JP | 7-269781 | 10/1995 |
| JP | 8-303686 | 11/1996 |
| JP | 318238 | 12/1997 |
| JP | 10-110887 | 4/1998 |
| JP | 10-196880 | 7/1998 |
| WO | WO 00/75557 A1 | 12/2000 |

* cited by examiner

*Primary Examiner*—Alexander Thomas
(74) *Attorney, Agent, or Firm*—McDermott Will & Emery LLP

(57) ABSTRACT

A vacuum heat insulator small in limitation in shape of applicable objects, and wide in application is presented. A vacuum heat insulator is formed of a plurality of core members of thickness of 5 mm or less made of glass fiber shaped nearly in a regular octagonal shape, being coated with a gas barrier enveloping member and evacuated in side. The core members are shaped in octagon, and disposed in lattice layout at specified intervals so as to form folding lines in four directions of vertical, lateral and oblique 45-degree directions, parallel to each side. In order that the plurality of core members may be located in independent spaces individually, the entire surface of the enveloping member around the core members is formed as heat seal parts, and it is foldable in four directions and is flexible. By cutting the heat seal parts along the core members so as to leave about 3 mm in the periphery, a vacuum heat insulator of any desired shape and wide effective heat insulating area can be obtained. The core members may be formed in desired shape, and complicated shapes and through-holes can be formed, so that vacuum heat insulators applicable in a very wide scope of purposes can be presented.

10 Claims, 28 Drawing Sheets

_US 7,833,605 B2_

VACUUM HEAT INSULATOR

TECHNICAL FIELD

The present invention relates to a vacuum heat insulator can be formed in various shapes and foldably freely so as to be used in personal computer, information appliance, electronic devices, heat and cold insulating devices, warming ware, clothes, and building materials.

BACKGROUND ART

A vacuum heat insulator is manufactured, for example, by coating a porous core member with an enveloping member of plastic laminate film having a gas barrier layer and a heat seal layer, and evacuating and sealing. As the sealing technology, generally, the heat sealing method for heating and pressing the junction of two plastic laminate films is employed from the viewpoint of reliability and productivity in sealing. In the vacuum heat insulator used in this manner, the enveloping member of plastic laminate film is preliminarily formed in a bag slightly larger than the core member, and the core member is inserted into the bag-shaped enveloping member, and after evacuating, the opening is sealed by heat sealing.

Accordingly, at four sides of the outer periphery of such vacuum heat insulator, peripheral parts composed only of adhered enveloping member are formed without any interposing portion of the heat seal part of the enveloping member and the core member. To use the vacuum heat insulator, therefore, various ideas are proposed for reducing the peripheral parts as much as possible.

FIG. 40 is a perspective view showing a conventional manufacturing process of vacuum heat insulator, and FIG. 41 is a perspective view showing a conventional vacuum heat insulator. In FIG. 40 and FIG. 41, a vacuum heat insulator 300 is fabricated by putting a core member 302 on a film sheet 301, folding the sheet 301 so as to wrap the core member 301, evacuating the inside of the sheet 301 in this state, folding, and fusing the mutually bonded ends of the sheet 301 by heat on three peripheral sides. At this time, when the folded position of the sheet 301 is fitted 110 tightly to the end of the core member 302, protrusion 304 by heat sealing is not formed at the end 303 of the vacuum heat insulator 300 (this advantage is disclosed, for example, in Japanese Laid-open Patent No. H7-269781).

A conventional vacuum heat insulator is explained. FIG. 42 is a plan view of a conventional vacuum heat-insulator in FIG. 43 is a sectional view of the vacuum heat insulator shown in FIG. 42 disposed in an outer box of a heat insulated box.

In FIG. 42, a vacuum heat insulator 314 is composed by coating three rectangular core members 311 with a gas barrier film 312. The inside of the film 312 is kept in an evacuated state of, for example, about 10 Pa or less. The three core members 311 are disposed nearly on a same plane at a mutual specified spacing in one direction, and a film is heated and fused between one core member 311 and other core member 311 so that the three core members 311 may be positioned in an individual independent space. In the heat seal portion 313 between adjacent core members 311, a folding line 314a for folding is provided (for example, Japanese Laid-open Patent No. H7-98090).

The vacuum heat insulator 314 is provided, for example, in the inside of an outer box 315 of a heat insulated box such as refrigerator as shown in FIG. 43. The outer box 315 is a U-shaped metal plate 316. The vacuum heat insulator 314 is adhered and fixed to the metal plate 316 before U-shape bending so that the folding line 314a of the vacuum heat insulator 314 may coincide with the folding line of the metal plate 316. By U-shape bending of the metal plate 316 to which the vacuum heat insulator 314 is adhered and fixed at the side facing the inside of the outer box 315, the outer box 315 having the vacuum heat insulator 314 in its inside is obtained as shown in FIG. 43.

However, as disclosed in Japanese Laid-open Patent No. H7-269781, although heat seal part is not formed at one end of the vacuum heat insulator, heat seal parts 313 are present in the remaining three peripheral sides. Yet, since the enveloping member of a bag shape is formed somewhat larger preliminarily in order to put in the core member 311, when the inside is evacuated, the portion composed only of the enveloping member without provided with the core member 311 is left over between the core member 311 and heat seal part 313. Accordingly, the width of the peripheral edge formed around the core member is increased, and when the vacuum heat insulator is applied, folding process of the peripheral edge is needed.

Besides, since the portion composed only of the enveloping member not provided with core member is formed between the core member 311 and heat seal part 313, the shape of the vacuum heat insulator is limited, and it was difficult to manufacture a vacuum heat insulator in a desired shape.

In the vacuum heat insulator disclosed in Japanese Laid-open Patent No. H7-98090, plural rectangular core members are disposed nearly on a same plane at a mutual specified spacing in one direction. Each folding line formed in the core member and the heat seal portion positioned between one core member and adjacent core member is almost parallel to each other. Therefore, applicable objects of the conventional vacuum heat insulator (by adhering or gluing) are limited to sides of objects not changed in the shape and size of the plane and cross section in the longitudinal direction, such as sides of an object of polygonal and polyhedral columnar shape having three or more corners in cross section, or inner side or outer side of a polygonal tubular object having three or more corners in cross section. It was hence difficult to apply the conventional vacuum heat insulator, for example, in place of down or cotton of body warmer (Outfit for protection against cold).

DISCLOSURE OF THE INVENTION

The invention is devised to solve the problems of the prior art. A wide effective heat insulating area is maintained by forming a heat seal part along the core member and disposing the peripheral edge formed around the core member as heat seal part. It can be formed in any complicated shape. Plural core members are disposed appropriately, the degree of freedom of folding is sufficient, and it is hence an object to present vacuum heat insulators applicable in wide objects and purposes, and very wide in scope of application, at low cost.

It is other object of the invention to present a body warmer and a personal computer using such vacuum heat insulator.

To solve the problems of the prior art, the vacuum heat insulator of the invention-comprises a gas barrier enveloping member having a heat seal layer, and a flat core member, in which the core member is evacuated and sealed between enveloping members having mutually facing heat seal layers, the portion including the core member between the enveloping members is heated and pressed, and the mutually facing heat seal layers are heated and fused along the core member shape.

That is, after evacuating core member between the enveloping members, while compressing in a shape at atmospheric pressure, the enveloping members including core member portion is heated and pressed to execute the heat fusing process. All enveloping portion without having core member can be fused, and the heat seal part is formed along the core member shape. It is hence possible to suppress occurrence of wasteful portion not fusing the enveloping member on the peripheral edge of the vacuum heat insulator.

In the vacuum heat insulator thus formed, between the core member and the heat seal part, absent portion of core member between enveloping members can be avoided, and the effective heat insulating area can be extended. In addition, by forming the peripheral edge of the vacuum heat insulator along the core member shape, the vacuum heat insulator of any desired shape can be formed easily.

The manufacturing method of vacuum heat insulator of the invention comprises the steps of disposing a flat core member between mutually facing heat seal layers of gas barrier enveloping member having heat seal layers, heating and pressing the portion including the core member present portion between enveloping member at reduced pressure by a hot plate, and heating and fusing the mutually facing heat seal layers along the core member shape.

As a result, the heat seal parts are formed along the core member shape, and since the portions including the core member parts are pressed at the time of heat sealing, the heat seal parts are formed in the core member compressed state. Therefore, after evacuating and sealing, if returned to atmospheric pressure, deformation of the core member by atmospheric compression can be prevented, so that the heat seal parts can be formed along the core member shape.

Further, in the vacuum heat insulator of the invention, plural core members are coated with a gas barrier enveloping member, and the inside of the enveloping member is evacuated, and the plural core members are disposed at a specific mutual spacing in lattice layout or zigzag layout so that folding lines can be formed in two or more directions at the positions of mutually adjacent core members. Since the plural core members coated with the gas barrier enveloping member are disposed at a specific mutual spacing in lattice layout or zigzag layout so as to form folding lines in two directions (for example, vertical direction and lateral direction) (preferably three directions or more) at the positions of mutually adjacent core members, the vacuum heat insulator can be folded in more than the two directions. Accordingly, as compared with the conventional vacuum heat insulator, limits of shape of applicable objects are alleviated. Hence, the vacuum, heat insulator expanded in application can be presented.

Moreover, in the vacuum heat insulator of the invention, plural core members are coated with a gas barrier enveloping member, and the inside of the enveloping member is evacuated. The plural core members are disposed at a specific mutual spacing in lattice layout or zigzag layout so that folding lines can be formed in two or more directions at the positions of mutually adjacent core members. Heat seal parts of the enveloping member are disposed around the core members so that the plural core members may be positioned in mutually independent spaces. Heat seal parts of the enveloping member are disposed around the core members so that the plural core members may be positioned in mutually independent spaces. If the degree of vacuum is lowered in some core members, adverse effects do not occur in three core members, and the degree of vacuum of the space of other core members is not lowered. Hence, the vacuum heat insulator of the invention minimizes drop of heat insulating performance.

The body warmer of the invention uses such vacuum heat insulator. Since the vacuum heat insulator can be folded in more than two directions, by properly selecting the size of the core members, flexibility suited to the body warmer can be obtained. As a result, a thin body warmer of high heat insulating performance can be presented by making use of the high heat insulating performance of the vacuum heat insulator.

The microcomputer of the invention uses such vacuum heat insulator. The vacuum heat insulator can be disposed at least either at the inside of a main body bottom immediately beneath the CPU disposed on the printed board, or at the reverse side of the keyboard positioned immediately above the CPU.

In the inside of a personal computer, the internal generated heat is released outside through the housing, and as the performance is higher, the heat generation increases, and the heat generation of the housing near the CPU discomforts the user. Besides, along with installation of cooling device, in order to prevent local heat generation of the housing by a heat insulator, the vacuum heat insulator of the invention is most appropriate because it can be formed in any desired shape, high in heat insulating performance, and small in thickness, and it can solve the problem of heat generation in the housing of a personal computer.

DETAILED DESCRIPTION OF THE PREFERRED EMBODIMENTS

First of all, constituent materials for the vacuum heat insulator relating to all embodiments of the invention are explained.

The material for the core member is a porous material with vapor phase ratio of about 90% formed in sheet or plate. Industrial examples include foamed material, powder material, and fibrous material. They can be properly elected from known materials depending on the purpose of use and desired features and characteristics.

The foamed material includes urethane foam, styrene foam, phenol foam, and other continuous foam. The powder is inorganic or organic powder, or mixture thereof. Industrially, materials mainly composed of dry silica, wet silica or pearlite may be used.

The fibrous material is inorganic or organic material, or mixture thereof. From the viewpoint of cost and heat insulating performance, inorganic fibers are preferred. Examples of inorganic fibers include glass wool, glass fiber, alumina fiber, silica alumina fiber, silica fiber, rock wool, and other known materials. A mixture of foam, powder and fiber may be also used.

A plastic laminate film used in enveloping member is a plastic laminate film consisting of an inner layer of heat seal layer, an intermediate layer of metal foil or metal deposition layer as gas barrier layer, and an outer layer of surface protective layer. The plastic laminate film may be formed by combining two types of plastic laminate film, that is, a plastic laminate film having a metal foil and a plastic laminate film having a metal deposition layer.

Examples of heat seal layer include low density polyethylene film, chain low density polyethylene film, high density polyethylene film, polypropylene film, polyacrylonitrile film, undrawn polyethylene terephthalate film, ethylene-vinyl alcohol copolymer film, and their mixtures.

As the surface protective layer, nylon film, polyethylene terephthalate film, drawn processed product of polypropylene film, and other known materials can be used.

The embodiments of the invention are described specifically below while referring to the accompanying drawings. It must be noted however, that the invention is not limited to these illustrated embodiments alone. In particularly, it must be understood that the size and shape of the insulator and quantity of core members explained in the embodiments are mere examples presented for the convenience of explanation and drawing figures, and may be different from the entity.

Embodiment 1

Figure 1:
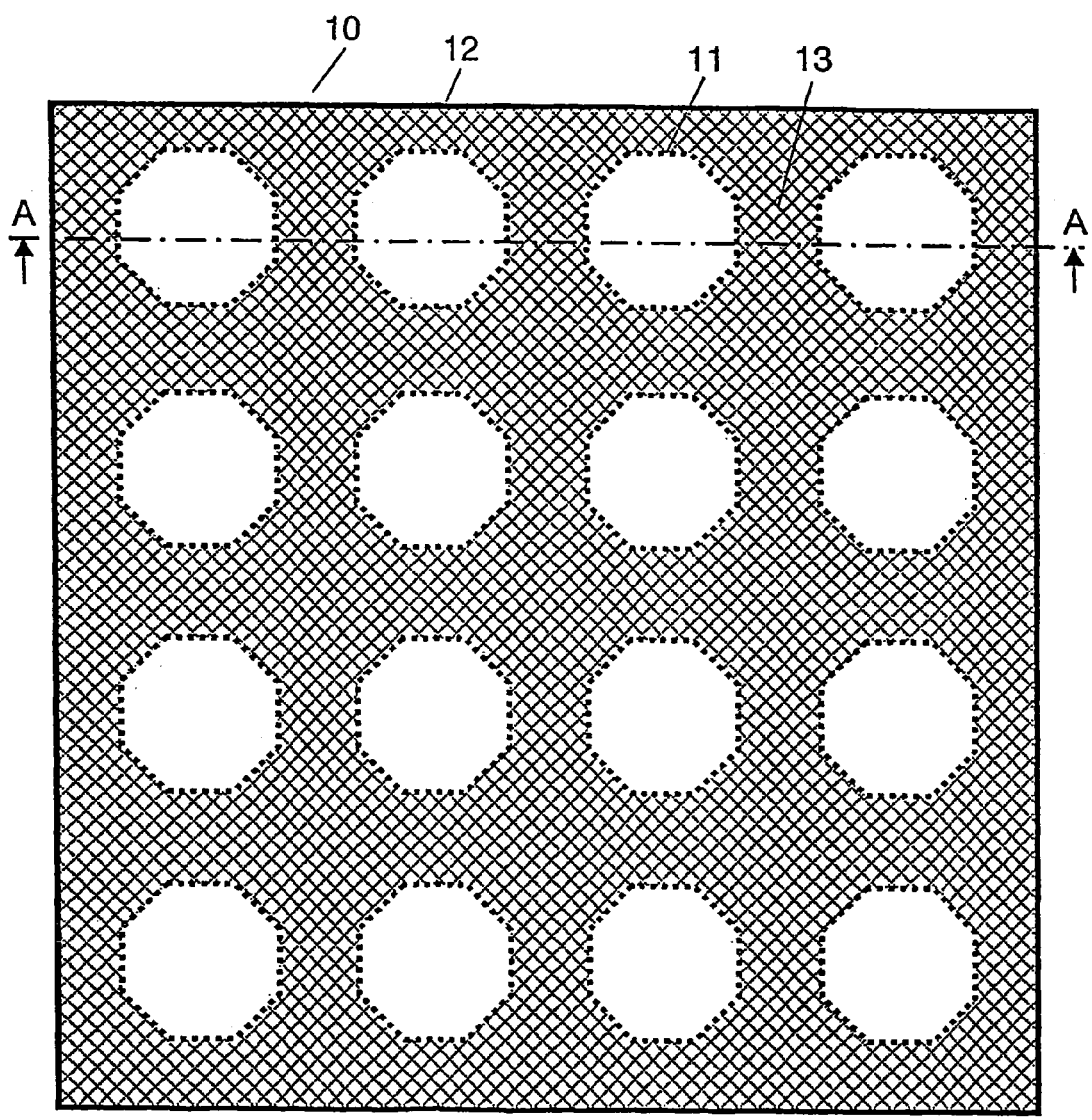
FIG. 1 is a plan view of a multi-core vacuum heat insulator in embodiment 1 of the invention.
Figure 2:
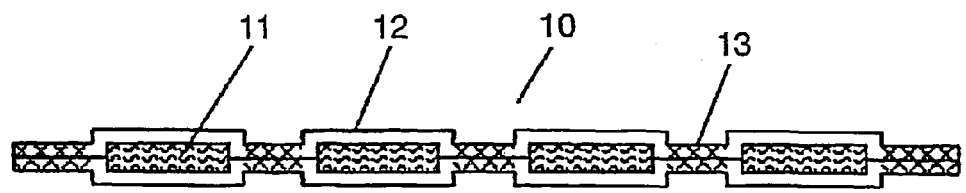
FIG. 2 is a sectional view along line A-A in FIG. 1.

FIG. 1 is a plan view of a multi-core vacuum heat insulator in embodiment 1 of the invention, and FIG. 2 is a sectional view along line A-A in FIG. 1.

FIG. 1 and FIG. 2 show part of a vacuum heat insulator 10. It is shown as a nearly regular octagonal shape in the drawing and explanation.

The vacuum heat insulator 10 consists of 16 regular octagonal shapes. A core member 11 of 3 mm in thickness formed of compressed powder is coated with an enveloping member 12 made of gas barrier plastic laminate film.

The inside of the enveloping member 12 is evacuated nearly to 10 Pa or less. A total of 16 core members 11 are disposed in lattice layout. That is, each side of the vertically and laterally adjacent core members 11 is nearly opposite and parallel to each other.

Each regular octagonal core member 11 has eight sides. The length of one side is about 10 mm although different depending on the application and size of the vacuum heat insulator 10.

Specific interval between the core member 11 and other adjacent core member 11 is, for example, slightly larger than the sum of the length of one side of the regular octagonal shape and four times of the thickness of the enveloping member 12. The specific interval may be set in a range from several to tens of millimeters.

In order that 16 core members 11 be positioned in individual independent spaces, heat seal parts 13 of enveloping member 12 are disposed around the core members 11. The heat seal parts 13 are formed in the enveloping member 12 along the periphery of the regular octagonal core member 11. The gas barrier layer of the enveloping member 12 is laminated with an aluminum deposition film.

In embodiment 1, the enveloping member 12 of the vacuum heat insulator 10 is heated and fused between the core member 11 and the adjacent other core member 11. Between the core member 11 and heat seal part 13, in order that there is no absent portion of heat seal part 13 in the enveloping member not having the interposed core member, the vacuum heat insulator 10 is formed so that the heat seal part 13 may be formed along the core member shape.

An example of manufacturing method of this vacuum heat insulator 10 is explained below.

Figure 3:
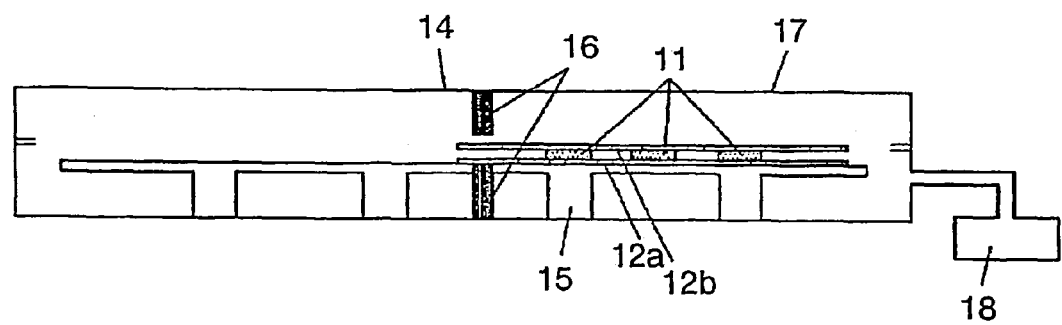
FIG. 3 is a schematic sectional view of a vacuum packaging machine used in manufacture of vacuum heat insulator in embodiment 1.

FIG. 3 is a schematic sectional view of a vacuum packaging machine used in manufacture of vacuum heat insulator in embodiment 1 of the invention. In FIG. 3, an airtight chamber is provided in a vacuum packaging machine 14, and longitudinally cut gas barrier enveloping members 12a are put on a sample table 15 of the vacuum packaging machine 14, with the heat seal layer side upward. The sample table 15 is provided with a conveyor (not shown), and the enveloping member 12a can be moved from the right to the left side in the front view of FIG. 3.

Core members 11 are disposed on enveloping members 12a, and enveloping members 12b are disposed so that the heat seal layer side may face the core member 11 side, and that the end faces of the upper and lower enveloping members 12a, 12b may nearly coincide with each other.

In the vacuum packaging machine 14, the hot plate 16 for heat sealing by heating and pressing is located at the upper and lower position near the center of the sample table 15, and the enveloping members 12a, 12b are located at positions for heating and fusing to the inner side from the front side in the front view of FIG. 3. The hot plate 16 is composed of an elastic material such as heat resistant rubber, and presence or absence of core member 11 between the two enveloping member 12a, 12b is absorbed by deformation of the hot plate 16. As a result, the mutually opposite heat seal layers can be heated and fused relatively easily along the core member shape.

The core member 11 and the adjacent other core member 11 are disposed at a specific interval. The distance of specific interval is selected in a range from several to tens of millimeters. When operation of a vacuum pump 18 is started by closing a lid 17 of the vacuum packaging machine 14, the inside of the vacuum packaging machine 14 is evacuated to be nearly 10 Pa or less. When the inside of the vacuum packaging machine 14 is evacuated, by operating the conveyor not shown, the enveloping members 12a, 12b are moved by a specified distance less than the width of the hot plate 16, and stopped, and the heat seal parts 13 are formed by heating and pressing the enveloping members 12a, 12b by the hot plate 16.

This operation is repeated in the vacuum packaging machine 14, and the core members 11 are positioned in the spaces of the outer core members 12a, 12b. Thus, the vacuum heat insulator 10 forming the heat seal parts 13 along the periphery of the core members 11 can be manufactured.

By heat sealing, the specified positions of the core members 11 disposed between the enveloping member 12a and enveloping member 12b are heated and pressed, and therefore when released to the atmosphere after vacuum packaging, effects of compressive deformation of core members 11 by atmospheric pressure can be kept to a minimum limit. In particular, when the pressing force in heating and pressing is set at 1 kg/cm$^2$ or more, the compressive deformation of core members 11 by atmospheric compression when opening to the atmosphere can be restricted to a practicably safe range. Hence, even when a core material large in compressive deformation, the core member end portion may be realized by the vacuum heat insulator 10 having a heat seal part 13, along the core member shape.

At the same time, the specified portion of the core member 11 disposed between the enveloping member 12a and enveloping member 12b is heated and pressed. As a result, the heat seal layer enclosing the core members 11 of the enveloping members 12a and 12b is fused in the heating and pressing process, and the sandwich structure of the enveloping member 12 and core member 11 is reinforced, so that a vacuum heat insulator 10 of high rigidity is obtained.

Embodiment 1 shows a manufacturing method of vacuum heat insulator for heating and fusing the heat seal layers of mutually opposite enveloping members 12 along the core member shape by heating and pressing by specified number of times including the core members 11 enclosed between the outer core members 12. Meanwhile, when the hot plate 16 is formed larger than the gas barrier enveloping members 12a, 12b, by heating and pressing the hot plate 16 only once, the heat seal parts 13 can be formed.

Embodiment 1 shows a method of vacuum packaging of plural core members 11 in batch. The quantity of core members in vacuum packaging can be manufactured from one to an arbitrary number of pieces as desired depending on the quantity or shape.

In embodiment 1, the shape of the core members 11 of the vacuum heat insulator 10 is regular octagonal. However, the shape of the core members 11 also includes triangle, square, polygon, circle, L-shape or the like. Or the shape may be arbitrary, including a combination of them.

Embodiment 2

A vacuum heat insulting material in embodiment 2 of the invention is explained. Same parts as in embodiment 1 are identified with same reference numerals, and the detailed description is omitted.

Figure 4:
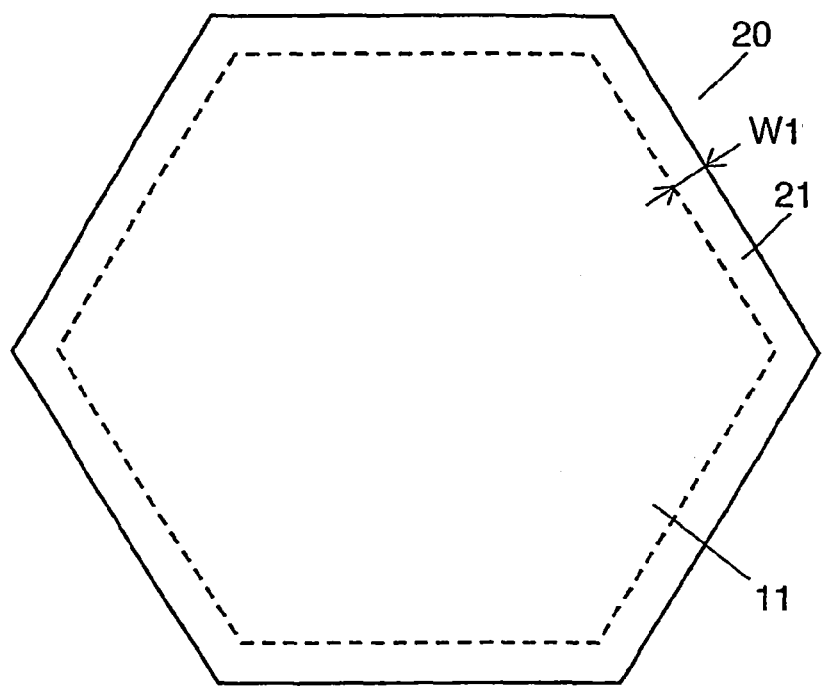
FIG. 4 is a plan view of a vacuum heat insulator in embodiment 2 of the invention.
Figure 5:
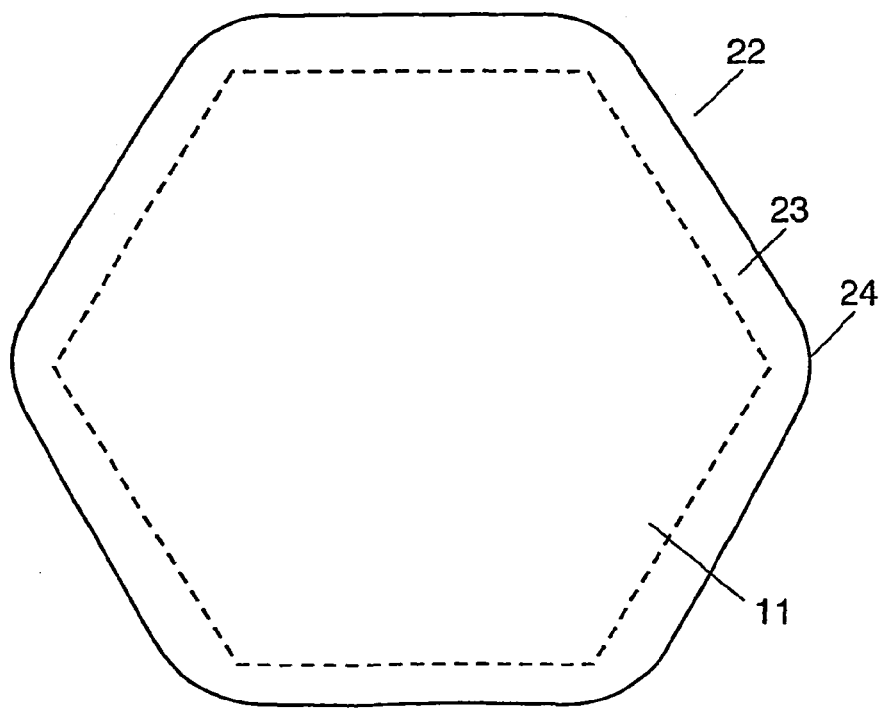
FIG. 5 is a plan view of a vacuum heat insulator showing a modified example of embodiment 2.
Figure 6:
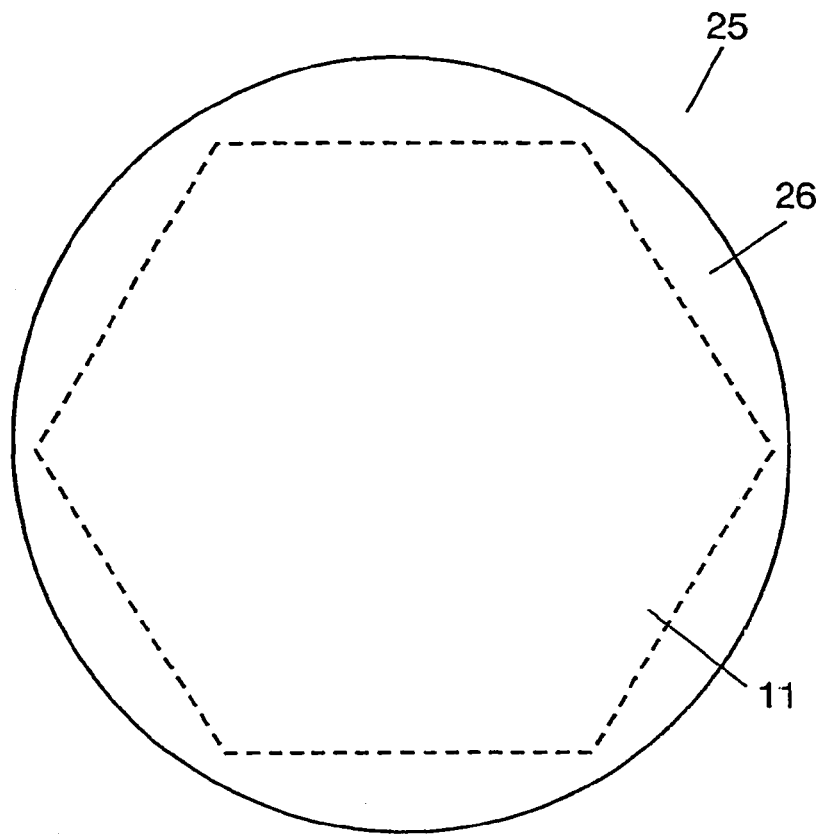
FIG. 6 is a plan view of a vacuum heat insulator in other modified example of embodiment 2.

FIG. 4, FIG. 5, and FIG. 6 are plan views of a vacuum heat insulator in embodiment 2 of the invention.

The vacuum heat insulators 20, 22 and 25 shown in FIG. 4 to FIG. 6 correspond to the vacuum heat insulators formed by cutting so as to leave the heat seal parts in a specified width to the core members 11 in the heat seal parts 13 of the vacuum heat insulator 10 in embodiment 1.

The vacuum heat insulator 20 shown in FIG. 4 is a vacuum heat insulator formed by cutting into a nearly core member shape so as to leave a heat seal part 21 of a specified width between the core member 11 and adjacent core member 11.

The vacuum heat insulator 22 shown in FIG. 5 is formed by cutting into a nearly core member shape so as to leave a heat seal part 23 of a specified width between the core member 11 and adjacent core member 11, and by cutting the corner 24 of the heat seal part 23.

The vacuum heat insulator 25 shown in FIG. 6 forms a circular heat seal part 26 slightly larger than the core member shape.

In embodiment 2 shown in FIG. 4 to FIG. 6, there is no heat seal part absent area in the peripheral edge of the vacuum heat insulators 20, 22 and 25. That is, the heat seal parts 21, 23 and 26 are formed along the core member shape, and the effective sectional area is wide. At the same time, the vacuum heat insulators 20, 22 and 25 of arbitrary shape can be formed.

The heat seal parts 21, 23 and 26 can be cut off so as to leave a specified width between the core member 11 and adjacent other core member 11, and a vacuum heat insulator suited to a desired application can be formed, and its adaptability is improved remarkably.

In FIG. 4, the heat seal part 21 of the vacuum heat insulator 20 is cut off so that the width W1 may be about 5 mm. The width W1 of the heat seal part 21 is a factor influencing the aging of the heat insulating performance. The greater the width W1, the better is the heat insulating performance in the time course, but it can be set as desired depending on the application of use and desired service life of the vacuum heat insulator 20. However, from the viewpoint of wide effective heat insulating surface area, the width W1 of the heat seal part 21 is desired to be set at about 3 mm to 5 mm.

The shape of the heat seal part is not particularly specified. As shown in the vacuum heat insulators 22, 25, it may be selected in a desired shape depending on the environment of use and application adaptability.

An example of manufacturing method of vacuum heat insulators 20, 22, and 25 shown in FIG. 4, FIG. 5 and FIG. 6 is explained below.

In the same manner as in embodiment 1, a multi-core vacuum heat insulator is fabricated. In the multi-core vacuum heat insulator, the heat seal part of the enveloping member is cut off by using Thompson punching device or cutter so as to leave a heat seal part in a desired width between the core member 11 and other core member 11, so that desired vacuum heat insulators 20, 22, and 25 can be manufactured.

Thus, the peripheral edge composed by the heat seal parts on the outer periphery of the core member of heat insulator is smaller, and a vacuum heat insulator of a desired shape can be fabricated. Besides, by manufacturing the multi-core vacuum heat insulator having plural core members disposed nearly on a same plane by spacing from each other, desired vacuum heat insulators can be sequentially cut out from the multi-core vacuum heat insulator, so that multiple vacuum heat insulators or plural vacuum heat insulators of different size or shape can be efficiently manufactured by one evacuating operation.

Embodiment 3

A vacuum heat insulting material in embodiment 3 of the invention is explained. Same parts as in embodiment 1 or 2 are identified with same reference numerals, and the detailed description is omitted.

Figure 7:
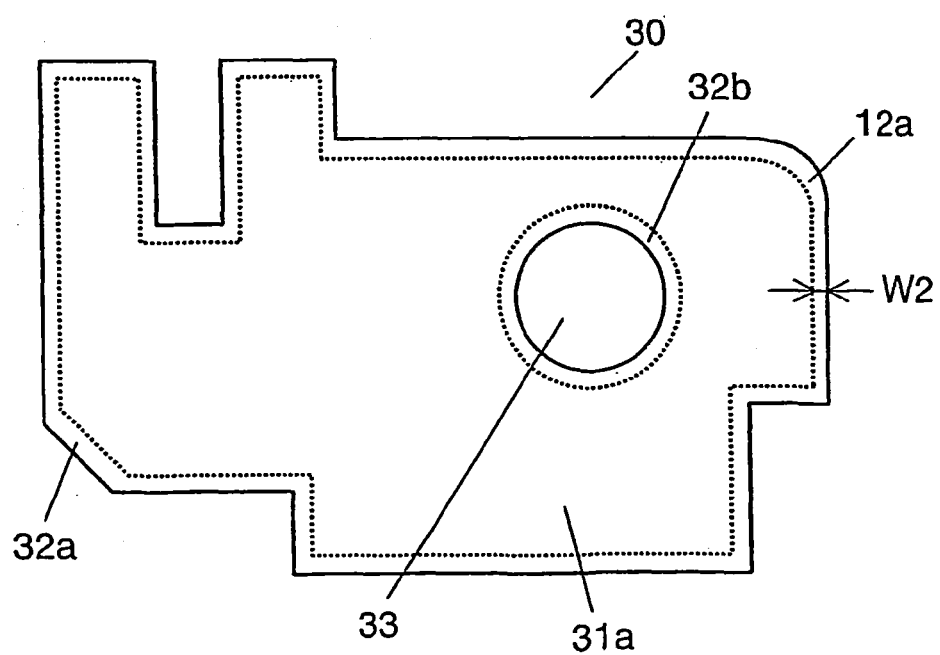
FIG. 7 is a plan view of a vacuum heat insulator in embodiment 3 of the invention.
Figure 8:
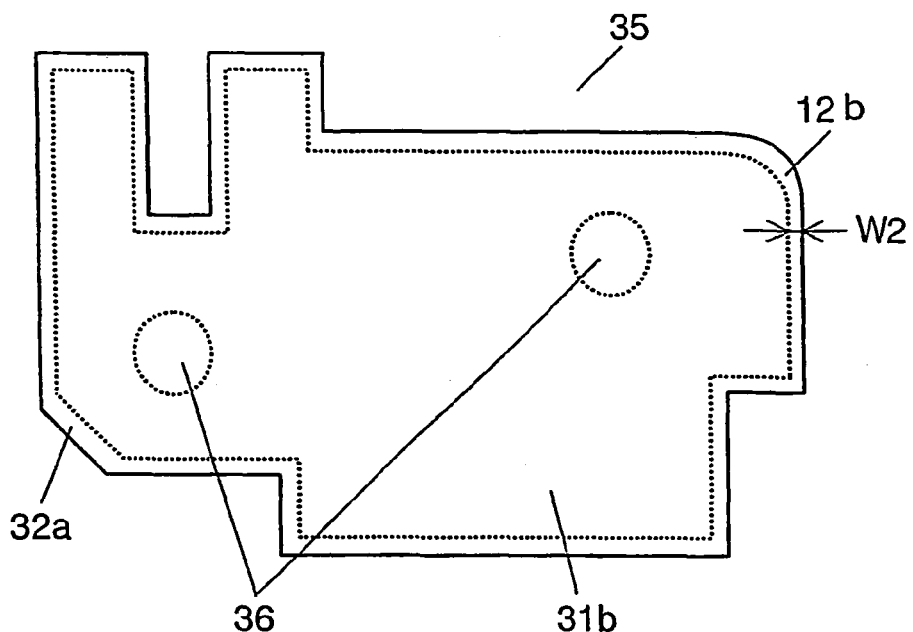
FIG. 8 is a plan view of a vacuum heat insulator showing a modified example of embodiment 3.

FIG. 7 and FIG. 8 are plan views of a vacuum heat insulator in embodiment 3 of the invention.

A vacuum heat insulator 30 and a vacuum heat insulator 35 shown in FIG. 7 and FIG. 8 are made of core members of 2 mm thick plate material of compressed powder, manufactured in specified shape by combination of square and circle being cut out by, for example, Thompson punching device.

A core member 31a having one through-hole 33 and a core member 31b having two through-holes 36 are coated with gas barrier enveloping members 12a, 12b, and disposed inside of the enveloping members 12a, 12b. The inside of the enveloping members 12a, 12b is evacuated, for example, to 10 Pa or less. Heat seal parts 32a are formed around the periphery of the core members 31a, 31b. The heat seal parts 32a are cut off so as to leave a width W2 of about 3 mm at the peripheral edge of the core member, and the vacuum heat insulator 30 and vacuum heat insulator 35 are formed.

In the vacuum heat insulator 30 shown in FIG. 7, the through-hole 33 is formed. In the inner periphery of the through-hole 33, heat seal parts 32b are provided along the core member shape. At this time, the heat seal parts 32b are cut off so as to leave a width W2 of about 3 mm between the adjacent core members 31a same as on the outer periphery, and the vacuum heat insulator 30 having the through-hole 33 is formed.

The vacuum heat insulator 35 shown in FIG. 8 has two circular through-holes 36 in the core member 31b. No hole is formed in the enveloping member 12b positioned in the through-holes 36, and the enveloping members having the heat seal parts fused together by heat are left over.

In the vacuum heat insulator 30 and vacuum heat insulator 35, the core members 31a, 31b are combined of square and circle in shape. The shape is slightly complicated in order to be suited to the application shape, but since the heat seal parts 32a, 32b are formed along the core member shape, the vacuum heat insulator can be manufactured easily nearly in the core member shape.

Since the vacuum heat insulator 30 shown in FIG. 7 has the through-hole 33, if ribs or other protruding parts are positioned in the heat insulating area, such protrusions can be avoided by the through-hole 33, and the vacuum heat insulator 30 can be applied efficiently.

In the vacuum heat insulator 35 shown in FIG. 8, the core member 31a is not provided between enveloping members 12b in the area of through-holes 36 of the core member 31b, and the heat seal parts are fused together by heat in the enveloping member 12b, this area can be fixed by screws or the like. The vacuum heat insulator 35 can be easily fixed and disposed, and the mounting performance is excellent.

Thus, in embodiment 3, the vacuum heat insulator can be formed in any desired shape depending on the application of heat insulation and shape of the device, and the adaptability of application is expanded outstandingly.

In embodiment 3, the core member of 2 mm thick plate material is used, and the thickness of the vacuum heat insulator is not more than 2.1 mm. If the thickness of the vacuum heat insulator is more than 5 mm, the peripheral edge free from core member is likely to form wrinkles, or if the thickness exceeds 10 mm, the heat seal parts cannot be formed along the core member shape, and a non-seal part not containing core member is formed between the core member and heat seal part.

This is because the hot plate made of elastic material cannot follow up the core member shape at the time of heat sealing as the core member thickness of the vacuum heat insulator increases, or extra portions of the enveloping member due to greater thickness cannot be treated neatly.

On the other hand, if the thickness of the vacuum heat insulator is less than 0.5 mm, enough thickness of the core member is not assured, and excellent heat insulating performance is not obtained. However, if the disposing space of the heat insulator disposed in the application or device is small, it is not impossible practically as far as the desired heat insulating performance is small.

Embodiment 4

A vacuum heat insulting material in embodiment 4 of the invention is explained. Same parts as in embodiment 1 or 2 are identified with same reference numerals, and the detailed description is omitted.

Figure 9:
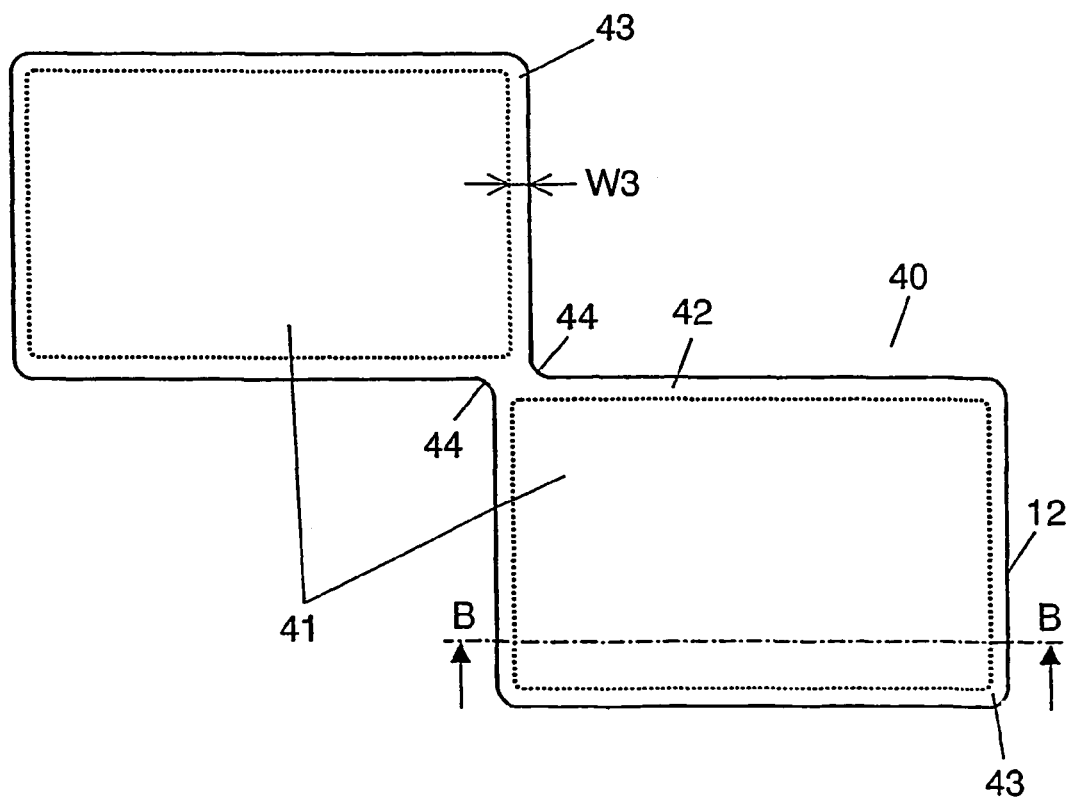
FIG. 9 is a plan view of a vacuum heat insulator in embodiment 4 of the invention.
Figure 10:
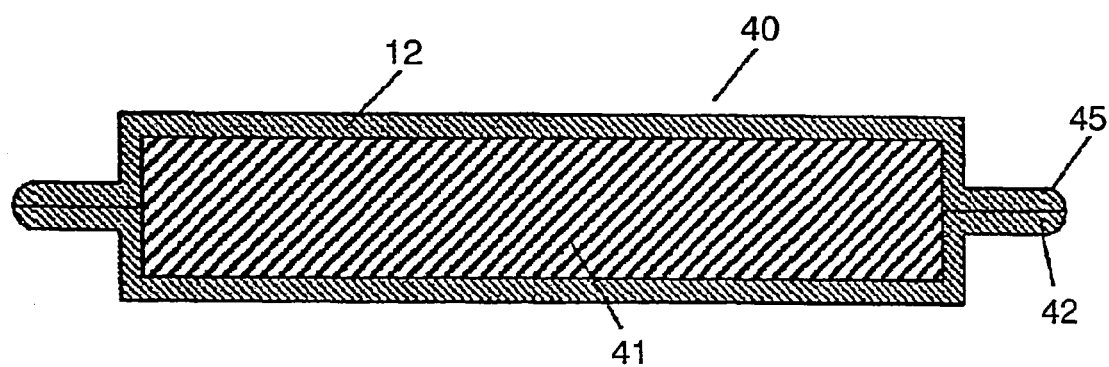
FIG. 10 is a sectional view along line B-B in FIG. 9.

FIG. 9 is a plan view of a vacuum heat insulator in embodiment 4 of the invention, and FIG. 10 is a sectional view along line B-B in FIG. 9.

A vacuum heat insulator 40 shown in FIG. 9 and FIG. 10 is made of core member of about 1 mm thick plate material of compressed powder, and manufactured by cutting out by, for example, Thompson punching device, and coating two core members 41 having a specified shape with gas barrier enveloping member 12. The inside of the enveloping member 12 is evacuated to, for example, 10 Pa or less. Heat seal parts are formed around the periphery of the core member 41, and are cut off so as to leave the heat seal parts 42 in a specified width W3 in the peripheral edge of the core members 41, and thereby the vacuum heat insulator 40 is formed.

In the vacuum heat insulator 40, at the time of heat sealing of the heat seal part, corners 43 are melted down in a circular shape. As a result, in the vacuum heat insulator 40, other vacuum heat insulator or hardness of the application will not be flawed by the film edge of the corners 43, and its handling is improved greatly. Further, when the inward corner 44 where the fused portion is an inward L-shape is also formed in a circular shape, cracks originated from L-shaped corner can be suppressed, and handling and reliability of the vacuum heat insulator 40 are much improved.

Moreover, in the vacuum heat insulator 40, since the heat seal part is cut off by melting down, the fused portion 45 is circular and round in section, and injury of other vacuum heat insulator or hardness of application device can be avoided.

When the heat seal part is melted down, the resin of the outermost layer of the plastic laminate film forming the enveloping member 12 is fused, and the fused resin covers at least part of the fused section, and invading gas from the end of the enveloping member in the time course can be decreased.

As a result of experimental calculation of invading gas amount in the vacuum heat insulator 40 of embodiment 4, as compared with the case of cutting off by Thompson punching device without melting, the invading gas amount from the end of the enveloping member was decreased by about 10%.

Embodiment 5

Figure 11:
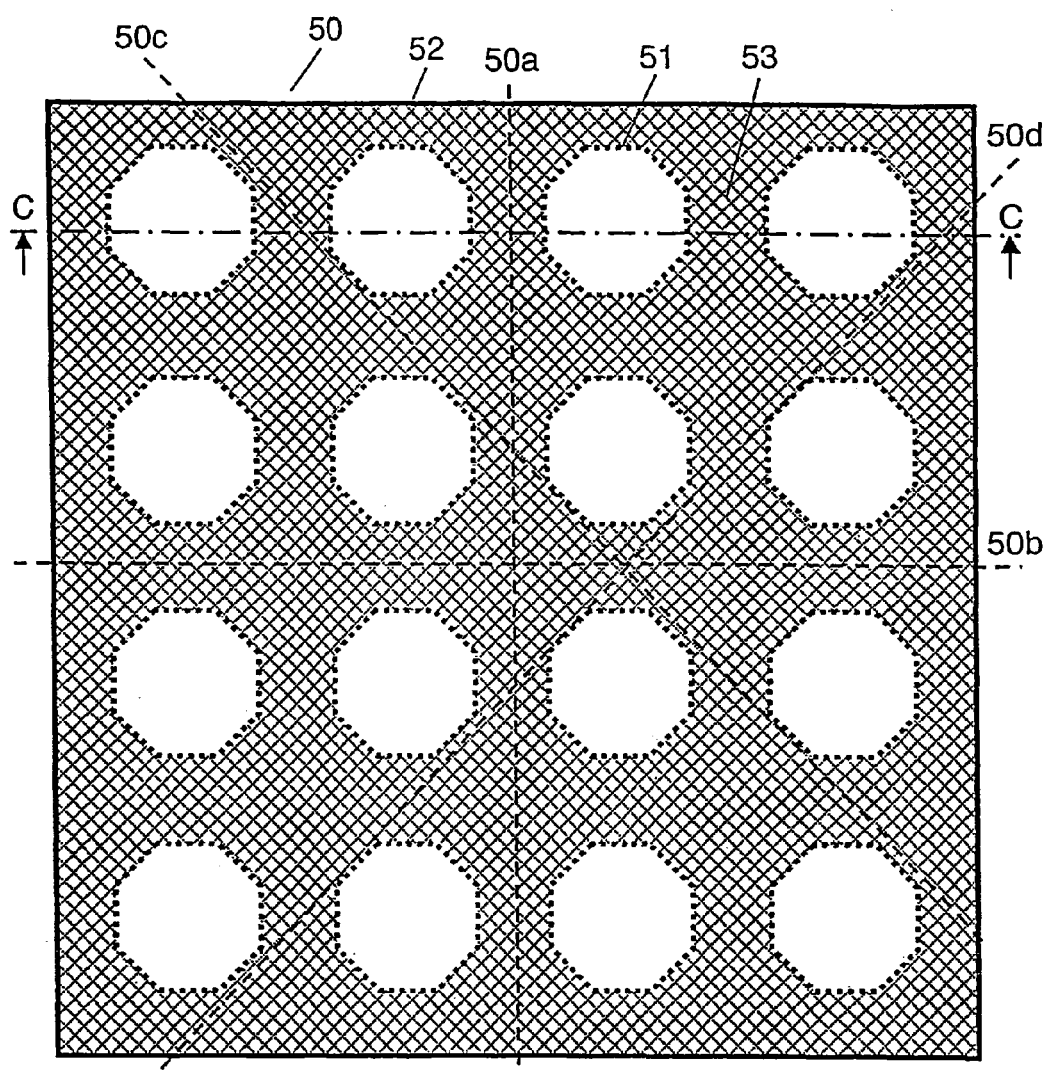
FIG. 11 is a plan view of a vacuum heat insulator in embodiment 5 of the invention.
Figure 12:
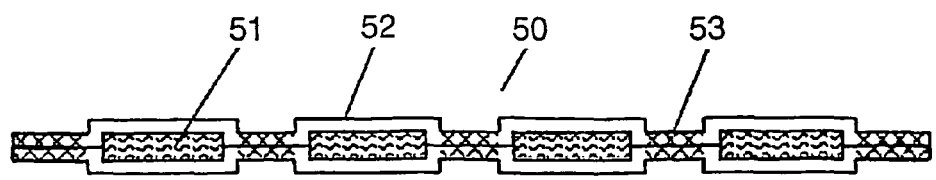
FIG. 12 is a sectional view along line C-C in FIG. 11.

FIG. 11 is a plan view of a vacuum heat insulator in embodiment 5 of the invention, and FIG. 12 is a sectional view along line C-C in FIG. 11.

A vacuum heat insulator 50 shown in FIG. 11 and FIG. 12 consists of 16 core members 51 of thickness of about 5 mm made of glass fiber formed nearly in regular octagonal shape, which are coated with a gas barrier enveloping member 52. The inside of the enveloping member 52 is evacuated to, for example, 10 Pa or less.

Between the core member 51 and its adjacent other core member 51, folding lines 50a, 50b, 50c, and 50d are formed in four vertical, lateral and oblique directions, parallel to each side of the regular octagon of the core members 51. Further, the 16 core members are formed in lattice layout, that is, they are disposed vertically and laterally at a specific interval so that each side of mutually adjacent core members 51 may be opposite to each other. The specific interval is selected slightly larger than the sum of the length of one side of the octagonal core member 51 and the size of four times of the thickness of the enveloping member 52 covering the core member 51. As mentioned above, the specific interval is about several mm to tens of mm.

In order that the 16 core members 51 may be located in independent spaces individually, heat seal parts 53 of the enveloping member 52 are disposed around the core members 51.

The enveloping member 52 is made of a plastic laminate film having an intermediate layer made of aluminum deposition film or aluminum foil layer. The core member 51 may be formed in multiple layers by laminating glass fiber sheets.

The vacuum heat insulator 50 shown in FIG. 11 and FIG. 12 can be bent in four directions, that is, vertical direction, lateral direction, and 45-degree vertical and lateral oblique directions, by the heat seal parts 53 of the enveloping member 52 positioned between the core member 51 and adjacent other core member 51. It is easier to bend in the vertical and lateral directions than in oblique directions.

Thus, the vacuum heat insulator 50 has the plural octagonal core members 51 coated with the gas barrier enveloping member 52. The inside of the enveloping member 52 is evacuated. The plural core members 51 are disposed in lattice layout at a specific interval so as to form folding lines 50a, 50b, 50c, and 50d in four directions in the position between the adjacent core members. Since the heat seal parts 53 of the enveloping member 52 are provided around the core members 51 so that the plural core members 51 may be located in independent spaces individually, the vacuum heat insulator 50 can be folded in four directions. Meanwhile, it must be understood that the core members 51 are disposed so that folding lines or injuries may not be formed in all core members 5I if folded in oblique directions as 110 indicated by folding lines 50 and 50d. As a result, the limitation of shape of applicable objects is alleviated as compared with the conventional vacuum heat insulator, so that the applications are expanded.

If the degree of vacuum in the space of some core member 51 is lowered, the degree of vacuum in the spaces of other core members 51 is not lowered, and drop of heat insulating performance can be kept to a minimum limit.

In embodiment 5, all of the outer core members 52 positioned on the outer periphery of the vacuum heat insulator 50 and the enveloping members 52 positioned between the adjacent core members 51 are fused by heat, and the width of the heat seal parts 53 is broad, thereby eliminating the inconvenience of drop of 20 degree of vacuum in the spaces of the core members 51 through the heat seal parts 53.

Besides, since the shape of the core members 51 is octagonal, the rate of the occupied area of the core members 51 can be increased for the vacuum heat insulator foldable in four directions, and hence the heat insulating performance can be enhanced and the balance of flexibility and heat insulating performance can be enhanced.

In the vacuum heat insulator 50 of embodiment 5, four core members 51 are arranged each in vertical and lateral directions, but the layout is not limited to this example alone.

When the vacuum heat insulator 50 is applied, it can be used by cutting in desired size or shape. When cutting, it is preferred to cut off from the heat seal parts 53 of the enveloping member 52 in order to minimize drop of heat insulating performance.

Embodiment 6

A vacuum heat insulting material in embodiment 6 of the invention is explained. Same parts as in embodiment 5 are identified with same reference numerals, and the detailed description is omitted.

Figure 13:
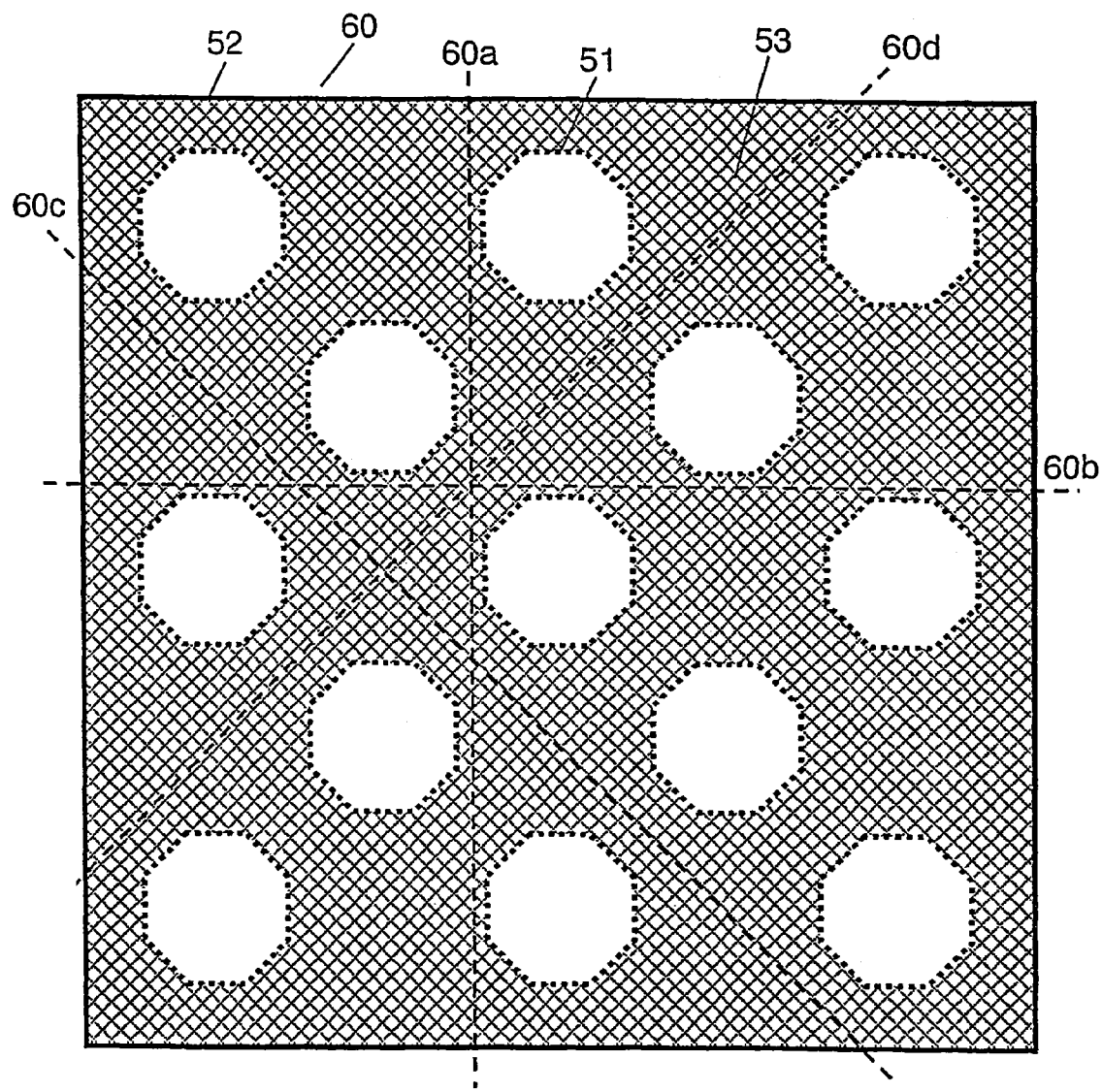
FIG. 13 is a plan view of a vacuum heat insulator in embodiment 6 of the invention.

FIG. 13 is a plan view of a vacuum heat insulator in embodiment 6 of the invention.

A vacuum heat insulator 60 shown in FIG. 13 consists of 13 core members 51 of thickness of about 5 mm made of glass fiber formed nearly in regular octagonal shape, which are coated with a gas barrier enveloping member 52. The inside of the enveloping member 52 is evacuated to, for example, 10 Pa or less.

Between the core member 51 and its adjacent other core member 51, folding lines 60a, 60b, 60c, and 60d are formed in four vertical, lateral and oblique directions, parallel to each side of the regular octagon of the core members 51.

Further, the 13 core members 51 are formed in zigzag layout. That is, they are disposed at a specific interval so that core members 51 adjacent to each other in oblique 45-degree direction may be opposite to the oblique side. The specific interval is selected slightly larger than the sum of the length of one side of the octagonal core member 51 and the size of four times of the thickness of the enveloping member 52 covering the core member 51.

In order that the 13 core members 51 may be located in independent spaces individually, heat seal parts 53 of the enveloping member 52 are disposed around the core members 51.

The vacuum heat insulator 60 can be bent in four directions, that is, vertical direction, lateral direction, and 45-degree vertical and lateral oblique directions, by the heat seal parts 53 of the enveloping member 52 positioned between the adjacent core members 51, and it is easier to bend in oblique directions than in the vertical and lateral directions.

Thus, the vacuum heat insulator 60 has the plural octagonal core members 51 coated with the gas barrier enveloping member 52. The inside of the enveloping member 52 is evacuated. The plural core members 51 are disposed in zigzag layout at a specific interval so as to form folding lines 60a, 60b, 60c and 60d in four directions in the position between the adjacent core members. Since the heat seal parts 53 of the enveloping member 52 are provided around the core members 51 so that the plural core members 51 may be located in independent spaces individually, the vacuum heat insulator 60 can be folded in four directions, and hence the limitation of shape of applicable objects is alleviated as compared with the conventional vacuum heat insulator, so that the applications are expanded.

If the degree of vacuum in the space of some core member 51 is lowered, adverse effects on the other core members 51 can be prevented. Since the degree of vacuum in the spaces of other core members 51 is not lowered, drop of heat insulating performance can be kept to a minimum limit.

All of the outer core members 52 positioned on the outer periphery of the vacuum heat insulator 50 and the enveloping members 52 positioned between the adjacent core members 51 are fused by beat, and the width of the heat seal parts 53 is broad, thereby eliminating the inconvenience of 'drop' of degree of vacuum in the spaces of the core members 51 through the heat seal parts 53.

Besides, since the shape of the core members 51 is octagonal, the rate of the occupied area of the core members 51 can be increased for the vacuum heat insulator foldable in four directions, and hence the heat insulating performance is relatively high. Hence the balance of flexibility and heat insulating performance can be enhanced.

In the vacuum heat insulator 60, 13 core members 51 are arranged in zigzag layout, but the layout is not limited to this example alone. When the vacuum heat insulator 60 is applied, it can be used by cutting in desired size or shape. When cutting, it is preferred to cut off from the heat seal parts 53 of the enveloping member 52 in order to minimize drop of heat insulating performance.

Embodiment 7

A vacuum heat insulting material in embodiment 7 of the invention is explained. Same parts as in embodiment 5 are identified with same reference numerals, and the detailed description is omitted.

Figure 14:
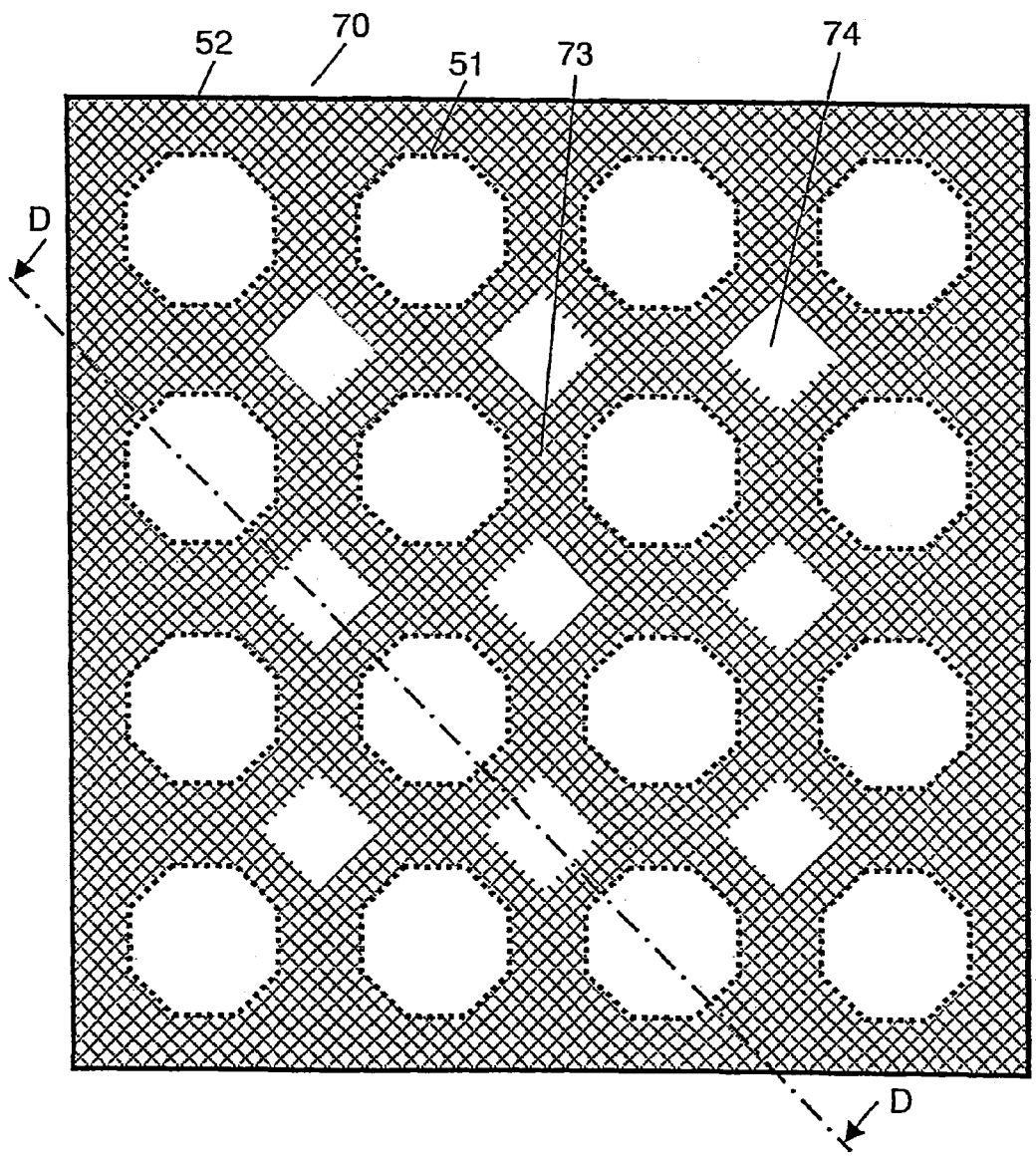
FIG. 14 is a plan view of a vacuum heat insulator in embodiment 7 of the invention.
Figure 15:
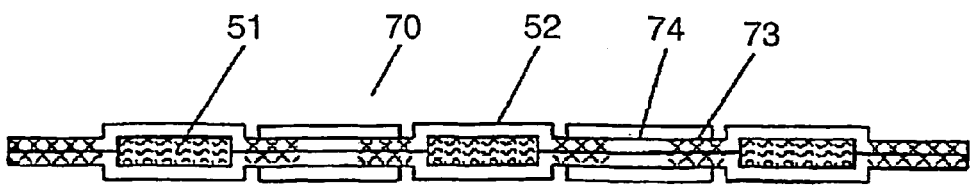
FIG. 15 is a sectional view along line D-D in FIG. 14.

FIG. 14 is a plan view of a vacuum heat insulator in embodiment 7 of the invention, and FIG. 15 is a sectional view along line D-D in FIG. 14.

A vacuum heat insulator 70 consists of 16 core members 51 of thickness of about 5 mm made of glass fiber formed nearly in regular octagonal shape, which are coated with a gas barrier enveloping member 52. The inside of the enveloping member 52 is evacuated to, for example, 10 Pa or less. Between the core member 51 and its adjacent other core member 51, folding lines are formed in four vertical, lateral and oblique directions, parallel to each side of the regular octagon of the core members 51.

The core members 51 are formed in lattice layout, that is, they are disposed vertically and laterally at a specific interval. As a result, each side in vertical, lateral and oblique directions of mutually adjacent core members 51 may be disposed nearly parallel to each other. The specific interval is slightly larger than the sum of the length of one side of the octagonal core member 51 and the size of four times of the thickness of the enveloping member 52 covering the core member 51.

In order that the 16 core members 51 may be located in independent spaces individually, heat seal parts 73 of the enveloping member 52 are disposed around the core members 51, and further between the adjacent core members 51, and on both sides of the heat-seal parts 73, non-seal parts 74 not fused by heat in the enveloping members 52 are provided at the outer peripheral side of the core members 51.

The vacuum heat insulator 70 can be bent in four directions, that is, vertical direction, lateral direction, and 45-degree vertical and lateral oblique directions, by the enveloping member 52 positioned between the adjacent core members 51. It is easier to bend in the vertical and lateral directions than in oblique directions.

Thus, the vacuum heat insulator 70 has the plural octagonal core members 51 coated with the gas barrier enveloping member 52, and the inside of the enveloping member 52 is evacuated. The plural core members 51 are disposed in lattice layout at a specific interval so as to form folding lines in four directions in the position between the adjacent core members, and the heat seal parts 73 of the enveloping member 52 are provided around the core members 51 so that the plural core members 51 may be located in independent spaces individually, and therefore the vacuum heat insulator 70 can be folded in four directions, and the limitation of shape of applicable objects is alleviated as compared with the conventional vacuum heat insulator, so that the applications are expanded.

If the degree of vacuum in the space of some core member 51 is lowered, the degree of vacuum in the spaces of other core members 51 is not lowered, and drop of heat insulating performance can be kept to a minimum limit.

Further between the adjacent core members 51, and on both sides of the heat seal parts 73, non-seal parts 74 not fused by heat in the enveloping members 52 are provided at the outer peripheral side of the core members 51, and therefore it is easy to pattern the heat seal parts 73, and it is easy to reduce the size and simplify the fusion device, and the fusion work is easier.

Besides, since the shape of the core members 51 is octagonal, the rate of the occupied area of the core members 51 can be increased for the vacuum heat insulator foldable in four directions, and hence the heat insulating performance can be enhanced and the balance of flexibility and heat insulating performance can be enhanced.

In the vacuum heat insulator 70, four core members 51 are arranged each in vertical and lateral directions, but the layout is not limited to this example alone.

Figure 16:
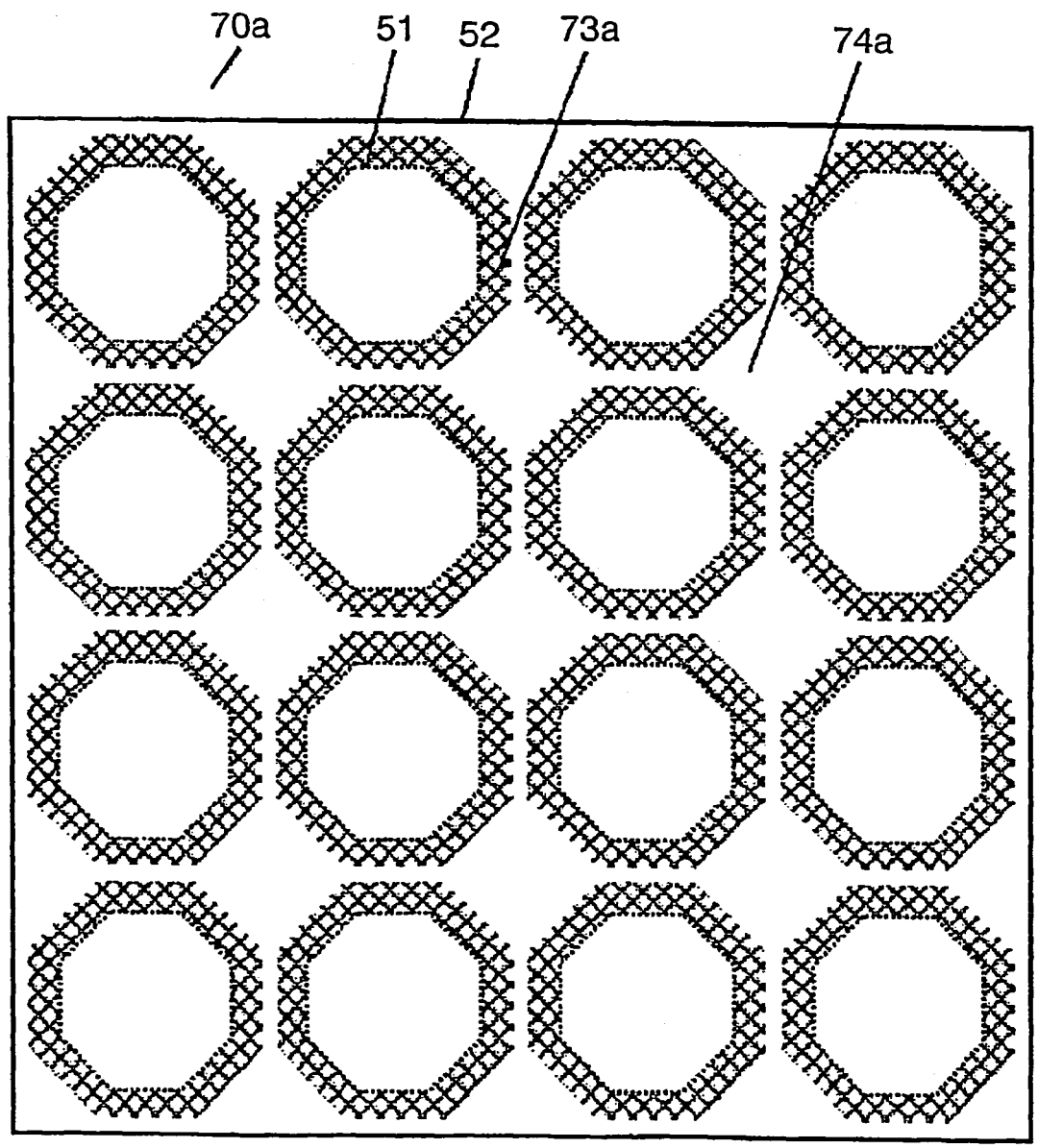
FIG. 16 is a plan view of a vacuum heat insulator in a modified example of embodiment 7.

In a vacuum heat insulator 70a in a modified example of embodiment 7 shown in FIG. 16, heat seal parts 73a of the enveloping member 52 provided around the core members 51 are formed independently for each core member 51. Or they may be formed in an octagonal doughnut shape surrounding the core members 51, and all other parts of the enveloping members 52 than the heat seal parts 73a may be formed as non-seal parts 74a.

When the vacuum heat insulator 70 is applied, it can be used by cutting in desired size or shape. When cutting, it is preferred to cut off from the heat seal parts 73 or non-seal parts 74 of the enveloping member 52 in order to minimize drop of heat insulating performance.

Similarly, when cutting vacuum heat insulator 70a in the modified example of embodiment 7 shown in FIG. 16, it is preferred to cut off from the non-seal parts 74a of the enveloping member 52 in order to minimize drop of heat insulating performance.

Embodiment 8

A vacuum heat insulting material in embodiment 8 of the invention is explained. Same parts as in embodiment 5 are identified with same reference numerals, and the detailed description is omitted.

Figure 17:
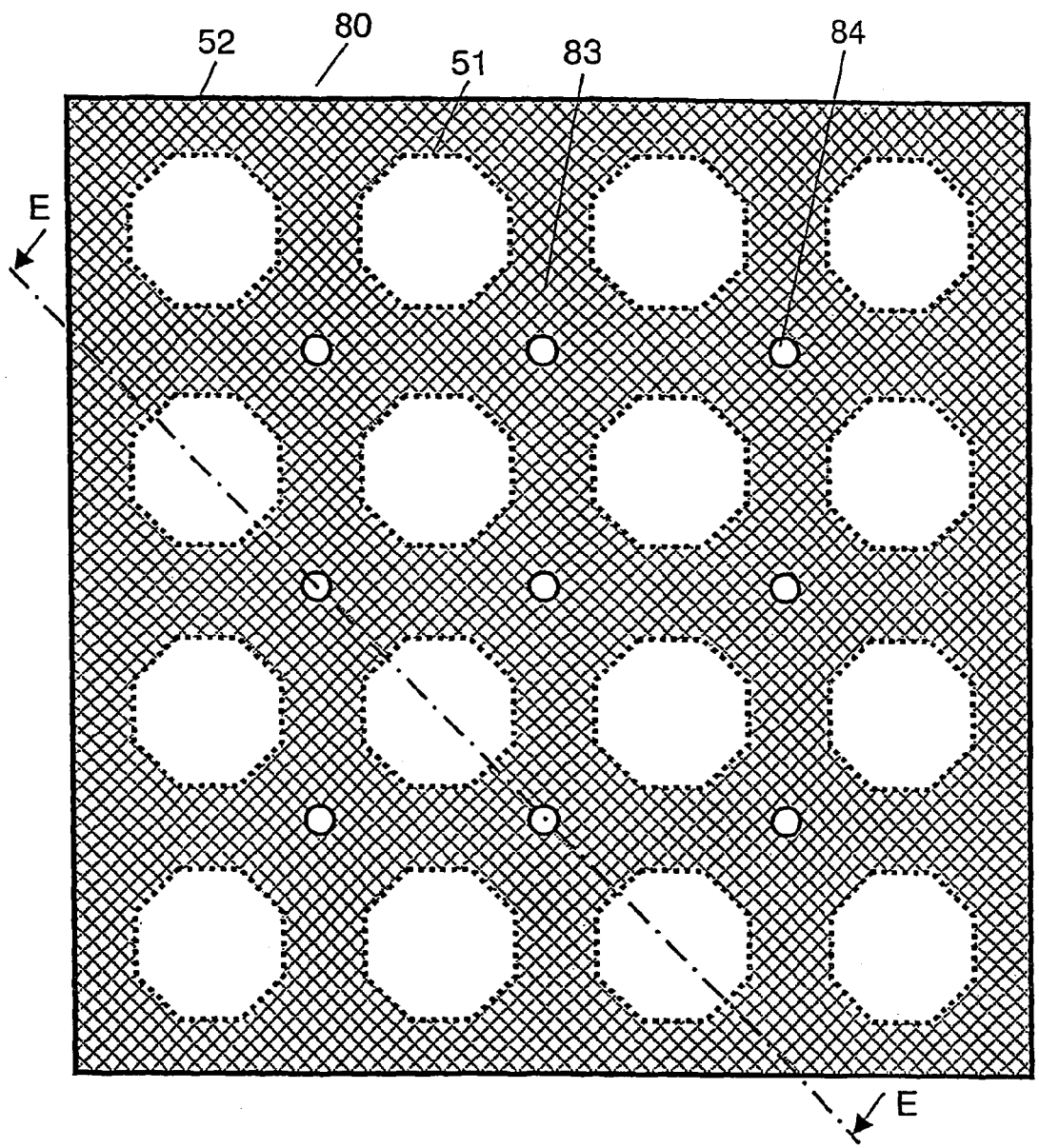
FIG. 17 is a plan view of a vacuum heat insulator in embodiment 8 of the invention.
Figure 18:
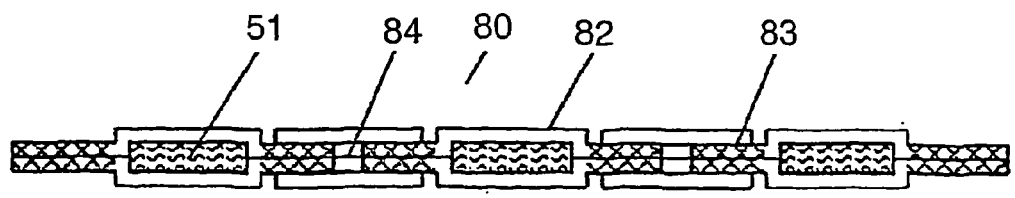
FIG. 18 is a sectional view along line E-E in FIG. 17.

FIG. 17 is a plan view of a vacuum heat insulator in embodiment 8 of the invention, and FIG. 18 is a sectional view along line E-E in FIG. 17.

A vacuum heat insulator 80 consists of 16 core members 51 of thickness of about 5 mm made of glass fiber formed nearly in regular octagonal shape, which are coated with a gas barrier enveloping member 52. The inside of the enveloping member 52 is evacuated to, for example, 10 Pa or less. Between the core member 51 and its adjacent other core member 51, folding lines are formed in four vertical, lateral and oblique directions, parallel to each side of the regular octagon of the core members 51.

The core members 51 are formed in lattice layout, that is, they are disposed vertical and laterally at a specific interval. As a result, each side in vertical, lateral and 'oblique' directions of mutually adjacent core members 51 may be disposed nearly parallel to each other. The specific interval is slightly larger than the sum of the length of one side of the octagonal core member 51 and the size of four times of the thickness of the enveloping member 52 covering the core member 51.

In order that the 16 core members 51 may be located in independent spaces individually, heat seal parts 83 of the enveloping member 52 are disposed around the core members 51, and further circular holes 84 are provided in the enveloping member 52 so that the heat seal parts 83 of specified width may be left over between the adjacent core members 51.

The vacuum heat insulator 80 can be bent in four directions, that is, vertical direction, lateral direction, and 45-degree vertical and lateral oblique directions, by the heat seal parts 83 of the enveloping member 52 positioned between the adjacent core members 51, and it is easier to bend in the vertical and lateral directions than in oblique directions.

Thus, the vacuum heat insulator 80 has the plural octagonal core members 51 coated with the gas barrier enveloping member 52, and the inside of the enveloping member 52 is evacuated. The plural core members 51 are disposed in lattice layout at a specific interval so as to form folding lines in four directions in the position between the adjacent core members. Since the heat seal parts 83 of the enveloping member 52 are provided around the core members 51 so that the plural core members 51 may be located in independent spaces individually, the vacuum heat insulator 80 can be folded in four directions, and hence the limitation of shape of applicable objects is alleviated as compared with the conventional vacuum heat insulator, so that the applications are expanded.

If the degree of vacuum in the space of some core member 51 is lowered, the degree of vacuum in the spaces of other core members 51 is not lowered, and drop of heat insulating performance can be kept to a minimum limit.

Moreover, all of the outer core members 52 positioned on the outer periphery of the vacuum heat insulator 80 and the enveloping members 52 positioned between the adjacent core members 51 are fused by heat, and the width of the heat seal parts 83 is broad, thereby considerably lowering the possibility of drop of degree of vacuum in the spaces of the core members 51 through the heat seal parts 83.

Besides, since the shape of the core members 51 is octagonal, the rate of the occupied area of the core members 51 can be increased for the vacuum heat insulator foldable in four directions, and the heat insulating performance is relatively high. Hence, the balance of flexibility and heat insulating performance can be enhanced.

The vacuum heat insulator 80 has a hole 84 provided in the enveloping member 52 so as to leave the heat seal part 83 of a specific width between the adjacent core members 51. Since the hole 84 is opened in the area of smaller effect of drop of heat insulating performance in the vacuum heat insulator 80, it is usable in various applications such as the case of discharge of air or water from one side to other side of the vacuum heat insulator 80, the location of passing an object (such as pipe and other part) depending on the position, or the location of passing a foamed heat insulator from one side to other side of the vacuum heat insulator, in the process of manufacture, in a composite heat insulator combining the vacuum heat insulator 80 and the foamed heat insulator. For example, when this vacuum heat insulator 80 is incorporated in clothes and used as body warmer, perspiration can be released outside from this hole 84, and the inside of the body warmer is kept fresh and comfortable.

In the vacuum heat insulator 80, four core members 51 are arranged each in vertical and lateral directions, but the layout is not limited to this example alone.

When the vacuum heat insulator 80 is applied, it can be used by cutting in desired size or shape, and when cutting, it is preferred to cut off from the heat seal parts 83 of the enveloping member 52 in order to minimize drop of heat insulating performance.

Embodiment 9

A vacuum heat insulting material in embodiment 9 of the invention is explained. Same parts as in embodiment 5 or 3 are identified with same reference numerals, and the detailed description is omitted.

Figure 19:
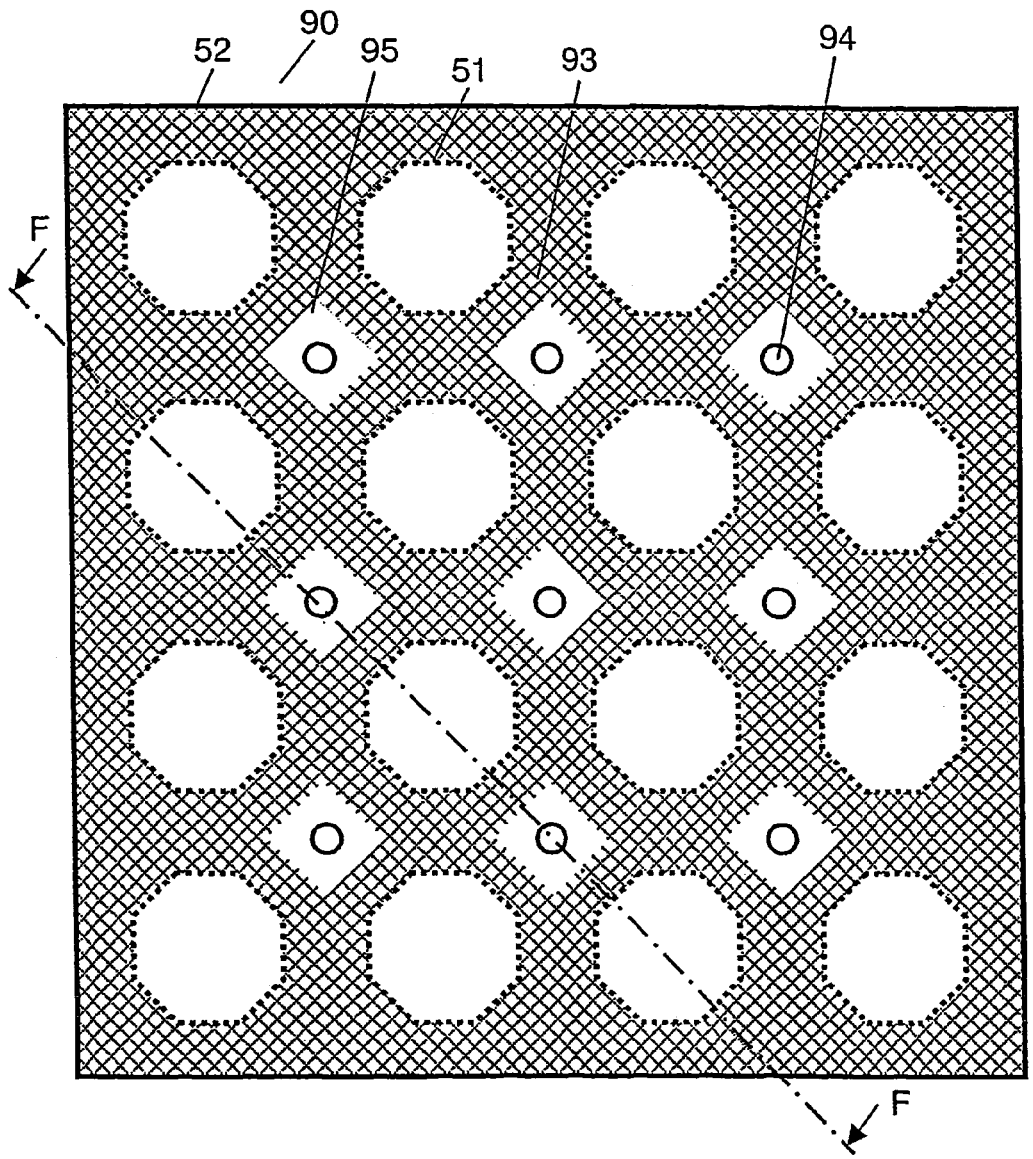
FIG. 19 is a plan view of a vacuum heat insulator in embodiment 9 of the invention.
Figure 20:
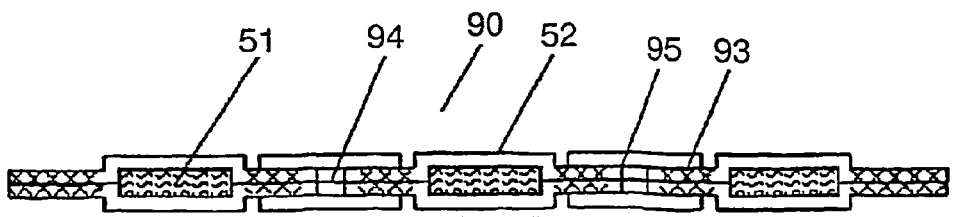
FIG. 20 is a sectional view along line F-F in FIG. 19.

FIG. 19 is a plan view of a vacuum heat insulator in embodiment 9 of the invention, and FIG. 20 is a sectional view along line F-F in FIG. 19.

A vacuum heat insulator 90 consists of 16 core members 51 of thickness of about 5 mm made of glass fiber formed nearly in regular octagonal shape, which are coated with a gas barrier enveloping member 52. The inside of the enveloping member 52 is evacuated to, for example, 10 Pa or less. Between the core member 51 and its adjacent other core member 51, folding lines are formed in four vertical, lateral and oblique directions, parallel to each side of the regular octagon of the core members 51.

The core members 51 are formed in lattice layout, that is, they are disposed vertically and laterally at a specific interval. As a result, each side in vertical, lateral and oblique directions of mutually adjacent core members 51 may be disposed nearly parallel to each other. The specific interval is preferred to be selected slightly larger than the sum of the length of one side of the octagonal core member 51 and the size of four times of the thickness of the enveloping member 52 covering the core member 51.

In order that the 16 core members 51 may be located in independent spaces individually, heat seal parts 93 of the enveloping member 52 are disposed around the core members 51, and further between the adjacent core members 51, and on both sides of the heat seal parts 93, non-seal parts 95 not fused by heat in the enveloping members 52 are provided at the outer peripheral side of the core members 51, and also holes 94 are provided in the non-seal parts 95 of the enveloping member 52 so that the heat seal parts 93 of specified width may be left over between the adjacent core members 51.

Accordingly, the oblique sides of the mutually adjacent core members 51 are disposed almost oppositely parallel to each other by way of the non-seal parts 95 and holes 94.

The vacuum heat insulator 90 can be bent in four directions, that is, vertical direction, lateral direction, and 45-degree vertical and lateral oblique directions, by the enveloping member 52 positioned between the adjacent core members 51, and it is easier to bend in the vertical and lateral directions than in oblique directions.

Thus, the vacuum heat insulator 90 has the plural octagonal core members 51 coated with the gas barrier enveloping member 52, and the inside of the enveloping member 52 is evacuated, and the plural core members 51 are disposed in lattice layout at a specific interval so as to form folding lines in four directions in the position between the adjacent core members, and the heat seal parts 93 of the enveloping member 52 are provided around the core members 51 so that the plural core members 51 may be located in independent spaces individually, and therefore the vacuum heat insulator 90 can be folded in four directions, and the limitation of shape of applicable objects is alleviated as compared with the conventional vacuum heat insulator, so that the applications are expanded.

If the degree of vacuum in the space of some core member 51 is lowered, the degree of vacuum in the spaces of other core members 51 is not lowered, and drop of heat insulating performance can be kept to a minimum limit.

Further between the adjacent core members 51, and on both sides of the heat seal parts 93, non-seal parts 95 not fused by heat in the enveloping members 52 are provided at the outer peripheral side of the core members 51, and therefore it is easy to pattern the heat seal parts 93, and it is easy to reduce the size and simplify the fusion device, and the fusion work is easier.

Besides, since the shape of the core members 51 is octagonal, the rate of the occupied area of the core members 51 can be increased for the vacuum heat insulator foldable in four directions, and the heat insulating performance is relatively high. Hence, the balance of flexibility and heat insulating performance is excellent.

The vacuum heat insulator 90 has a hole 94 provided in the enveloping member 52 so as to leave the heat seal part 93 of a specific width between the adjacent core members 51, and since the hole 94 is opened in the area of smaller effect of drop of heat insulating performance in the vacuum heat insulator 90, it is usable in various applications such as the case of discharge of air or water from one side to other side of the vacuum heat insulator 90, the location of passing an object (such as pipe and other part) depending on the position, or the location of passing a foamed heat insulator from one side to other side of the vacuum heat insulator, in the process of manufacture, in a composite heat insulator combining the vacuum heat insulator 90 and the foamed heat insulator. For example, when this vacuum heat insulator 90 is incorporated in clothes and used as body warmer, perspiration can be released outside from this hole 94, and the inside of the body warmer is kept fresh and comfortable.

In the vacuum heat insulator 90 in embodiment 9, four core members 51 are arranged each in vertical and lateral directions, but the layout is not limited to this example alone.

The heat seal parts 93 of the enveloping member 52 provided around the core members 51 are formed independently for each core member 51, and they may be formed in an octagonal doughnut shape surrounding the core members 51.

The edge of the hole 94 is preferred to be fused by heat in order enhance the sealing performance of the enveloping member 52, and when utilizing the hole 94 for mounting or other purpose, it is preferred to reinforce the edge of the hole 94 so that the enveloping member 52 may not be damaged from the edge of the hole 94.

When the vacuum heat insulator 90 is applied, it can be used by cutting in desired size or shape, and when cutting, it is preferred to cut off from the heat seal parts 93 or non-seal parts 95 of the enveloping member 52 in order to minimize drop of heat insulating performance.

Embodiment 10

A vacuum heat insulting material in embodiment 10 of the invention is explained. Same parts as in embodiment 5 are identified with same reference numerals, and the detailed description is omitted.

Figure 21:
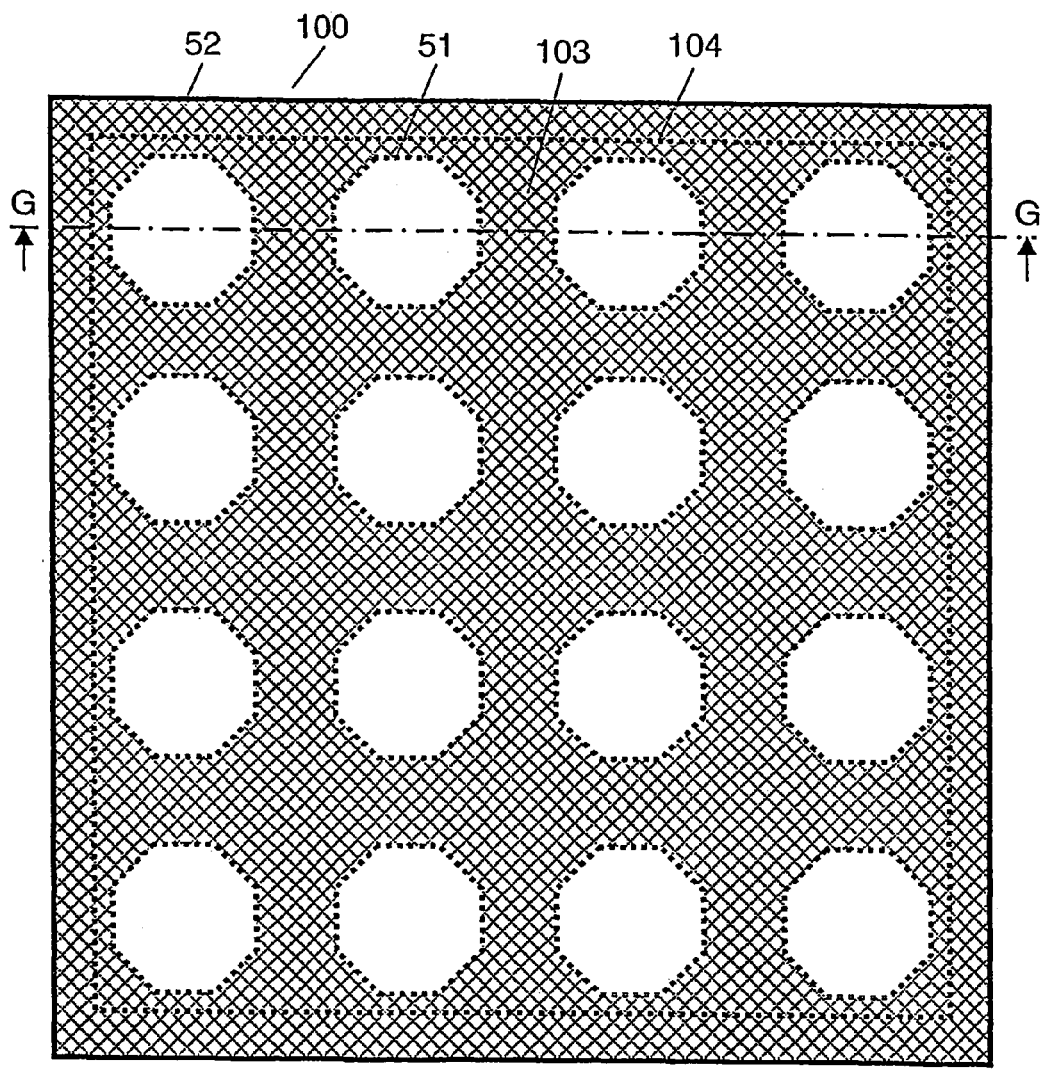
FIG. 21 is a plan view of a vacuum heat insulator in embodiment 10 of the invention.
Figure 22:
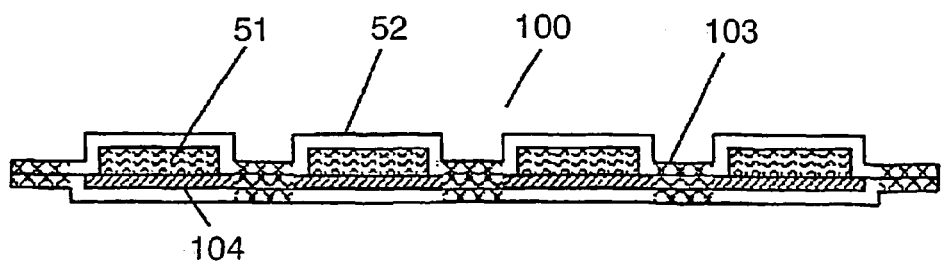
FIG. 22 is a sectional view along line G-G in FIG. 21.

FIG. 21 is a plan view of a vacuum heat insulator in embodiment 10 of the invention, and FIG. 22 is a sectional view along line G-G in FIG. 21.

A vacuum heat insulator 100 consists of 16 core members 51 of thickness of about 5 mm made of glass fiber formed nearly in regular octagonal shape, which are coated with a gas barrier enveloping member 52 in a state being adhered and fixed to one side of a sheet member 104 made of thermoplastic resin. The inside of the enveloping member 52 is evacuated to, for example, 10 Pa or less. Between the core member 51 and its adjacent other core member 51, folding lines are formed in four vertical, lateral and oblique directions, parallel to each side of the octagon of the core members 51.

The core members 51 are formed in lattice layout, that is, they are disposed vertically and laterally at a specific interval. As a result, each side in vertical, lateral and oblique directions of mutually adjacent core members 51 may be disposed nearly parallel to each other. The specific interval is slightly larger than the sum of the length of one side of the octagonal core member 51 and the size of four times of the thickness of the enveloping member 52 covering the core member 51.

In order that the 16 core members 51 may be located in independent spaces individually, heat seal parts 103 of the enveloping member 52 are disposed around the core members 51. In the heat seal parts 103, the enveloping member 52 and sheet member 104 are fused by heat.

The vacuum heat insulator 100 can be bent in four directions, that is, vertical direction, lateral direction, and 45-degree vertical and lateral oblique directions, by the heat seal parts 103 of the enveloping member 52 positioned between the adjacent core members 51, and it is easier to bend in the vertical and lateral directions than in oblique directions.

Thus, the vacuum heat insulator 100 has the plural octagonal core members 51 coated with the gas barrier enveloping member 52, in a state being adhered and fixed to one side of a sheet member 104 made of thermoplastic resin and the inside of the enveloping member 52 is evacuated.

The plural core members 51 are disposed in lattice layout at a specific interval so as to form folding lines in four directions in the position between the adjacent core members. The heat seal parts 103 of the enveloping member 52 are provided around the core members 51 so that the plural core members 51 may be located in independent spaces individually. Therefore the vacuum heat insulator 100 can be folded in four directions. Hence the limitation of shape of applicable objects is smaller as compared with the conventional vacuum heat insulator, and the applications are wide.

The vacuum heat insulator 100 in embodiment 10 has plural core members 51 adhered and fixed at specified positions on one side of the sheet member 104. The sheet member 104 adhering and fixing the plural core members 51 is inserted into the enveloping member 52 formed in a bag opened at one end, and it can be manufactured by sealing the opening of the enveloping member 52 at reduced pressure. It is easy to fix the plural core members 51, and is easy to manufacture the vacuum heat insulator 100.

Besides, since the sheet member 104 is made of a thermoplastic resin, the sheet member 104 can be fused by heat together with the enveloping member 52 when the portion between the core members 51 in the enveloping member 52 is fused by heat. When the sheet member 104 is used in order to fix the plural core members 51 at specified positions, they can be positioned in the individually independent spaces of the plural core members 51.

If the degree of vacuum in the space of some core member 51 is lowered, the degree of vacuum in the spaces of other core members 51 is not lowered, and drop of heat insulating performance can be kept to a minimum limit.

Since all of the outer core members 52 positioned on the outer periphery of the vacuum heat insulator 100 and the enveloping members 52 positioned between the adjacent core members 51 are fused by heat, the width of the heat seal parts 103 is broad, thereby considerably lowering the possibility of drop of degree of vacuum in the spaces of the core members 51 through the heat seal parts 103.

Besides, since the shape of the core members 51 is octagonal, the rate of the occupied area of the core members 51 can be increased for the vacuum heat insulator foldable in four directions, and the heat insulating performance is relatively high. Hence, the balance of flexibility and heat insulating performance is excellent.

In the vacuum heat insulator 100, four core members 51 are arranged each in vertical and lateral directions, but the layout is not limited to this example alone.

The core members 51 may be adhered and fixed so as to be opposite to the both sides of the sheet member 114.

When the vacuum heat insulator 100 is applied, it can be used by cutting in desired size or shape, and when cutting, it is preferred to cut off from the heat seal parts 103 of the enveloping member 52 in order to minimize drop of heat insulating performance.

Embodiment 11

A vacuum heat insulting material in embodiment 11 of the invention is explained. Same parts as in embodiment 5 are identified with same reference numerals, and the detailed description is omitted.

Figure 23:
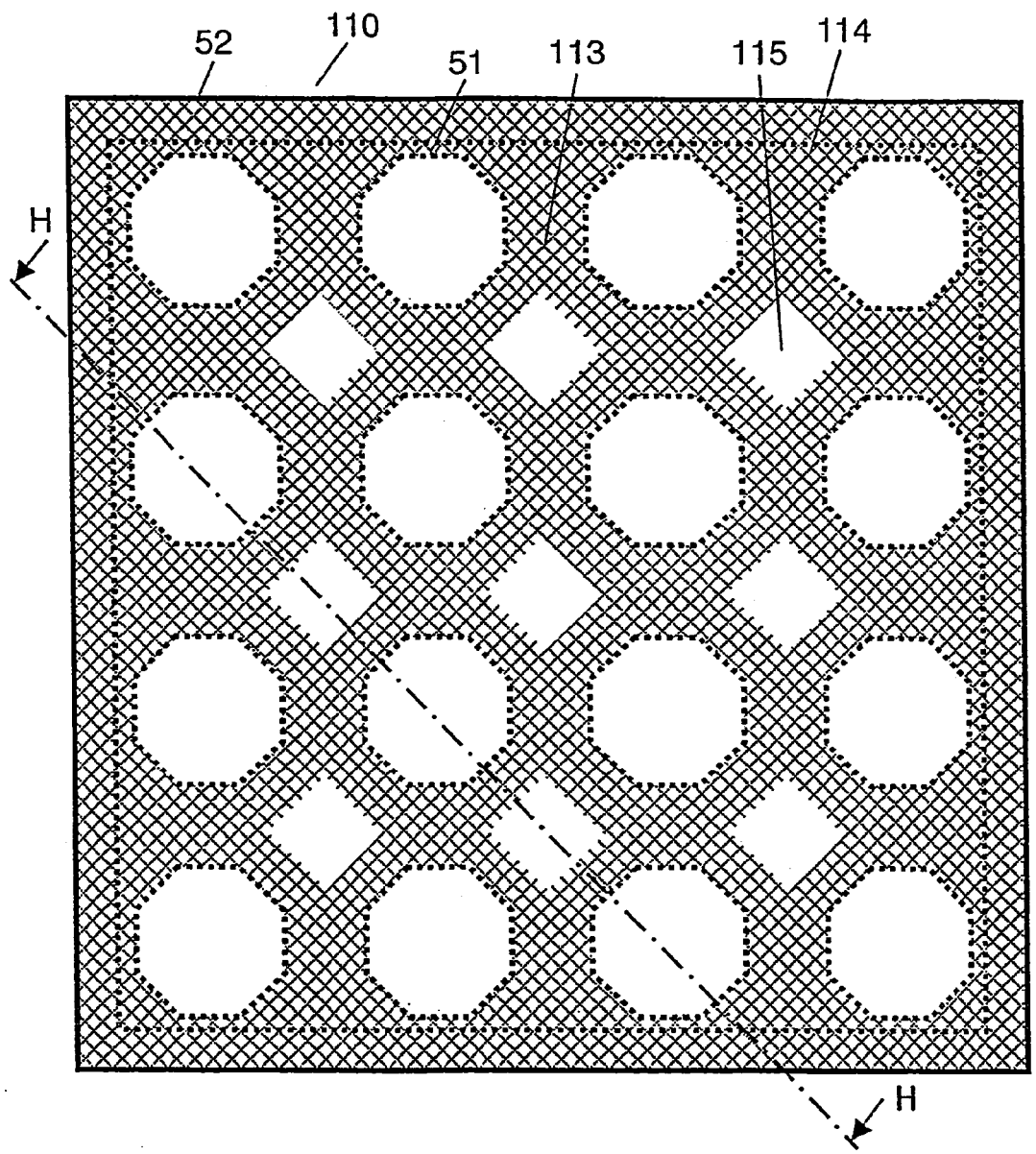
FIG. 23 is a plan view of a vacuum heat insulator in embodiment 11 of the invention.
Figure 24:
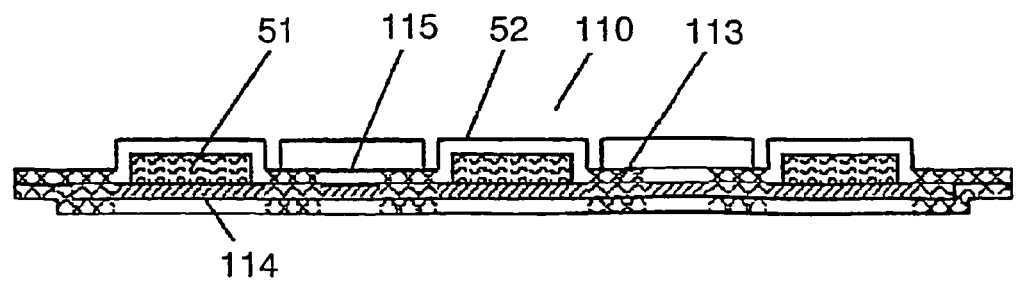
FIG. 24 is a sectional view along line H-H in FIG. 23.

FIG. 23 is a plan view of a vacuum heat insulator in embodiment 11 of the invention, and FIG. 24 is a sectional view along line H-H in FIG. 23.

A vacuum heat insulator 110 consists of 16 core members 51 of thickness of about 5 mm made of glass fiber formed nearly in regular octagonal shape, which are coated with a gas barrier enveloping member 52 in a state being adhered and fixed to one side of a sheet member 114 made of thermoplastic resin. The inside of the enveloping member 52 is evacuated to, for example, 10 Pa or less. Between the core member 51 and its adjacent other core member 51, folding lines are formed in four vertical, lateral and oblique directions, parallel to each side of the octagon of the core members 51.

The core members 51 are formed in lattice layout, that is, they are disposed vertically and laterally at a specific interval. The specific interval is slightly larger than the sum of the length of one side of the octagonal core member 51 and the size of four times of the thickness of the enveloping member 52 covering the core member 51.

In order that the 16 core members 51 may be located in independent spaces individually, heat seal parts 113 of the enveloping member 52 are disposed around the core members 51. Between the adjacent core members 51, and on both sides of the heat seal parts 113, non-seal parts 115 not fused by heat in the enveloping members 52 are provided at the outer peripheral side of the core members 51.

The vacuum heat insulator 110 can be bent in four directions, that is, vertical direction, lateral direction, and 45-degree vertical and lateral oblique directions, by the enveloping members 52 positioned between the adjacent core members 51. It is easier to bend in the vertical and lateral directions than in oblique directions.

Thus, the vacuum heat insulator 110 has the plural octagonal core members 51 coated with the gas barrier enveloping member 52, in a state being adhered and fixed to one side of a sheet member 114 made of thermoplastic resin, and the inside of the enveloping member 52 is evacuated. The plural core members 51 are disposed in lattice layout at a specific interval so as to form folding lines in four directions in the position between the adjacent core members. The heat seal parts 113 of the enveloping member 52 are provided around the core members 51 so that the plural core members 51 may be located in independent spaces individually, and hence the vacuum heat insulator 110 can be folded in four directions. Therefore the limitation of shape of applicable objects is smaller as compared with the conventional vacuum heat insulator, and the applications are wide.

The vacuum heat insulator 110 has plural core members 51 adhered and fixed at specified positions on one side of the sheet member 114, and the sheet member 114 adhering and fixing the plural core members 51 is inserted into the enveloping member 52 formed in a bag opened at one end, and it can be manufactured by sealing the opening of the enveloping member 52 at reduced pressure. It is easy to fix the plural core members 51, and is easy to manufacture the vacuum heat insulator 110.

Besides, since the sheet member 114 is made of a thermoplastic resin, the sheet member 114 can be fused by heat together with the enveloping member 52 when the portion between the core members 51 in the enveloping member 52 is fused by heat. When the sheet member 114 is used in order to fix the plural core members 51 at specified positions, they can be positioned in the individually independent spaces of the plural core members 51.

If the degree of vacuum in the space of some core member 51 is lowered, the degree of vacuum in the spaces of other core members 51 is not lowered, and drop of heat insulating performance can be kept to a minimum limit.

Further between the adjacent core members 51, and on both sides of the heat seal parts 113, non-seal parts 115 not fused by heat in the enveloping members 52 are provided at the outer peripheral side of the core members 51. Therefore it is easy to pattern the heat seal parts 113, and it is easy to reduce the size and simplify the fusion device, and the fusion work is easier.

Besides, since the shape of the core members 51 is octagonal, the rate of the occupied area of the core members 51 can be increased for the vacuum heat insulator foldable in four directions, and the heat insulating performance is relatively high. Hence, the balance of flexibility and heat insulating performance is excellent.

In the vacuum heat insulator 110, four core members 51 are arranged each in vertical and lateral directions, but the layout is not limited to this example alone.

The heat seal parts 113 of the enveloping member 52 provided around the core members 51 are formed independently for each core member 51, and they may be formed in an octagonal doughnut shape surrounding the core members 51.

The core members 51' may be adhered and fixed so as to be opposite to the both sides of the sheet member 114.

When the vacuum heat insulator 110 is applied, it can be used by cutting in desired size or shape, and when cutting, it is preferred to cut off from the heat seal parts 113 or non-seal parts 115 of the enveloping member 52 in order to minimize drop of heat insulating performance.

Embodiment 12

A vacuum heat insulting material in embodiment 12 of the invention is explained. Same parts as in embodiment 5 are identified with same reference numerals, and the detailed description is omitted.

Figure 25:
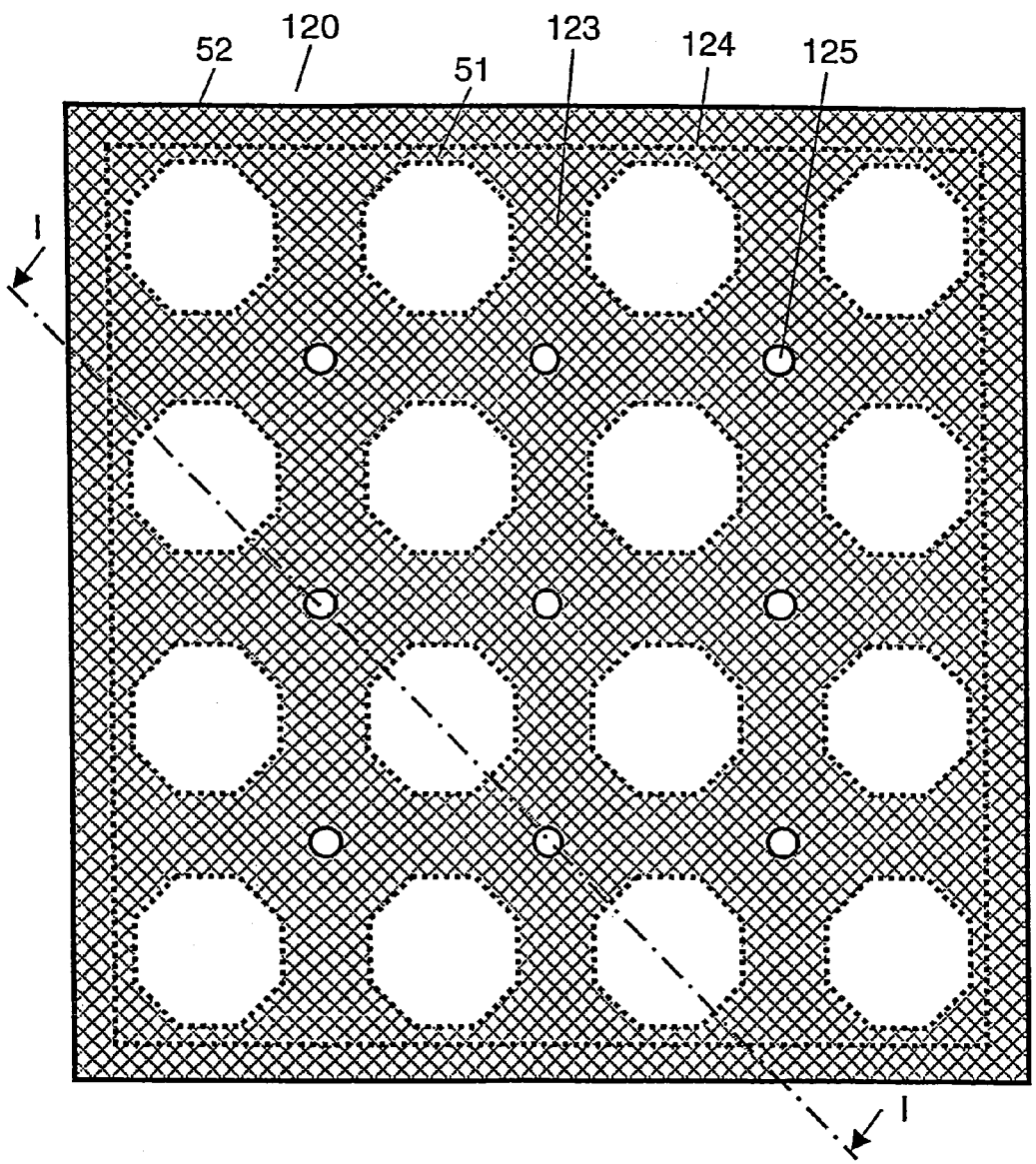
FIG. 25 is a plan view of a vacuum heat insulator in embodiment 12 of the invention.
Figure 26:
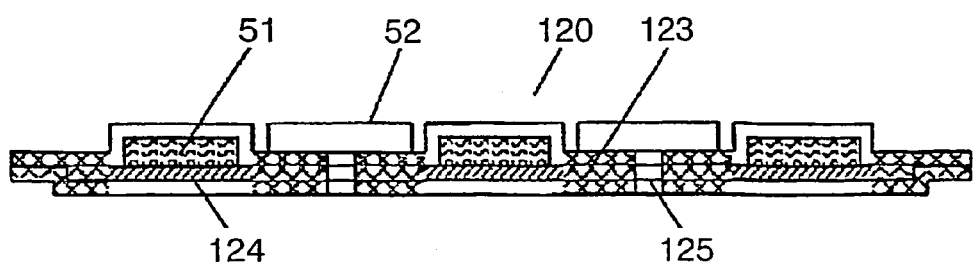
FIG. 26 is a sectional view along line I-I in FIG. 25.

FIG. 25 is a plan view of a vacuum heat insulator in embodiment 12 of the invention, and FIG. 26 is a sectional view along line I-I in FIG. 25.

A vacuum heat insulator 120 consists of 16 core members 51 of thickness of about 5 mm made of glass fiber formed nearly in regular octagonal shape, which are coated with a gas barrier enveloping member 52 in a state being adhered and fixed to one side of a sheet member 124 made of thermoplastic resin. The inside of the enveloping member 52 is evacuated.

Between the core member 51 and its adjacent other core member 51, folding lines are formed in four vertical, lateral and oblique directions, parallel to each side of the octagon of the core members 51.

The core members 51 are formed in lattice layout, that is, they are disposed vertically and laterally at a specific interval. The specific interval is slightly larger than the sum of the length of one side of the octagonal core member 51 and the size of four times of the thickness of the enveloping member 52 covering the core member 51. As mentioned above, the specific interval is in a range of several mm to tens of mm.

In order that the 16 core members 51 may be located in independent spaces individually, heat seal parts 123 of the enveloping member 52 are disposed around the core members 51. Further, a circular hole 125 is formed in the enveloping member 52 so as to leave the heat seal parts 123 in a specified width between the core member 51 and its adjacent other core-member 51.

The vacuum heat insulator 120 has the heat seal parts 123 between the core member 51 and its adjacent other core member 51. In this configuration, the enveloping member 52 can be bent in four directions, that is, vertical direction, lateral direction, and 45-degree vertical and lateral oblique directions. It is easier to bend in the vertical and lateral directions than in oblique directions.

Thus, the vacuum heat insulator 120 has the plural octagonal core members 51 coated with the gas barrier enveloping member 52, in a state being adhered and fixed to one side of a sheet member 124 made of thermoplastic resin, and the inside of the enveloping member 52 is evacuated. The plural core members 51 are disposed in lattice layout at a specific interval so as to form folding lines in four directions in the position between the adjacent core members. The heat seal parts 123 of the enveloping member 52 are provided around the core members 51 so that the plural core members 51 may be located in independent spaces individually, and hence the vacuum heat insulator 120 can be folded in four directions. Therefore the limitation of shape of applicable objects is smaller as compared with the conventional vacuum heat insulator, and the applications are wide.

The vacuum heat insulator 120 has plural core members 51 adhered and fixed at specified positions on one side of the sheet member 124, and the sheet member 124 adhering and fixing the plural core members 51 is inserted into the enveloping member 52 formed in a bag opened at one end, and it can be manufactured by sealing the opening of the enveloping member 52 at reduced pressure, and it is easy to fix the plural core members 51 at specified positions, and is easy to manufacture the vacuum heat insulator 120.

Besides, since the sheet member 124 is made of a thermoplastic resin, the sheet member 124 can be fused by heat together with the enveloping member 52 when the portion between the core members 51 in the enveloping member 52 is fused by heat, and hence when the sheet member 124 is used in order to fix the plural core members 51 at specified positions, they can be positioned in the individually independent spaces of the plural core members 51.

If the degree of vacuum in the space of some core member 51 is lowered, the degree of vacuum in the spaces of other core members 51 is not lowered, and drop of heat insulating performance can be kept to a minimum limit.

In embodiment 12, since all of the enveloping member 52 positioned on the outer periphery of the vacuum heat insulator 120 and the enveloping member 52 in the portion positioned between the adjacent core members 51 are fused by heat, the width of the heat seal parts 123 is broad, thereby considerably lowering the possibility of drop of degree of vacuum in the spaces of the core members 51 through the heat seal parts 123.

Besides, since the shape of the core members 51 is octagonal, the rate of the occupied area of the core members 51 can be increased for the vacuum heat insulator foldable in four directions, and the heat insulating performance is relatively high. Hence, the balance of flexibility and heat insulating performance is excellent.

The vacuum heat insulator 120 in embodiment 12 has a hole 125 provided in the enveloping member 52 so as to leave the heat seal part 123 of a specific width between the adjacent core members 51. Since the hole 125 is opened in the area of smaller effect of drop of heat insulating performance in the vacuum heat insulator 120, it is usable in various applications such as the case of discharge of air or water from one side to other side of the vacuum heat insulator 120. It is also suited to the location of passing an object (such as pipe and other part) depending on the position. It is also applicable to the location of passing a foamed heat insulator from one side to other side of the vacuum heat insulator, in the process of manufacture, in a composite heat insulator combining the vacuum heat insulator 120 and the foamed heat insulator. For example, when this vacuum heat insulator 120 is incorporated in clothes and used as body warmer, perspiration can be released outside from this hole 125, and the inside of the body warmer is kept fresh and comfortable.

In the vacuum heat insulator 120, four core members 51 are arranged each in vertical and lateral directions, but the layout is not limited to this example alone.

When the vacuum heat insulator 120 is applied, it can be used by cutting in desired size or shape, and when cutting, it is preferred to cut off from the heat seal parts 123 of the enveloping member 52 in order to minimize drop of heat insulating performance.

Embodiment 13

A vacuum heat insulting material in embodiment 13 of the invention is explained. Same parts as in embodiment 5 are identified with same reference numerals, and the detailed description is omitted.

Figure 27:
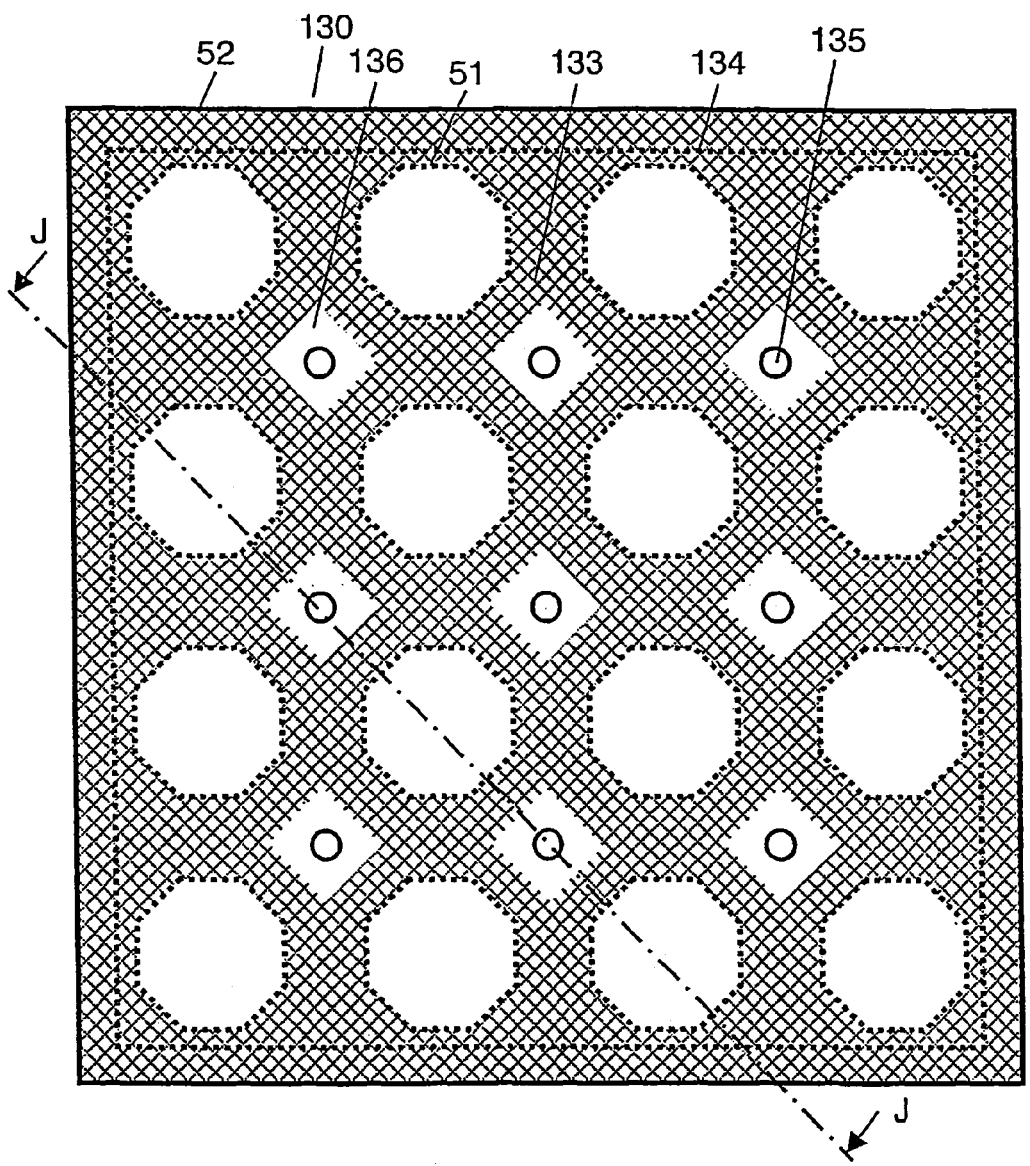
FIG. 27 is a plan view of a vacuum heat insulator in embodiment 13 of the invention.
Figure 28:
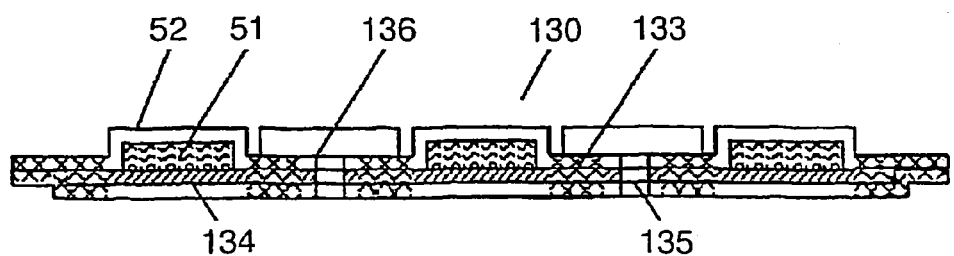
FIG. 28 is a sectional view along line J-J in FIG. 27.

FIG. 27 is a plan view of a vacuum heat insulator in embodiment 13 of the invention, and FIG. 28 is a sectional view along line J-J in FIG. 27.

A vacuum heat insulator 130 consists of 16 core members 51 of thickness of about 5 mm made of glass fiber formed nearly in regular octagonal shape, which are coated with a gas barrier enveloping member 52 in a state being adhered and fixed to one side of a sheet member 124 made of thermoplastic resin. The inside of the enveloping member 52 is evacuated.

Between the core member 51 and its adjacent other core member 51, folding lines are formed in four vertical, lateral and oblique directions, parallel to each side of the octagon of the core members 51.

The core members 51 are formed in lattice layout, that is, they are disposed vertically and laterally at a specific interval. The specific interval is slightly larger than the sum of the length of one side of the octagonal core member 51 and the size of four times of the thickness of the enveloping member 52 covering the core member 51.

In order that the 16 core members 51 may be located in independent spaces individually, heat-seal parts 133 of the enveloping member 52 are disposed around the core members 51, and further between the adjacent core members 51, and on both sides of the heat seal parts 133, non-seal parts 136 not fused by heat in the enveloping members 52 are provided at the outer peripheral side of the core members 51, and also holes 135 are provided in the non-seal parts 136 of the enveloping member 52 so that the heat seal parts 133 of specified width may be left over between the adjacent core members 51.

The vacuum heat insulator 130 can be bent in four directions, that is, vertical direction, lateral direction, and 45-degree vertical and lateral oblique directions in the portion of the enveloping member 52 positioned between the adjacent core members 51. It is easier to bend in the vertical and lateral directions than in oblique directions.

Thus, the vacuum heat insulator 130 has the plural octagonal core members 51 coated with the gas barrier enveloping member 52, in a state being adhered and fixed to one side of a sheet member 134 made of thermoplastic resin, and the inside of the enveloping member 52 is evacuated. The plural core members 51 are disposed in lattice layout at a specific interval so as to form folding lines in four directions in the position between the adjacent core members. The heat seal parts 133 of the enveloping member 52 are provided around the core members 51 so that the plural core members 51 may be located in independent spaces individually. Hence the vacuum heat insulator 130 can be folded in four directions. Therefore the limitation of shape of applicable objects is smaller as compared with the conventional vacuum heat insulator, and the applications are wide.

The vacuum heat insulator 130 has plural core members 51 adhered and fixed at specified positions on one side of the sheet member 134, and the sheet member 134 adhering and fixing the plural core members 51 is inserted into the enveloping member 52 formed in a bag opened at one end, and it can be manufactured by sealing the opening of the enveloping member 52 at reduced pressure, and it is easy to fix the plural core members 51 at specified positions, and is easy to manufacture the vacuum heat insulator 130.

Besides, since the sheet member 134 is made of a thermoplastic resin, the sheet member134 can be fused by heat together with the enveloping member 52 when the portion between the core members 51 in the enveloping member 52 is fused by heat, and hence when the sheet member 134 is used in order to fix the plural core members 51 at specified positions, they can be positioned in the individually independent spaces of the plural core members 51.

If the degree of vacuum in the space of some core member 51 is lowered, the degree of vacuum in the spaces of other core members 51 is not lowered, and drop of heat insulating performance can be kept to a minimum limit.

Further between the adjacent core members 51, and on both sides of the heat seal parts 133, non-seal parts 136 not fused by heat in the enveloping members 52 are provided at the outer peripheral side of the core members 51, and therefore it is easy to pattern the heat seal parts 133, and it is easy to reduce the size and simplify the fusion device, and the fusion work is easier.

Besides, since the shape of the core members 51 is octagonal, the rate of the occupied area of the core members 51 can be increased for the vacuum heat insulator foldable in four directions, and the heat insulating performance is relatively high. Hence, the balance of flexibility and heat insulating performance is excellent.

The vacuum heat insulator 130 has a hole 135 provided in the enveloping member 52 so as to leave the heat seal part 133 of a specific width between the adjacent core members 51. Since the hole 135 is opened in the area of smaller effect of drop of heat insulating performance in the vacuum heat insulator 130, it is usable in various applications such as the case of discharge of air or water from one side to other side of the vacuum heat insulator 130, the location of passing an object (such as pipe and other part) depending on the position, or the location of passing a foamed heat insulator from one side to other side of the vacuum heat insulator, in the process of manufacture, in a composite heat insulator combining the vacuum heat insulator 130 and the foamed heat insulator. For example, when this vacuum heat insulator 130 is incorporated in clothes and used as body warmer, perspiration can be released outside from this hole 135, and the inside of the body warmer is kept fresh and comfortable.

In the vacuum heat insulator 130, four core members 51 are arranged each in vertical and lateral directions, but the layout is not limited to this example alone.

The heat seal parts 133 of the enveloping member 52 provided around the core members 51 are formed independently for each core member 51, and they may be formed in an octagonal doughnut shape surrounding the core members 51.

The edge of the hole 135 is preferred to be fused by heat in order to enhance the sealing performance of the enveloping member 52, and when utilizing the hole 135 for mounting or other purpose, it is preferred to reinforce the edge of the hole 135 so that the enveloping member 52 may not be damaged from the edge of the hole 135.

When the vacuum heat insulator 130 is applied, it can be used by cutting in desired size or shape, and when cutting it is preferred to cut off from the heat seal parts 133 or the non-seal parts 136 of the enveloping member 52 in order to minimize drop of heat insulating performance.

Embodiment 14

A vacuum heat insulting material in embodiment 14 of the invention is explained. Same parts as in embodiment 5 are identified with same reference numerals, and the detailed description is omitted.

Figure 29:
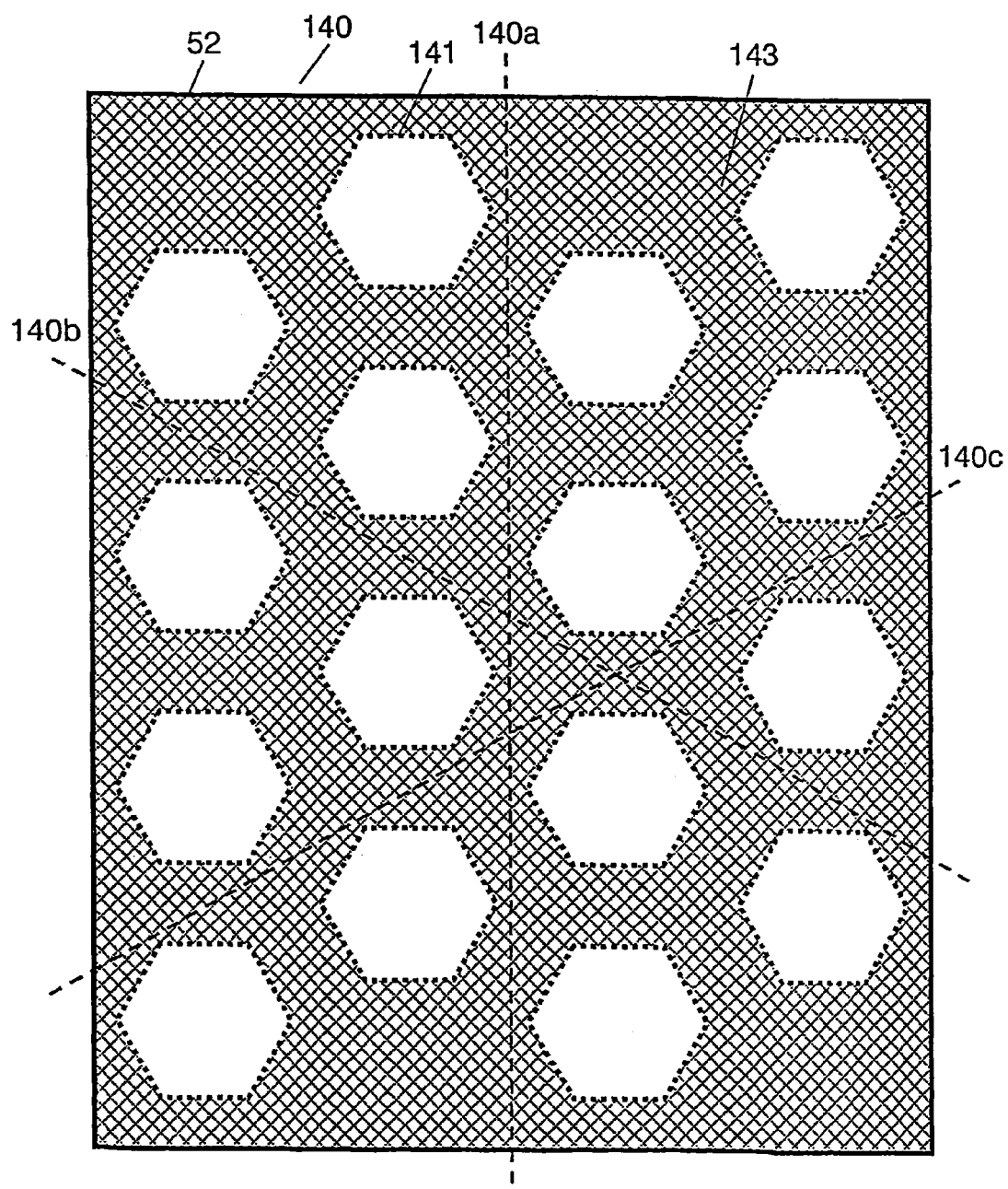
FIG. 29 is a plan view of a vacuum heat insulator in embodiment 14 of the invention.

FIG. 29 is a plan view of a vacuum heat insulator in embodiment 14 of the invention.

A vacuum heat insulator 140 consists of 16 core members 141 of thickness of about 5 mm made of glass fiber formed nearly in regular hexagonal shape, which are coated With a gas barrier enveloping member 52. The inside of the enveloping member 52 is evacuated to, for example, 10 Pa or less.

Two sides out of six sides of one core member 141 are arranged to be parallel to each other in the vertical direction in the front view of FIG. 29, that is, in the direction from top to bottom on the sheet of paper. When all core members 141 are arranged in this manner, in the portion positioned between the adjacent core members 141, folding lines 140a, 140b, and 140c can be formed in three directions, that is, the vertical and 60-degree oblique directions right and left to the vertical direction, perpendicularly to each side of the hexagon of the core members 141. That is, the core members 141 are disposed in zigzag layout (honeycomb), and the sides of the core member 141 and its adjacent other core member 141 are nearly parallel to each other from top to bottom (in the same direction as the folding line 140a) in the front view of the sheet of paper, and opposite to each other across a specific interval.

The specific interval may be selected slightly larger than the sum of about 0.87 times of length of one side of the hexagonal core member 141 and four times of thickness of the enveloping member 52 covering the core member 141.

In order that the 16 core members 141 may be located in independent spaces individually, heat seal parts 143 of the enveloping member 52 of hexagonal doughnut shape are disposed around the core members 141.

The vacuum heat insulator 140 can be bent in three directions, that is, vertical direction, and 60-degree oblique directions right and left to the vertical direction, from the heat seal parts 143 of the enveloping member 52 positioned between the adjacent core members 141.

Thus, the vacuum heat insulator 140 in embodiment 14 has the plural hexagonal core members 141 coated with the gas barrier enveloping member 52, and the inside of the enveloping member 52 is evacuated. The plural core members 141 are disposed in zigzag layout at a specific interval so as to form folding lines 140a, 140b, and 140c in three directions in the position between the adjacent core members 141. The heat seal parts 143 of the enveloping member 52 in hexagonal doughnut shape are provided around the core members 141 so that the plural core members 141 may be located in independent spaces individually. Hence the vacuum heat insulator 140 can be folded in three directions, and the limitation of shape of applicable objects is smaller as compared with the conventional vacuum heat insulator, and the applications are wide.

If the degree of vacuum in the space of a specific core member 141 is lowered, the degree of vacuum in the spaces of other core members 141 is not lowered, and drop of heat insulating performance can be kept to a minimum limit.

In embodiment 14, since all of the enveloping member 52 positioned on the outer periphery of the vacuum heat insulator 140 and the enveloping member 52 in the portion positioned between the adjacent core members 141 are fused by heat, the width of the heat seal parts 143 is broad, thereby considerably lowering the possibility of drop of degree of vacuum in the spaces of the core members 141 through the heat seal parts 143.

The heat seal parts 143 are formed by repeating hexagonal doughnut patterns or can be easily patterned in honeycomb profile, and therefore it is easy to reduce the size and simplify the fusion device, and the fusion work is easier.

The plural hexagonal core members 141 may be also coated with the gas barrier enveloping member 52 in a state being adhered and fixed to one side of a sheet member made of thermoplastic resin.

When the vacuum heat insulator 140 is applied, it can be used by cutting in desired size or shape, and when cutting, it is preferred to cut off from the heat seal parts 143 of the enveloping member 52 in order to minimize drop of heat insulating performance.

Embodiment 15

A vacuum heat insulting material in embodiment 15 of the invention is explained. Same parts as in embodiment 5 are identified with same reference numerals, and the detailed description is omitted.

Figure 30:
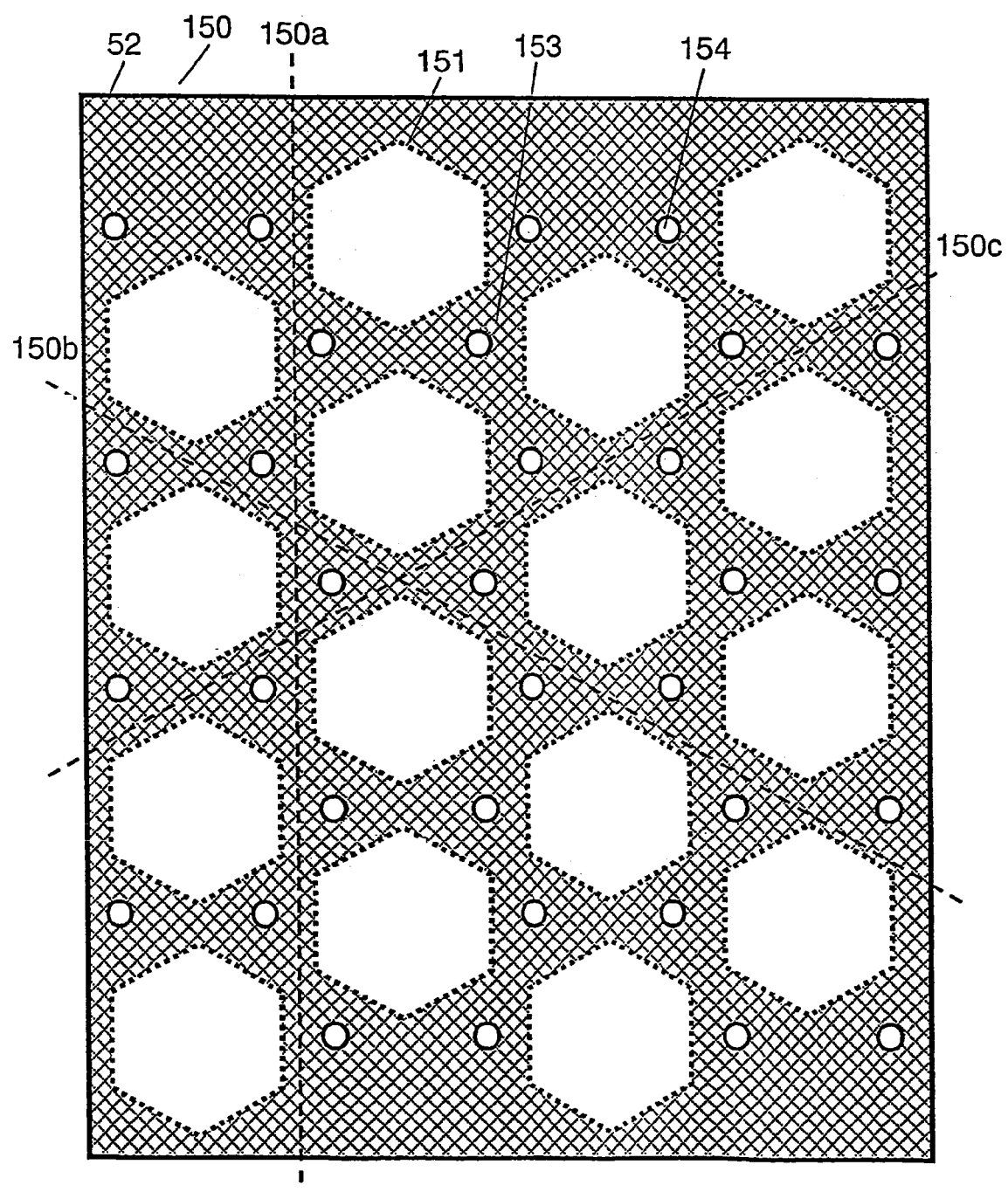
FIG. 30 is a plan view of a vacuum heat insulator in embodiment 15 of the invention.

FIG. 30 is a plan view of a vacuum heat insulator in embodiment 15 of the invention.

A vacuum heat insulator 150 consists of 16 core members 151 of thickness of about 5 mm made of glass fiber formed nearly in regular hexagonal shape, which are coated with a gas barrier enveloping member 52. The inside of the enveloping member 52 is evacuated.

The 16 core members 151 are disposed so that two sides may be nearly parallel to each other in the vertical direction in the front view of FIG. 30. Between the adjacent core members 151, folding lines 150a, 150b, and 150c can be formed in three directions, that is, the vertical and 60-degree oblique directions right and left to the vertical direction, parallel to each side of the hexagon of the core members 151. That is, the core members 151 are disposed in zigzag layout, and the corners of the adjacent core members 151 are disposed at a specific interval so as to be opposite to each other in the shortest distance.

In order that the 16 cote members 151 may be located in independent spaces individually, heat seal parts 153 of the enveloping member 52 are disposed around the core members 151. Further, a circular hole 154 is formed in the heat seal part 153 of the enveloping member 52 positioned between the three adjacent core members 151 so as to leave the heat seal part 153 of specified width between the core member 151 and its adjacent other core member 151.

The vacuum heat insulator 150 can be bent in three directions, that is, vertical direction, and 60-degree oblique directions right and left to the vertical direction, from the heat seal parts 153 of the enveloping member 52 positioned between the adjacent core members 151.

Thus, the vacuum heat insulator 150 has the plural hexagonal core members 151 coated with the gas barrier enveloping member 52, and the inside of the enveloping member 52 is evacuated, and the plural core members 151 are disposed in zigzag layout at a specific interval so as to form folding lines 150a, 150b, and 150c in three directions in the position between the adjacent core members 151. The heat seal parts 153 of the enveloping member 52 are provided around the core members 151 so that the plural core members 151 may be located in independent spaces individually. Hence the vacuum heat insulator 150 can be folded in three directions, and the limitation of shape of applicable objects is smaller as compared with the conventional vacuum heat insulator, and the applications are wide.

If the degree of vacuum in the space of a specific core member 151 is lowered, the degree of vacuum in the spaces of other core members 151 is not lowered, and drop of heat insulating performance can be kept to a minimum limit.

Since all of the enveloping member 52 positioned on the outer periphery of the vacuum heat insulator 150 and the enveloping member 52 in the portion positioned between the adjacent core members 151 are fused by heat, the width of the heat seal parts 153 is broad, thereby considerably lowering the possibility of drop of degree of vacuum in the spaces of the core members 151 through the heat seal parts 153.

In embodiment 15, the 16 core members 151 are disposed so that the two sides may be parallel in the lateral direction in the front view of FIG. 30, that is, in the direction from left (right) to right (left) on the sheet of paper. The core member 151 and the adjacent other core member 151 are arranged in zigzag layout so as to form folding lines 150a, 150b, and 150c in three directions, that is, vertical direction and 60-degree oblique directions right and left to the vertical direction, parallel to each side of the hexagon of the core members 151. As a result, in order that the corners of the core member 151 and other adjacent core member 151 may be opposite to each other, they are disposed at a specific interval. In such configuration, as compared with the configuration of embodiment 14 in which they are disposed so that two sides may be parallel to each other in the lateral direction, and they are disposed at a specific interval in zigzag layout so that the sides may be opposite to the adjacent core member so as to form folding lines in three or more directions in the vertical direction and 60-degree oblique directions right and left to the vertical direction, perpendicularly to each side of the hexagon of the core members, the interval of the core members 151 is narrower and the rate of occupied area of the core members 151 is wider, so that the heat insulating performance is relatively high.

The vacuum heat insulator 150 has the hole 154 provided in the enveloping member 52 so as to leave the heat seal part 153 of a specified width between the adjacent core members 151, and since the hole 154 is opened in the area of smaller effect of drop of heat insulating performance in the vacuum heat insulator 150, it is usable in various applications such as the case of discharge of air or water from one side to other side of the vacuum heat insulator 150, the location of passing an object (such as pipe and other part) depending on the position, or the location of passing a foamed heat insulator from one side to other side of the vacuum heat insulator, in the process of manufacture, in a composite heat insulator combining the vacuum heat insulator 150 and the foamed heat insulator. For example, when this vacuum heat insulator 150 is incorporated in clothes and used as body warmer, perspiration can be released outside from this hole 154, and the inside of the body warmer is kept fresh and comfortable.

In embodiment 15, as compared with embodiment 8 in which plural octagonal core members are disposed in lattice layout and holes are formed in the heat seal parts of the enveloping member 52 positioned between four adjacent core members, the number of holes 154 can be increased.

The plural hexagonal core members 151 may be also coated with the gas barrier enveloping member 52 in a state being adhered and fixed to one side of a sheet member made of thermoplastic resin.

When the vacuum heat insulator 150 is applied, it can be used by cutting in desired size or shape, and when cutting, it is preferred to cut off from the heat seal parts 153 of the enveloping member 52 in order to minimize drop of heat insulating performance.

Embodiment 16

A vacuum heat insulting material in embodiment 16 of the invention is explained. Same parts as in embodiment 5 are identified with same reference numerals, and the detailed description is omitted.

Figure 31:
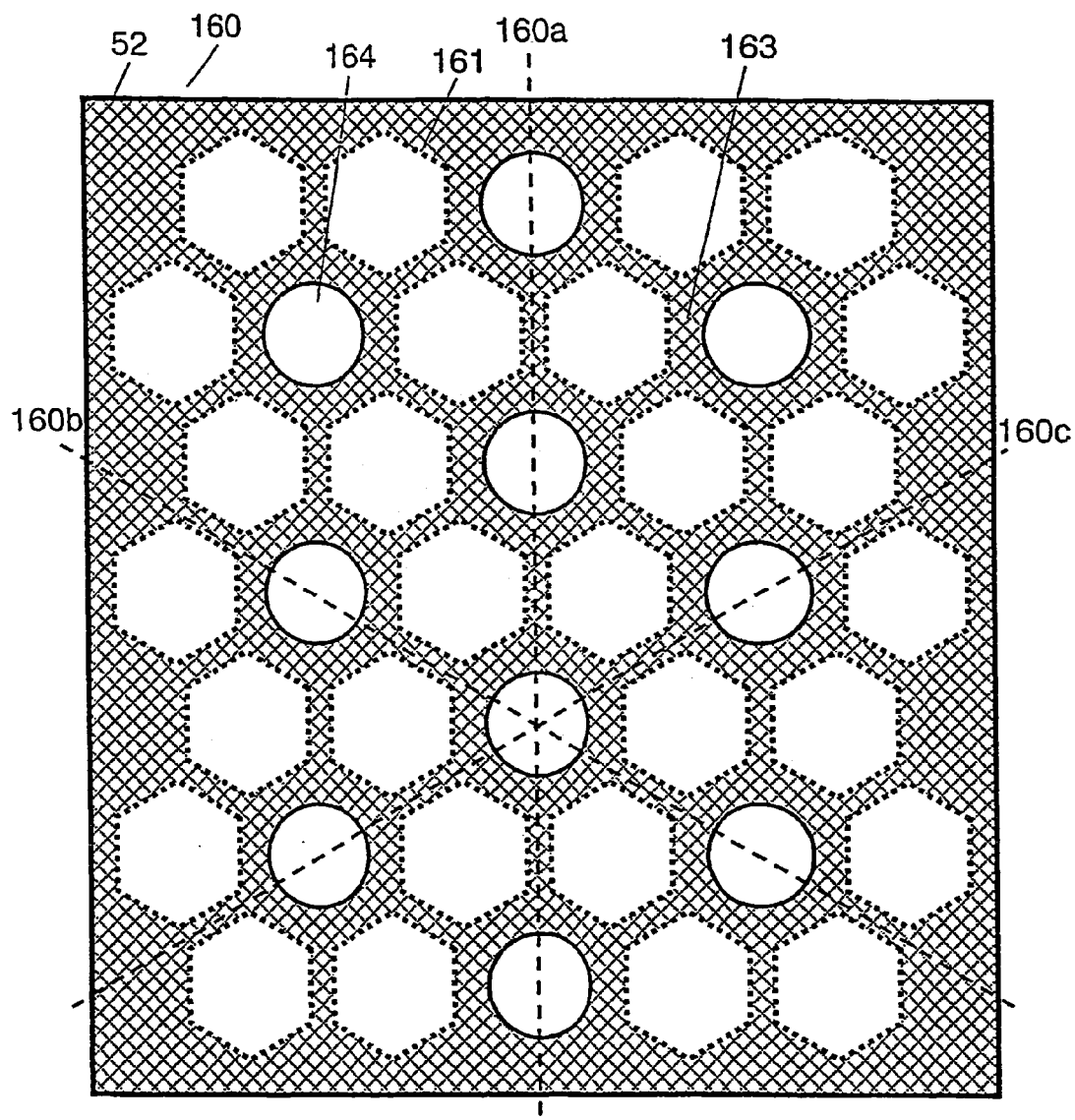
FIG. 31 is a plan view of a vacuum heat insulator in embodiment 16 of the invention.

FIG. 31 is a plan view of a vacuum heat insulator in embodiment 16 of the invention.

A vacuum heat insulator 160 consists of 28 core members 161 of thickness of about 5 mm made of glass fiber formed nearly in regular hexagonal shape, which are coated with a gas barrier enveloping member 52. The inside of the enveloping member 52 is evacuated.

The 28 core members 161 are disposed so that two sides may be nearly parallel to each other in the lateral direction in the front view of FIG. 31, that is, from the left (right) to the right (left) on the sheet of paper. In other words, in a direction orthogonal to a folding line 160a, the sides of the mutually adjacent core members 161 are nearly parallel to each other oppositely. Between the core member 161 and its adjacent other core member 161, folding lines 160a, 160b, and 160c can be formed in three directions, that is, the vertical and 60-degree oblique directions right and left to the vertical direction, parallel to each side of the hexagon of the core members 161. Six hexagonal core members 161 are arranged as a set in a ring so that the sides of the mutually adjacent core members 161 may be opposite to each other at a specific interval.

The six core members 161 arranged in a ring are formed as a set, and the individual sets are arranged in a zigzag layout at a specific interval. In order that the 28 core members 161 may be located in independent spaces individually heat seal parts 163 of the enveloping member 52 are disposed around the core members 161. Further, a circular hole 164 is formed in the heat seal part 163 of the enveloping member 52 positioned between the six adjacent core members 161 formed in a ring in each set, so as to leave the heat seal part 163 of specified width between the adjacent core members 161.

The vacuum heat insulator 160 can be bent in three directions, that is, vertical direction, and 60-degree oblique directions right and left to the vertical direction, from the heat seal parts 163 of the enveloping member 52 positioned between the adjacent core members.

Thus, the vacuum heat insulator 160 has the plural hexagonal core members 161 coated with the gas barrier enveloping member 52, and the inside of the enveloping member 52 is evacuated, and the plural core members 161 consist of each set of sic core members formed in a ring (a set of two core members 161 arranged laterally at a specific interval so that the sides may be opposite to each other) disposed in zigzag layout at a specific interval so as to form folding lines 160a, 160b, and 160c in three directions in the position between the adjacent core members 161, and the heat seal parts 163 of the enveloping member 52 are provided around the core members 161 so that the plural core members 161 may be located in independent spaces individually, and hence the vacuum heat insulator 160 can be folded in three directions, and the limitation of shape of applicable objects is smaller as compared with the conventional vacuum heat insulator, and the applications are wide.

If the degree of vacuum in the space of a specific core member 161 is lowered, the degree of vacuum in the spaces of other core members 161 is not lowered, and drop of heat insulating performance can be kept to a minimum limit.

Since all of the enveloping member 52 positioned on the outer periphery of the vacuum heat insulator 160 and the enveloping member 52 in the portion positioned between the adjacent core members 161 are fused by heat, the width of the heat seal parts 163 is broad, thereby considerably lowering the possibility of drop of degree of vacuum in the spaces of the core members 161 through the heat seal parts 163.

The plural core members 161 are disposed so that the two sides may be parallel in the vertical direction, and six hexagonal core members 161 are arranged in a ring to form a set so that the sides of the adjacent core members 161 may opposite to each other at a specific interval, so as to form folding lines 160a, 160b, and 160c in three directions, that is, vertical direction and 60-degree oblique directions right and left to the vertical direction, parallel to each side of the hexagon of the core members 161, and these sets are disposed in zigzag layout at a specific interval, and the rate of occupied area of the core members 161 is increased, and the heat insulating performance is relatively high.

The vacuum heat insulator 160 in embodiment 16 has the hole 164 provided in the enveloping member 52 so as to leave the heat seal part 163 of a specified width between the adjacent core members 161, and since the hole 164 is opened in the area of smaller effect of drop of heat insulating performance in the vacuum heat insulator 160, it is usable in various applications such as the case of discharge of air or water from one side to other side of the vacuum heat insulator 160, the location of passing an object (such as pipe and other part) depending on the position, or the location of passing a foamed heat insulator from one side to other side of the vacuum heat insulator, in the process of manufacture, in a composite heat insulator combining the vacuum heat insulator 160 and the foamed heat insulator. For example, when this vacuum heat insulator 160 is incorporated in clothes and used as body warmer, perspiration can be released outside from this hole 164, and the inside of the body warmer is kept fresh and comfortable.

The size of the hole 164 can be increased more than in embodiment 15, to a size of circle inscribing with the hexagon of the core member 161, but contrary to the case of embodiment 15, possible positions for opening the holes 164 are decreased.

The plural hexagonal core members 161 may be also coated with the gas barrier enveloping member 52 in a state being adhered and fixed to one side of a sheet member made of thermoplastic resin.

When the vacuum heat insulator 160 is applied, it can be used by cutting in desired size or shape, and when cutting, it is preferred to cut off from the heat seal parts 163 of the enveloping member 52 in order to minimize drop of heat insulating performance.

Embodiment 17

A vacuum heat insulting material in embodiment 17 of the invention is explained. Same parts as in embodiment 5 are identified with same reference numerals, and the detailed description is omitted.

Figure 32:
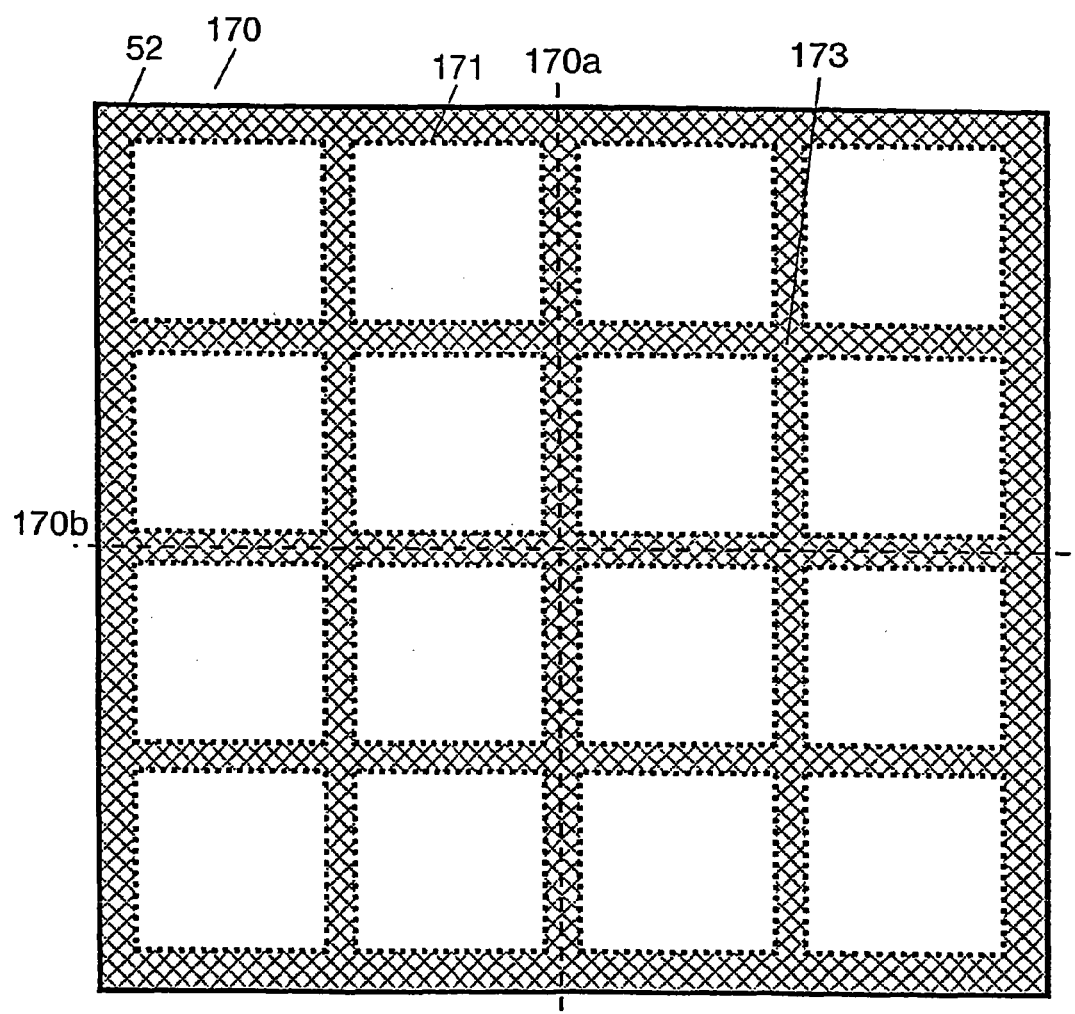
FIG. 32 is a plan view of a vacuum heat insulator in embodiment 17 of the invention.

FIG. 32 is a plan view of a vacuum heat insulator in embodiment 17 of the Invention.

A vacuum heat insulator 170 consists of 16 core members 171 of thickness of about 5 mm made of glass fiber formed nearly in square shape, which are coated with a gas barrier enveloping member 52. The inside of the enveloping member 52 is evacuated.

The 16 core members 171 are disposed so that folding lines 170a and 170b may be formed in two vertical and lateral directions, parallel to each side of the square of the core members 171, between the core member 171 and its adjacent other core member 171.

The core members 171 are disposed in lattice layout, at a specific spacing in vertical and lateral directions.

In order that the 16 core members 171 may be located in independent spaces individually, heat seal parts 173 of the enveloping member 52 are disposed around the core members 171.

Thus, the vacuum heat insulator 170 has the plural square core members 171 coated with the gas barrier enveloping member 52, and the inside of the enveloping member 52 is evacuated, and the plural core members 171 are disposed in lattice layout at a specific interval so as to form folding lines 170a, 170b in two directions in the position between the adjacent core members 171. The heat seal parts 173 of the enveloping member 52 are provided around the core members 171 so that the plural core members 171 may be located in independent spaces individually. Hence the vacuum heat insulator 170 can be folded in two directions, and the limitation of shape of applicable objects is smaller as compared with the conventional vacuum heat insulator, and the applications are wide.

If the degree of vacuum in the space of some core member 171 is lowered, the degree of vacuum in the spaces of other core members 171 is not lowered, and drop of heat insulating performance can be kept to a minimum limit.

The pattern of the heat seal part 173 is composed of plural vertical lines of specified width at specified interval, plural lateral lines of specified width as specified interval, and an outer frame, and therefore the fusion device can be reduced in size and simplified, and the fusion work is easy.

Since all of the enveloping member 52 positioned on the outer periphery of the vacuum heat insulator 170 and the enveloping member 52 in the portion positioned between the adjacent core members 171 are fused by heat, the width of the heat seal parts 173 is broad, thereby considerably lowering the possibility of drop of degree of vacuum in the spaces of the core members 171 through the heat seal parts 173.

Since the shape of the core members 171 is nearly square (rectangular), for the vacuum heat insulator foldable in two directions, the rate of occupied area of the core members 171 is high, and the heat insulating performance is relatively high. Hence, the balance of flexibility and heat insulating performance is excellent.

The vacuum heat insulator 170 in embodiment 17 has four core members 171 arranged in vertical and lateral directions, but the layout is not limited to this example alone.

The plural hexagonal core members 171 may be also coated with the gas barrier enveloping member 52 in a state being adhered and fixed to one side of a sheet member made of thermoplastic resin.

When the vacuum heat insulator 170 is applied, it can be used by cutting in desired size or shape, and when cutting, it is preferred to cut off from the heat seal parts 173 of the enveloping member 52 in order to minimize drop of heat insulating performance.

Embodiment 18

A vacuum heat insulting material in embodiment 18 of the invention is explained. Same parts as in embodiment 5 are identified with same reference numerals, and the detailed description is omitted.

Figure 33:
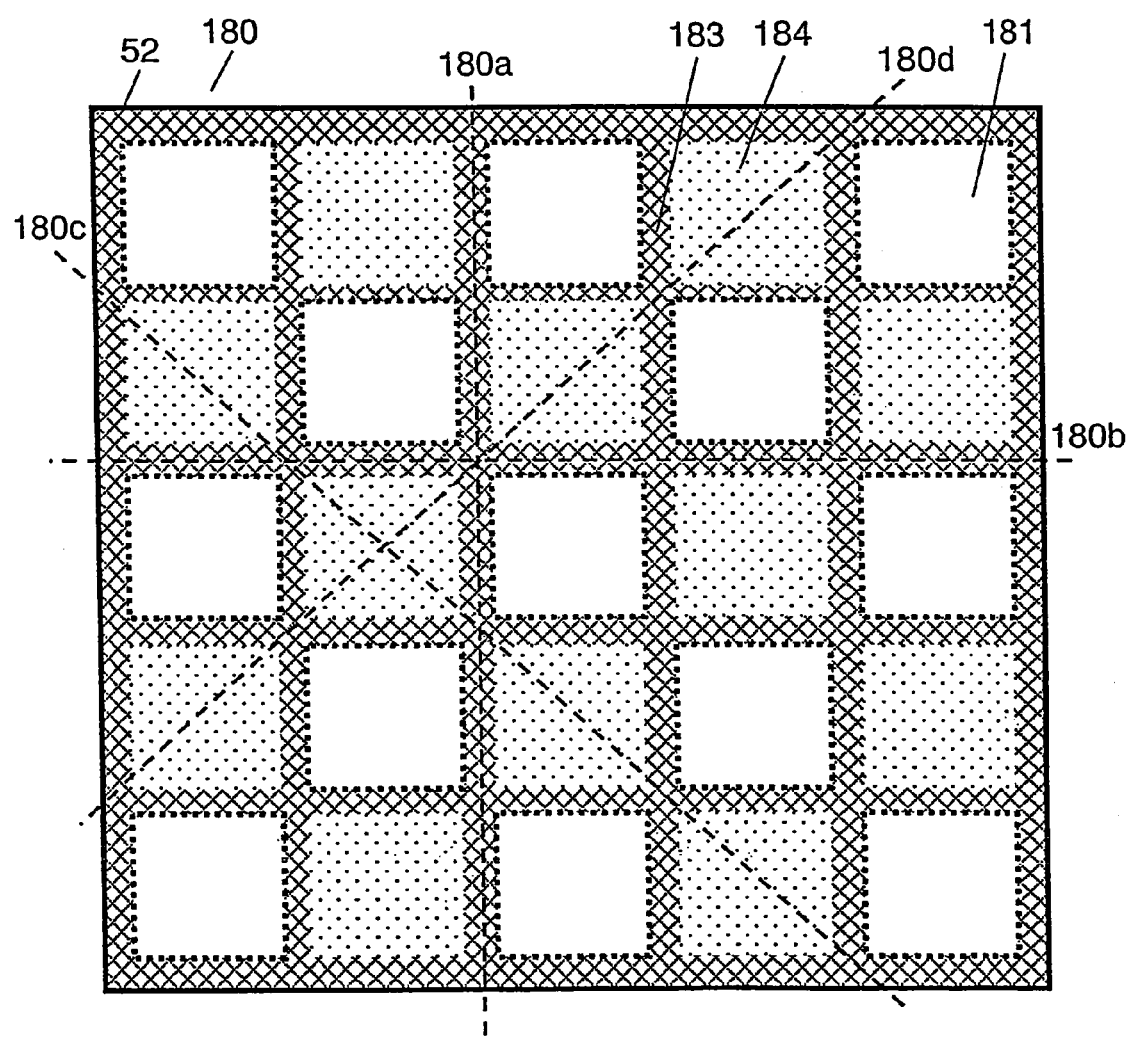
FIG. 33 is a plan view of a vacuum heat insulator in embodiment 18 of the invention.

FIG. 33 is a plan view of a vacuum heat insulator in embodiment 18 of the invention.

A vacuum heat insulator 180 consists of 13 core members 181 of thickness of about 5 mm made of glass fiber formed nearly in square shape, which are coated with a gas barrier enveloping member 52. The inside of the enveloping member 52 is evacuated.

The 13 core members 181 are formed in zigzag layout at a specific interval so that core members 181 adjacent to each other in oblique 45-degree direction may be opposite to each corner so as to form folding lines 180a, 180b, 180c, and 180d in four vertical, lateral and oblique directions, in the portion positioned between the adjacent core members 181.

In order that the 13 core members 181 may be located in independent spaces individually, heat seal parts 183 of the enveloping member 52 are disposed around the core members 181, between the adjacent core members 181, and non-seal parts 184 not fusing the enveloping member 52 by heat are disposed on the outer periphery of the core members 181 on both sides of the heat seal parts 183.

The vacuum heat insulator 80 can be bent in four directions, that is, vertical direction, lateral direction, and 45-degree vertical and lateral oblique directions, by the heat seal parts 183 of the enveloping member 52 positioned between the adjacent core members 181 and it is easier to bend in oblique directions than in the vertical and lateral directions.

Thus, the vacuum heat insulator 180 has the plural square core members 181 coated with the gas barrier enveloping member 52, and the inside of the enveloping member 52 is evacuated. The plural core members 181 are disposed in zigzag layout at a specific interval so as to form folding lines 180*a*, 180*b*, 180*c*, and 180*d* in four directions in the position between the adjacent core members 181, and since the heat seal parts of the film are provided around the core members 181 so that the plural core members 181 may be located in independent spaces individually, the vacuum heat insulator 180 can be folded in four directions, and hence the limitation of shape of applicable objects is alleviated as compared with the conventional vacuum heat insulator, so that the applications are wide.

If the degree of vacuum in the space of some core member 181 is lowered, the degree of vacuum in the spaces of other core members 181 is not lowered, and drop of heat insulating performance can be kept to a minimum limit.

Among four adjacent core members 181, and on both sides of the heat seal parts 183, non-seal parts 184 of the enveloping member 52 not fused by heat are disposed at the outer periphery of the core members 181, and the pattern of the heat seal part 183 is composed of plural vertical lines of specified width at specified interval, plural lateral lines of specified width at specified interval, and an outer frame, as same as embodiment 17, and therefore the fusion device can be reduce d in size and simplified, and the fusion work is easy.

The vacuum heat insulator 180, as compared with the vacuum heat insulator 170 in embodiment 17, is half in the rate of occupied area of the core members 181, but the number of directions capable of forming the folding lines 180*a*, 180*b*, 180*c*, and 180*d* is four directions, double the two directions in the vacuum heat insulator 170 in embodiment 17.

By design change, meanwhile, holes may be formed in the non-seal parts 184 surrounded by four core members in embodiment 18. In such a case, these holes are provided in the enveloping member 52 so as to leave heat seal parts 183 of specified width among four adjacent core members 181, so that effects of drop of heat insulating performance in the vacuum heat insulator 180 are small.

When holes are formed in the non-seal parts 184 surrounded by the four core members 181 in the vacuum heat insulating member 180, it is usable in various applications such as the case of discharge of air or water from one side to other side of the vacuum heat insulator 180, the location of passing an object (such as pipe and other part) depending on the position, or the location of passing a foamed heat insulator from one side to other side of the vacuum heat insulator, in the process of manufacture, in a composite heat insulator combining the vacuum heat insulator 180 and the foamed heat insulator. For example, when this vacuum heat insulator 180 is incorporated in clothes and used as body warmer, perspiration can be released outside from this hole, and the inside of the body warmer is kept fresh and comfortable.

The vacuum heat insulator 180 in embodiment 18 has 13 core members 181 arranged in zigzag layout, but the layout is not limited to this example alone.

The plural square core members 181 may be also coated with the gas barrier enveloping member 52 in a state being adhered and fixed to one side of a sheet member made of thermoplastic resin.

When the vacuum heat insulator 180 is applied, it can be used by cutting in desired size or shape, and when cutting, it is preferred to cut off from the heat seal parts 183 or non-seal parts 184 of the enveloping member 52 in order to minimize drop of heat insulating performance.

Embodiment 19

A vacuum heat insulting material in embodiment 19 of the invention is explained. Same parts as in embodiment 5 are identified with same reference numerals, and the detailed description is omitted.

Figure 34:
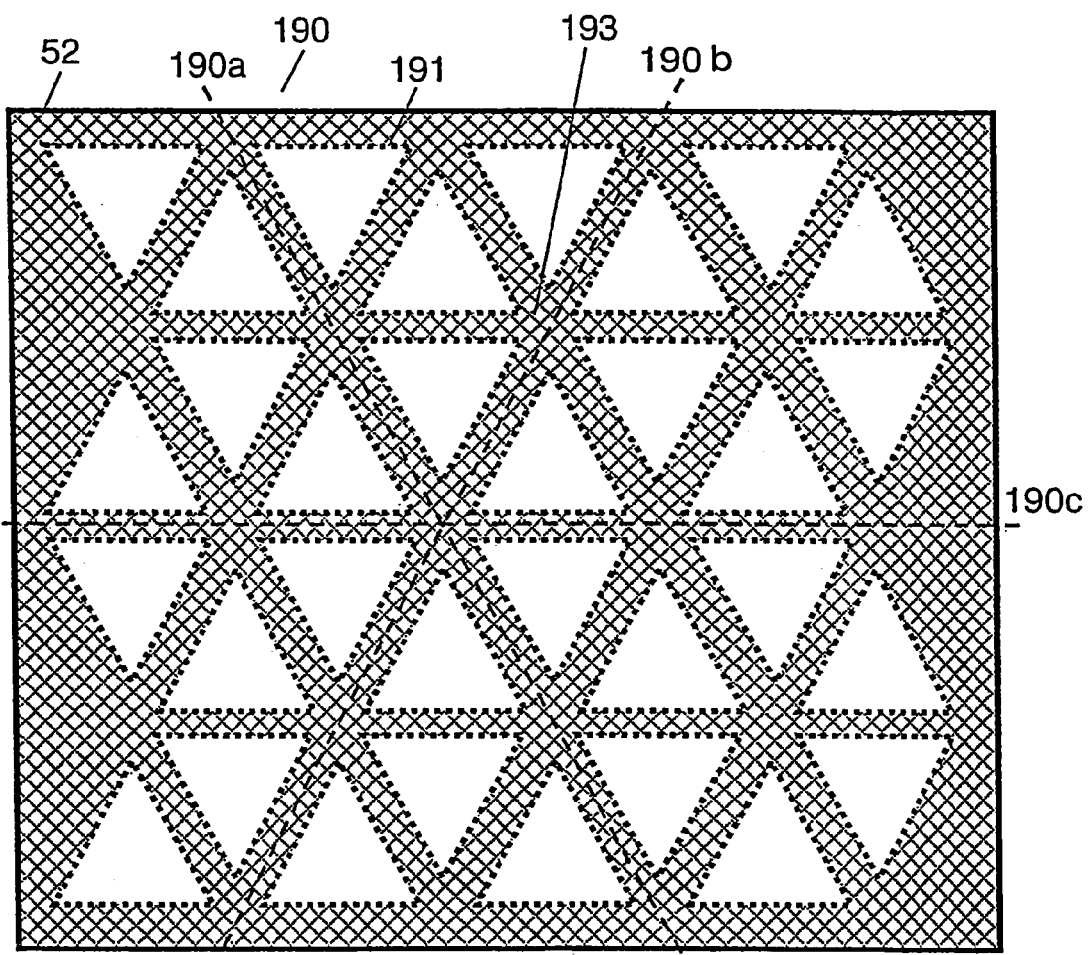
FIG. 34 is a plan view of a vacuum heat insulator in embodiment 19 of the invention.

FIG. 34 is a plan view of a vacuum heat insulator in embodiment 19 of the invention.

A vacuum heat insulator 190 consists of 32 core members 191 of thickness of about 5 mm made of glass fiber formed nearly in regular triangular shape, which are coated with a gas barrier enveloping member 52. The inside of the enveloping member 52 is evacuated.

The 32 core members 191 are formed so as to form folding lines 190*a*, 190*b*, and 19*c* in three lateral (0-degree direction) and oblique directions of about 60 degrees and about 120 degrees to the lateral direction, parallel to each side of the triangle of the core members, between the adjacent core members 191.

That is, the core members 191 are disposed in zigzag layout, and arranged at a specific interval so that the sides of the mutually adjacent core members 191 may be opposite to each other.

In order that the 32 core members 191 may be located in independent spaces individually, heat seal parts 193 of the enveloping member 52 are disposed around the core members 191.

Thus, the vacuum heat insulator 190 has the plural triangular core members 191 coated with the gas barrier enveloping member 52, and the inside of the enveloping member 52 is evacuated. The plural core members 191 are disposed in zigzag layout at a specific interval so as to form folding lines 190*a*, 190*b*, and 190*c* in three directions in the position between the adjacent core members 191. These plural core members 191 are disposed symmetrically to the axis of the folding line 190*c*. Moreover, heat seal parts 193 of the enveloping member 52 are provided around the core members 191 so that the plural core members 191 may be located in independent spaces individually. Hence, the vacuum heat insulator 190 can be folded in three directions, and the limitation of shape of applicable objects is alleviated as compared with the conventional vacuum heat insulator, so that the applications are wide.

If the degree of vacuum in the space of a specific core member 191 is lowered, the degree of vacuum in the spaces of other core members 191 is not lowered, and drop of heat insulating performance can be kept to a minimum limit.

Since all of the enveloping member 52 positioned on the outer periphery of the vacuum heat insulator 190 and the enveloping member 52 in the portion positioned between the adjacent core members 191 are fused by heat, the width of the heat seal parts 193 is broad, thereby considerably lowering the possibility of drop of degree of vacuum in the spaces of the core members 191 through the heat seal parts 193.

The heat seal parts 193 positioned between the adjacent core members 191, excluding the outer periphery of the vacuum heat insulator 190 are simple in pattern composed of plural lateral lines of specified width at specified interval, plural oblique lines of about 60 degrees of specified width at specified interval, and plural oblique lines of about 120 degrees of specified width at specified interval, and therefore the fusion device can be reduced in size and simplified, and the fusion work is easy.

The vacuum heat insulator 190 is relatively larger in the rate of occupied area of the core members 191.

The vacuum heat insulator 190 in embodiment 19 has 32 core members 171 arranged in zigzag layout, but the layout is not limited to this example alone.

The plural triangular core members may be also coated with the gas barrier enveloping member 52 in a state being adhered and fixed to one side of a sheet member made of thermoplastic resin.

When the vacuum heat insulator 190 is applied, it can be used by cutting in desired size or shape, and when cutting, it is preferred to cut off from the heat seal parts 193 of the enveloping member 52 in order to minimize drop of heat insulating performance.

Embodiment 20

A vacuum heat insulating material in embodiment 20 of the invention is explained. Same parts as in embodiment 5 are identified with same reference numerals, and the detailed description is omitted.

Figure 35:
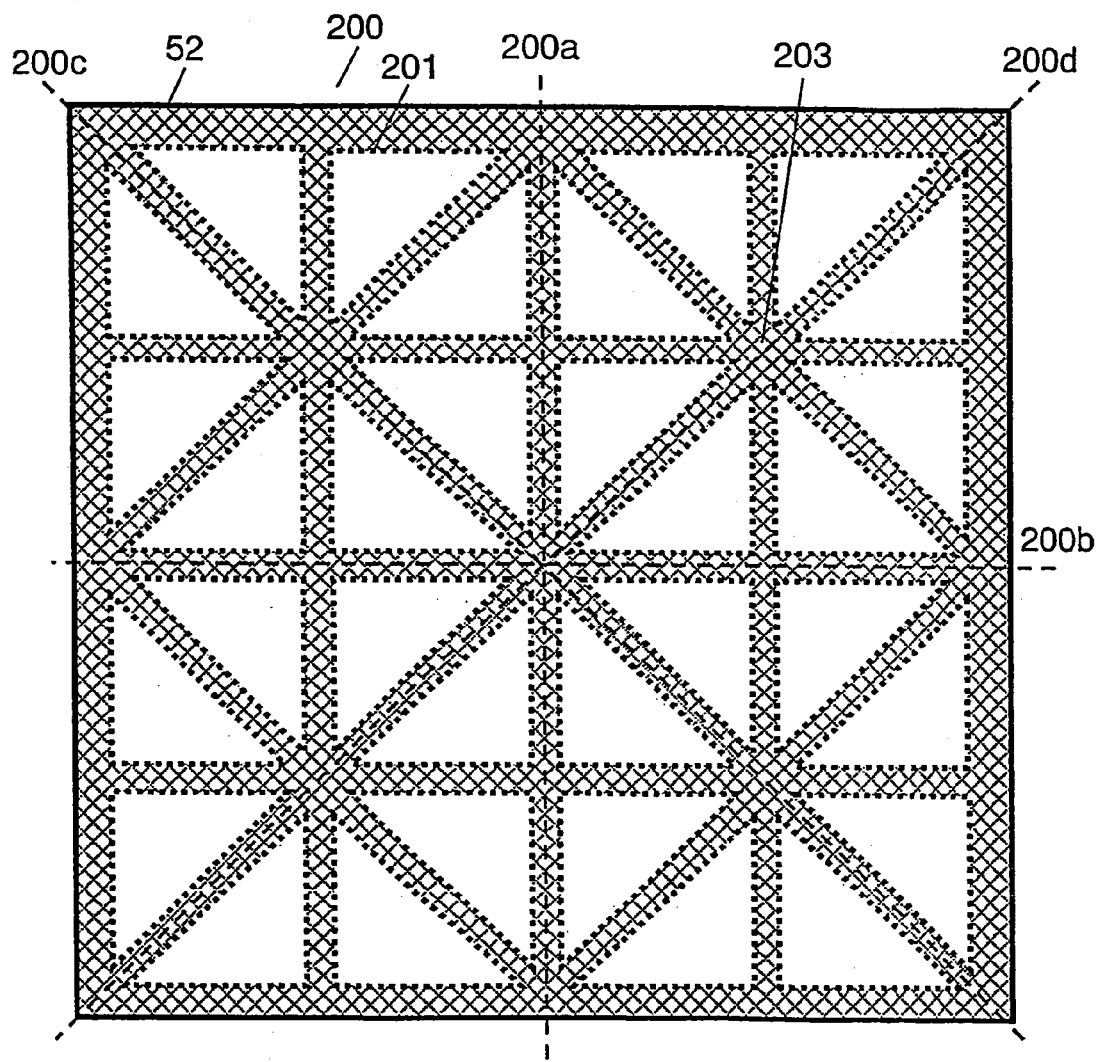
FIG. 35 is a plan view of a vacuum heat insulator in embodiment 20 of the invention.

FIG. 35 is a plan view of a vacuum heat insulator in embodiment 20 of the invention.

A vacuum heat insulator 200 shown in FIG. 35 consists of 32 core members 201 of thickness of about 5 mm made of glass fiber formed nearly in rectangular equilateral triangle, which are coated with a gas barrier enveloping member 52. The inside of the enveloping member 52 is evacuated.

The 32 core members 201 are formed so as to form folding lines 200*a*, 200*b*, 200*c*, and 200*d* in four directions, that is, vertical, lateral, and 45-degree oblique direction to vertical and lateral directions, parallel to each side of the regular equilateral triangle of the core members 201, between the core member 201 and its adjacent other core member 201. Two core members 201 are arranged to form nearly a square. Four core members 201 are arranged so that the right-angle corners may be adjacent to each other.

That is, in embodiment 20, the core members 201 are disposed at a specific interval so that the oblique sides in the regular equilateral triangle may be opposite to each other. These 32 core members are disposed line symmetrically to any folding line of the folding lines 200*a*, 200*b*, 200*c*, and 200*d*.

In order that the 32 core members 201 may be located in independent spaces individually, heat seal parts 203 are disposed around the core members 201.

When the heat insulator 200 thus configured is folded from four directions of the folding lines 200*a*, 200*b*, 200*c*, and 200*d*, all core members 201 are not hit or injured. In embodiment 20, the two core members 201 of regular equilateral triangle adjacent to each other across a specified interval are combined nearly in a square form so that the longer sides may face each other, and four core members 201 of regular equilateral triangle adjacent to each other across a specified interval are combined nearly in a square form so that the right-angle corners may gather.

Thus, the vacuum heat insulator 200 has the plural core members 201 of regular equilateral triangle coated with the gas barrier enveloping member 52, and the inside of the enveloping member 52 is evacuated, and the plural core members 201 are formed by combining two core members 201 nearly in a square shape so as to form folding lines 200*a*, 200*b*, 200*c*, and 200*d* in four directions at the position between the adjacent core members 201, that is, four core members 201 are arranged nearly in a square shape rotated by 45 degrees by bringing together the right-angle corners, and are disposed in zigzag layout at a specific interval. Thus, heat seal parts 203 of film are provided around the core members 201 so that the plural core members 201 may be located in independent spaces individually, and hence, the vacuum heat insulator 200 can be folded in four directions, and the limitation of shape of applicable objects is alleviated as compared with the conventional vacuum heat insulator, so that the applications are wide.

If the degree of vacuum in the space of a specific core member 201 is lowered, the degree of vacuum in the spaces of other core members 201 is not lowered, and drop of heat insulating performance can be kept to a minimum limit.

Since all of the enveloping member 52 positioned on the outer periphery of the vacuum heat insulator 200 and the enveloping member 52 in the portion positioned between the adjacent core members 201 are fused by heat, the width of the heat seal parts 203 is broad, thereby considerably lowering the possibility of drop of degree of vacuum in the spaces of the core members 201 through the heat seal parts 203.

The heat seal parts 203 positioned between the adjacent core members 201, excluding the outer periphery of the vacuum heat insulator 200 are simple in pattern composed of plural lateral lines of specified width at specified interval, plural oblique lines of about 45 degrees of specified width at specified interval, and plural oblique lines of about 135 degrees of specified width at specified interval, and therefore the fusion device can be reduced in size and simplified, and the fusion work is easy.

The vacuum heat insulator 200 is relatively larger in the rate of occupied area of the core members 201.

The vacuum heat insulator 200 in embodiment 20 has 32 core members 201 arranged in zigzag layout, but the layout is not limited to this example alone.

The plural core members 201 of regular equilateral triangle may be also coated with the gas barrier enveloping member 52 in a state being adhered and fixed to one side of a sheet member made of thermoplastic resin.

When the vacuum heat insulator 200 is applied, it can be used by cutting in desired size or shape, and when cutting, it is preferred to cut off from the heat seal parts 203 of the enveloping member 52 in order to minimize drop of heat insulating performance.

In the vacuum heat insulator 200, the interval of the vertical and lateral folding lines is narrower than the interval of the oblique 45-degree folding lines, but when it is desired that the interval of the vertical and lateral folding lines should be wider than the interval of the oblique 45-degree folding lines, in the vacuum heat insulator 200 of embodiment 20, the core members 201 should be arranged by rotating 45 degrees in the positive (counterclockwise) direction or negative (clockwise) direction.

When the vacuum heat insulator 200 is applied, it can be used by cutting in desired size or shape, and when cutting, it is preferred to cut off from the heat seal parts 203 of the enveloping member 52 in order to minimize drop of heat insulating performance.

Embodiment 21

A body warmer using a vacuum heat insulating material in embodiment 21 of the invention is explained. Same parts as in embodiment 5 are identified with same reference numerals, and the detailed description is omitted.

Figure 36:
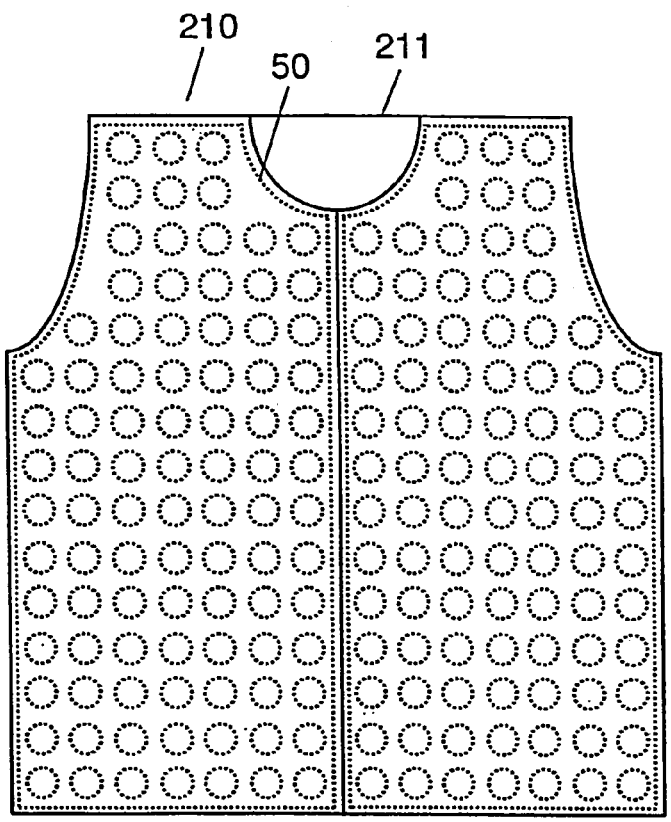
FIG. 36 is a front view of embodiment 21 by applying the vacuum heat insulator of the invention in a body warmer.
Figure 37:
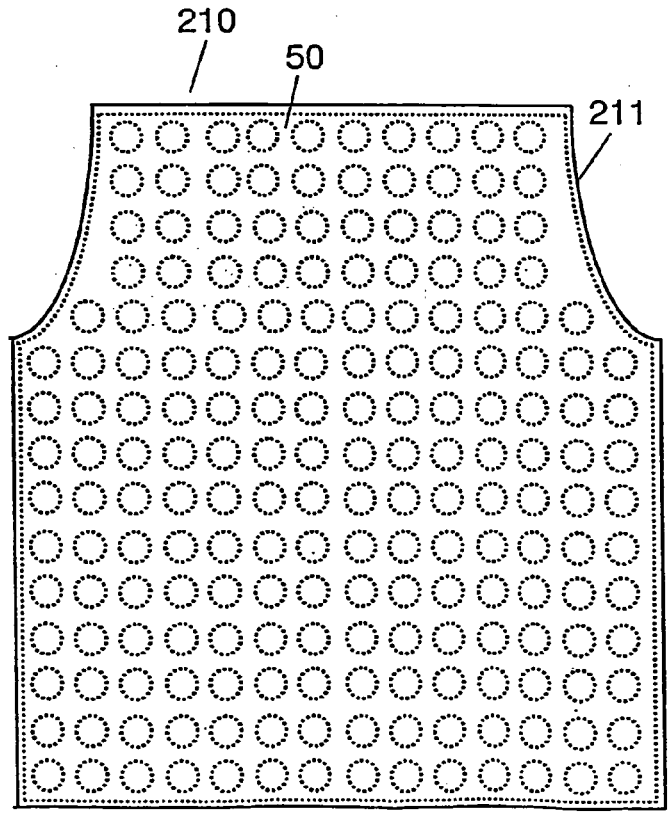
FIG. 37 is a rear view of the body warmer in embodiment 21.

FIG. 36 is a front view of embodiment 21 by applying the vacuum heat insulator of the invention in a body warmer, and FIG. 37 is a rear view of the body warmer in this embodiment.

A body warmer-210 consists of a jacket 211 as the clothes, and a vacuum heat insulator 50 of embodiment 5 adjusted in the number of core members, size and film shape for use in the jacket 211 incorporated therein.

The vacuum heat insulator 50 may be a vacuum heat insulator manufactured in a rectangle of a specified size, and may be cut according to the size of the jacket 211. In such a case the vacuum heat insulator 50 may be manufactured without disposing the core members to be cut off and discarded in the film from the beginning.

Since the vacuum heat insulator 50 can be folded in four directions, by properly selecting the size of the core members, a flexibility suited to a freely movable body warmer can be assured, so that a thin body warmer of high heat insulating performance can be presented by making the most of the high heat insulating performance of the vacuum heat insulator.

When the vacuum heat insulator 50 is inserted into a bag formed in the jacket 211, the vacuum heat insulator 50 is not visible, and only by inserting the vacuum heat insulator 50 into the bag formed in the jacket 211, the jacket 211 and the vacuum heat insulator 50 can be easily formed integrally without giving damage to the vacuum heat insulator 50, so that the vacuum heat insulator 50 can be removed and replaced relatively easily.

When the vacuum heat insulator 50 is detachably fitted to the jacket 211 by means of Velcro tape (trademark), fastener, button, hook or other fastening means, the vacuum heat insulator can be easily removed from the body warmer when the climate is warm and high heat insulation is not needed or at the time of laundry.

In the body warmer, the vacuum heat insulator 50 in embodiment 5 is used, but any vacuum heat insulator of embodiments 6 to 20 can be used, and where ventilation is needed, the vacuum heat insulators with perforation as shown in embodiments 8, 9, 11, 12, 13, 15 and 16 may be preferably used. When the perforated vacuum heat insulator is used, perspiration can be released from the holes, and the inside of the body warmer is kept fresh and comfortable.

In embodiment 21, the jacket is explained, but it can be applied in other clothes.

Embodiment 22

Figure 38:
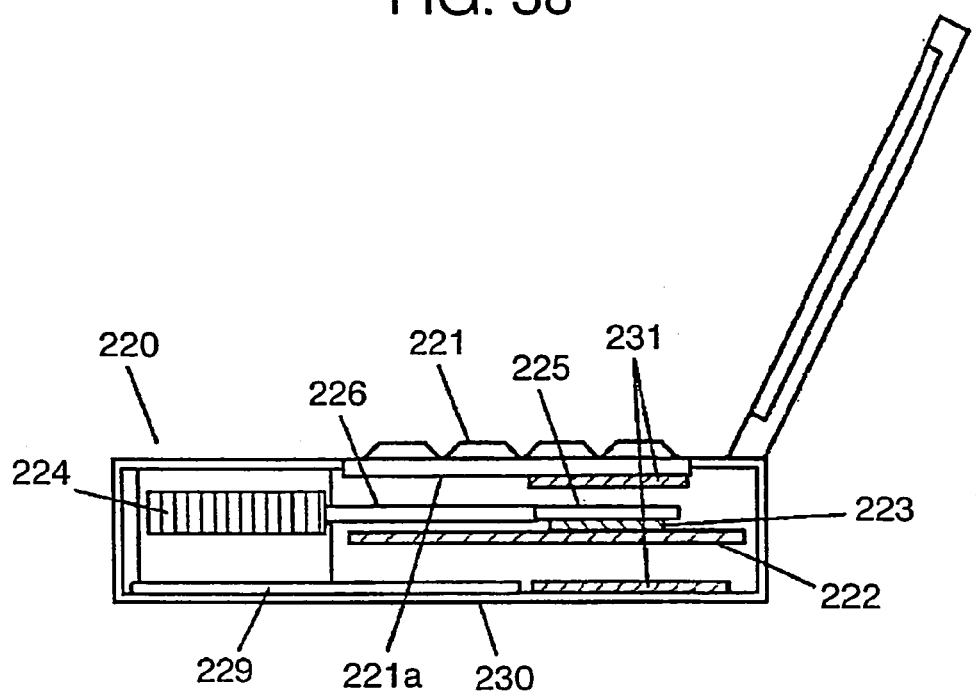
FIG. 38 is a side view of a personal computer in embodiment 22 of the invention.
Figure 39:
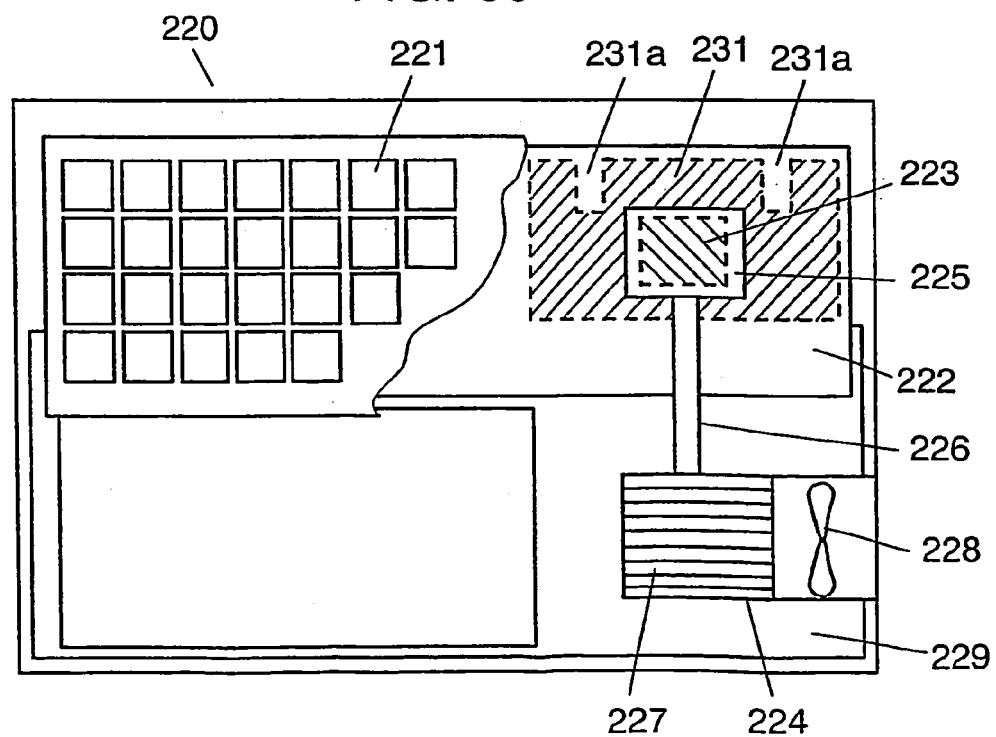
FIG. 39 is a perspective view as seen from the top of the personal computer in embodiment 22.
Figure 40:
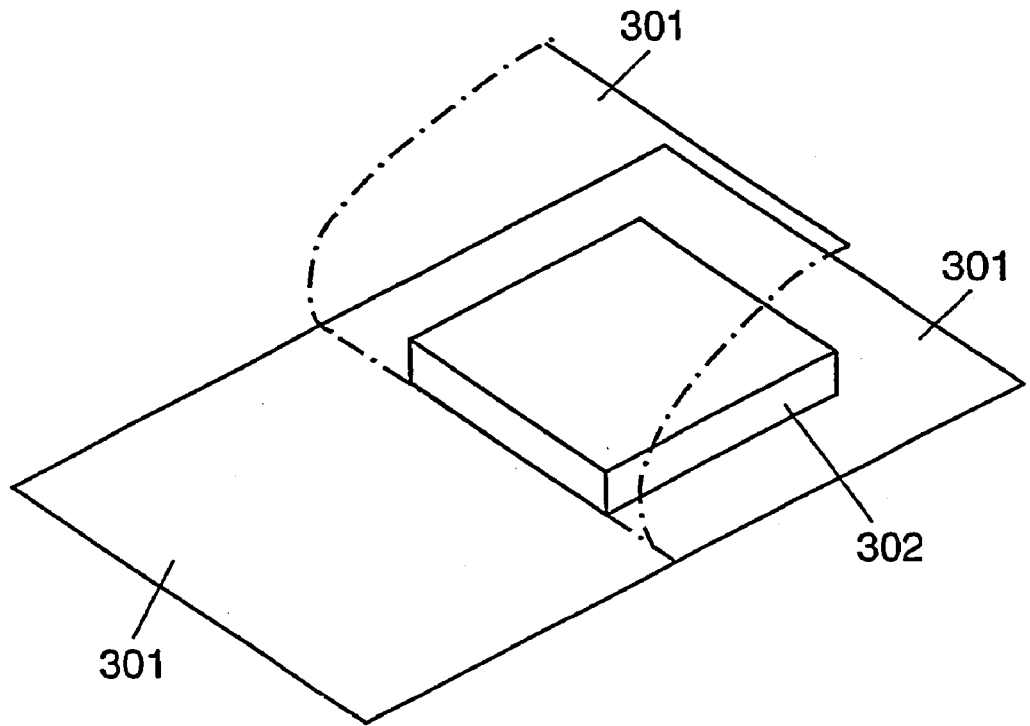
FIG. 40 is a perspective view showing a conventional manufacturing process of vacuum heat insulator.
Figure 41:
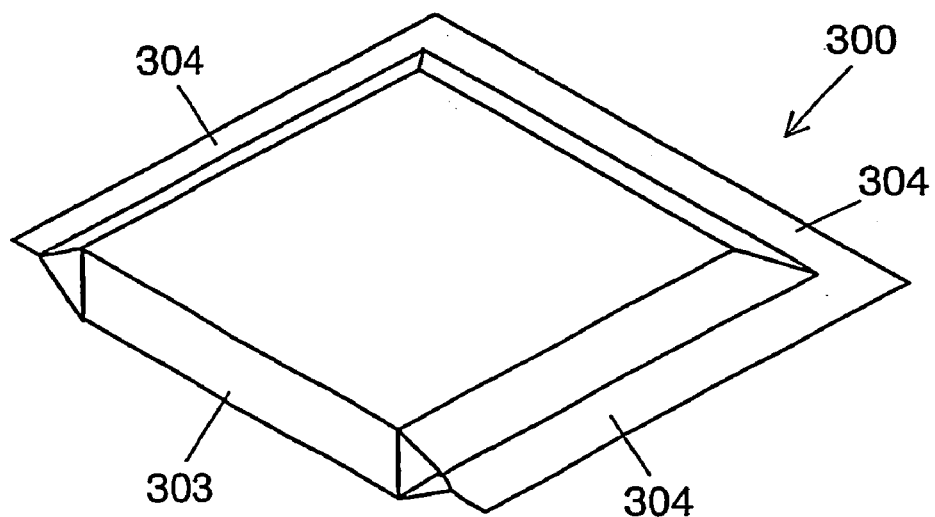
FIG. 41 is a perspective view showing the vacuum heat insulator in FIG. 40.
Figure 42:
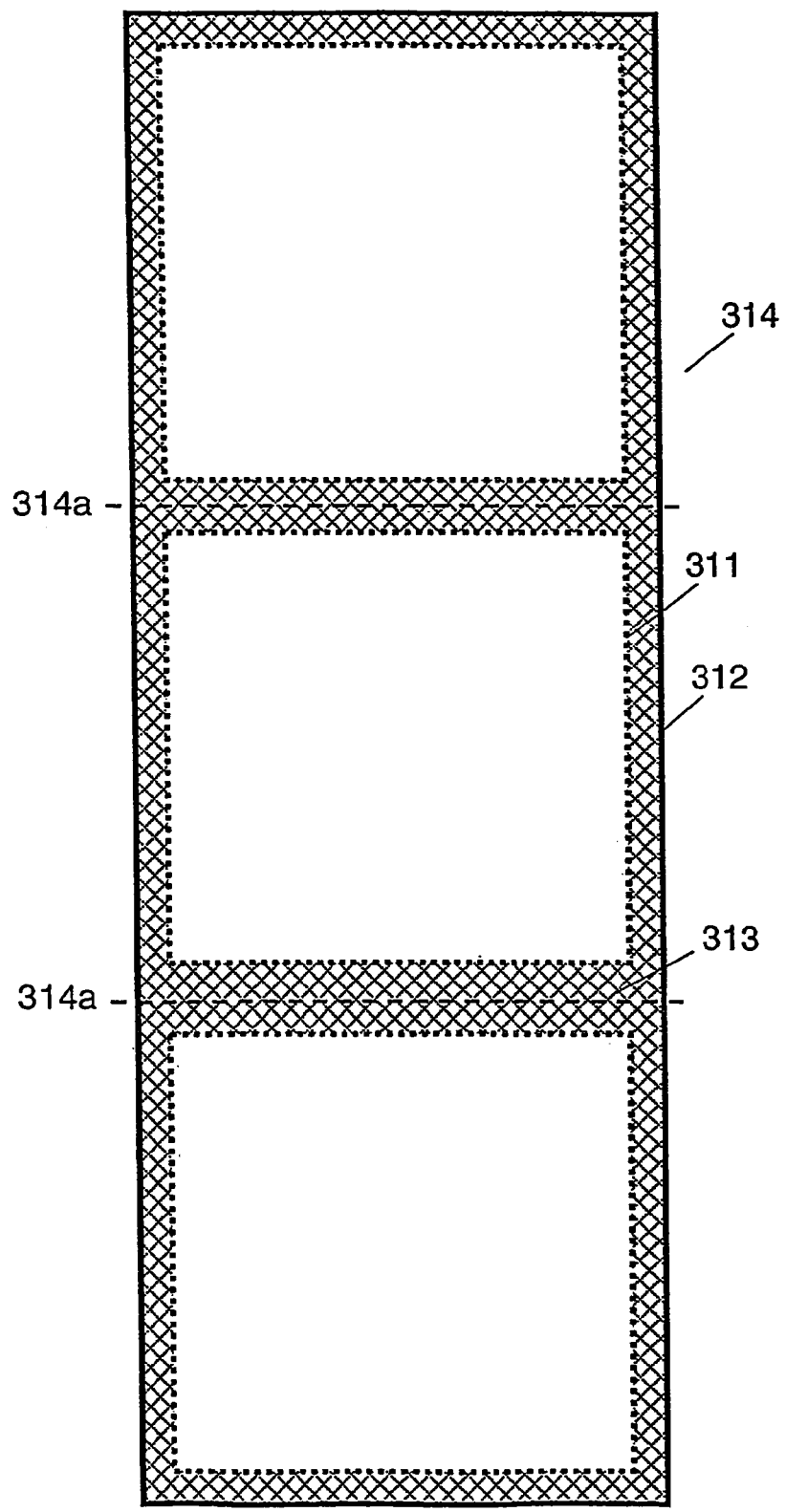
FIG. 42 is a plan view of other conventional vacuum heat insulator.
Figure 43:
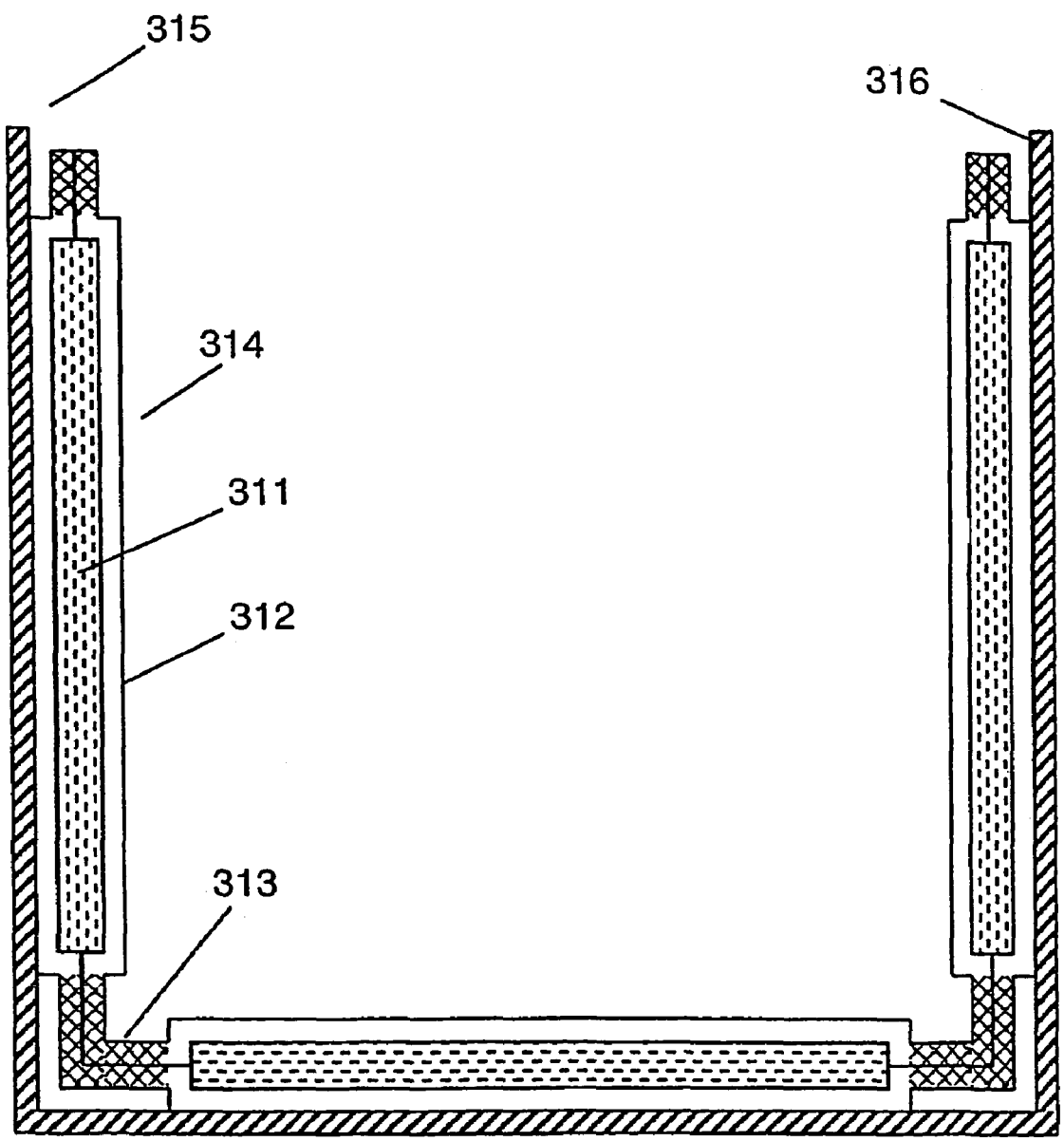
FIG. 43 is a sectional view showing a state of the vacuum heat insulator in FIG. 42 disposed in an outer box of a heat insulated box.

FIG. 38 is a side view of a personal computer in embodiment 22 of the invention, and FIG. 39 is a perspective view as seen from the top of the personal computer.

A personal computer 220 is a so-called notebook type. Having a keyboard 221 on the top of the main body, a CPU 223 and its chips are mounted on a printed board 222 inside. The CPU 223 is protected from heat generation by a cooling device 224, and the cooling device 224 is composed of a heat transfer block 225 contacting with the CPU 223, a heat pipe 226 transferring heat, and a heat sink 227 and a fan 228 for releasing the transferred heat by force from the personal computer 220. A cooling plate 229 diffuses the internal heat, and transmits to the main body bottom 230 and releases heat. A vacuum heat insulator 231 is adhered and disposed at the inner side of the main body bottom 230 beneath the CPU 223 and a keyboard back side 221a above the CPU 223 by means of an adhesive.

The vacuum heat insulator 231 is manufactured in a desired shape according to embodiment 3 of the invention. The material comprises the core member made of compressed wet silica powder blanked by a Thompson punching device, the enveloping member composed of a surface protective layer laminated with polyethylene terephthalate film, the gas barrier layer made of ethylene vinyl alcohol copolymer resin film by aluminum deposition, and the heat seal layer made of high density polyethylene. The internal pressure of the vacuum heat insulator 231 is 133.3 Pa, and it has a rectangular shape of 2 mm in thick and 95 mm×50 mm in size, and two notches 231a are provided in order to avoid ribs. The heat conductivity of this vacuum heat insulator 231 was 0.0080 W/mK.

The surface temperature of the personal computer 220 having such configuration was measured, and it was decreased by about 4 K in the main body bottom 230 beneath the CPU 223 as compared with the structure without vacuum heat insulator, and about 3.5 K was decreased on the keyboard above the CPU 223. The entire surface of the main body bottom was decreased by more than 2 K.

Assuming a vacuum heat insulator in a size of 50 mm×50 mm only could be installed being not able to avoid ribs, the observed temperature decrease was about 1.5 K in the main body bottom 230 beneath the CPU 223 and about 1 K on the keyboard above the CPU 223, and therefore a greater effect was obtained as compared with this case, and the user's discomfort can be decreased due to heat from the bottom when the personal computer is put on the lap for a long time or heat transmitted to the palm put on the keyboard during work.

The position of the vacuum heat insulator 231 is not limited to the area of CPU 223, but may include any local heat generation point, and for example the vacuum heat insulator 231 may be disposed on the entire surface of the cooling plate 229 or aluminum deposition applied for releasing heat at the inside of the main body bottom 230.

The principal technical effects of the invention are as explained in the individual embodiments, and the technical effects are briefly summarized below.

In the vacuum heat insulator of the invention, by limiting the peripheral edge formed around the core members to the heat seal parts only, the effective heat insulating area is wide, and the vacuum heat insulator excellent in adaptability and wide in application can be presented at low cost.

At same time, by limiting the peripheral edge formed around the core members to the heat seal parts only, the vacuum heat insulator formed in a desire shape and extremely wide in application can be presented at low cost.

Further, since the plural core members coated with a gas barrier film are disposed at mutual specific intervals so as to form folding lines in two directions (for example, vertical direction and lateral direction) or more (for example, three directions or more) in the position between the adjacent core members, the vacuum heat insulator can be folded in two or more directions. Hence, the limitation of shape in the applicable object is smaller than in the conventional vacuum heat insulator. Hence, the vacuum heat insulator of wider applications can be presented.

Further, since the plural core members coated with a gas barrier film are disposed in lattice layout or zigzag layout at mutual specific intervals so as to form folding lines in two directions (for example, vertical direction and lateral direction) or more (for example, three directions or more) in the position between the adjacent core members, the vacuum heat insulator can be folded in two or more directions. Hence, the limitation of shape in the applicable object is smaller than in the conventional vacuum heat insulator. Hence, the vacuum heat insulator of wider applications can be presented.

The manufacturing method of vacuum heat insulator of the invention can easily manufacture the vacuum heat insulator having such effects.

INDUSTRIAL APPLICABILITY

As described herein, the vacuum heat insulator of the invention is free from non-seal parts in the peripheral edge of the enveloping member not including the core member formed around the core member, and the width is limited to a small size by the heat seal parts only. The effective heat insulating area of the vacuum heat insulator is increased, and necessity of processing of the peripheral edge is smaller, and it can be formed in complicated shape, so that the vacuum heat insulator can be applied easily and in a wide range.

Not limited to hot and cold insulating devices requiring saving of energy, it can be applied in heat insulators as heat damage countermeasure in a devices demanding saving of space such as information appliances and electronic devices.

By properly selecting the size of the plural core members and keeping flexibility, vacuum heat insulators of wider applications are presented. Aside from jacket as body warmer, it can be applied in trousers, caps, gloves, bedding, cushion, and others.

REFERENCE NUMERALS IN THE DRAWINGS

10 Vacuum heat insulator
11, 31, 41 Core member
12, 12a, 12b Enveloping member
13, 21, 23, 26, 42 Heat seal part
Hot plate
20, 22, 25, 30, 35, 40 Vacuum heat insulator
32a, 32b Heat seal part
33, 36 Through-hole
Melt-down part
50, 60, 70, 80, 90, 100, 110, 120, 130 Vacuum heat insulator
50a, 50b, 50c, 50d Folding line
51, 141, 151, 161, 171, 181, 191, 201 Core member
Enveloping member
53, 73, 83, 93, 103, 113, 123, 133, 143 Heat seal part
60a, 60b, 60c, 60d Folding line
74, 74a, 95, 115, 136, 184 Non-seal part
84, 94, 125, 135, 154, 164 Hole
104, 114, 124, 134 Sheet member
140, 150, 160, 170, 180, 190, 200 Vacuum heat insulator
140a, 140b, 140c Folding line
150a, 150b, 150c Folding line
153, 63, 173, 183, 193, 203 Heat seal part
160a, 160b, 160c Folding line
170a, 170b Folding line
180a, 180b, 180c, 180d Folding line
190a, 190b, 190cFolding line
200a, 200b, 200c, 200d Folding line
210 Body warmer
211 Clothes (jacket)
220 Personal computer
221 Keyboard
221a Keyboard back side
222 Printed board
223 CPU
224 Cooling device
230 Main body bottom
231 Vacuum heat insulator

The invention claimed is:

1. A vacuum heat insulator comprising first and second gas barrier enveloping members, and a plurality of flat core members,
   wherein each of said first and second gas barrier enveloping members comprise heat seal layers,
   wherein said each of said plurality of core members is evacuated and sealed between the first and second enveloping members utilizing said heat seal layers,
   wherein the first and second enveloping members are heated and pressed to seal the entire core member between said first and second enveloping members,
   wherein said first and second enveloping members are heated and fused together utilizing said heat seal layers at portions where said core member is not disposed between said first and second enveloping members,
   wherein a border region seal is formed by portions of said first and second enveloping members where said core member is disposed between the two enveloping members and portions where the core member is not disposed between first and second enveloping members, and
   wherein said border region seal has a shape that corresponds to the periphery of the core member,
   wherein the entire portion of the first and second enveloping members adhering to each other is heated and fused, and
   wherein said plurality of core members are disposed in a zigzag layout at mutual specific intervals so as to form folding lines in four directions in the position between the adjacent core members.

2. The vacuum heat insulator of claim 1, wherein through-holes are formed in the thickness direction of the core members, and
   wherein said heat seal layers are heated and fused over said through-holes and along the shape of said through-holes.

3. The vacuum heat insulator of claim 2, wherein the shape of the through-holes is an arbitrary shape including triangular, quadrangular, polygonal, circular, elliptical, L-shape and combinations of shapes thereof.

4. The vacuum heat insulator of claim 3, wherein holes are not formed in the first and second enveloping members in the area of said through-holes of the core members.

5. The vacuum heat insulator of claim 1, wherein all parts having core members within the first and second enveloping members are heated and pressed.

6. The vacuum heat insulator of claim 1, wherein the heat seal parts having cores within the first and second enveloping members are melted by heating and pressing, and are fused with the surface portion of the core member.

7. The vacuum heat insulator of claim 1, wherein the first and second enveloping members are cut off so as to leave heat seal parts of a specified width along the core member.

8. The vacuum heat insulator of claim 7, wherein the first and second enveloping members are cut off by melting down.

9. The vacuum heat insulator of claim 1, wherein the core members have an arbitrary shape including triangular, quadrangular, polygonal, circular, elliptical, L-shape and combinations of shapes thereof.

10. The vacuum heat insulator of claim 1, wherein the thickness of the vacuum heat insulator is 0.5 mm or more to 5 mm or less.

* * * * *